(12) United States Patent
Bok

(10) Patent No.: US 10,593,737 B2
(45) Date of Patent: Mar. 17, 2020

(54) DISPLAY DEVICE

(71) Applicant: Samsung Display Co., Ltd., Yongin-si (KR)

(72) Inventor: Seung-Iyong Bok, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/722,287

(22) Filed: Oct. 2, 2017

(65) Prior Publication Data

US 2018/0122863 A1 May 3, 2018

(30) Foreign Application Priority Data

Nov. 2, 2016 (KR) .................. 10-2016-0145405

(51) Int. Cl.
*H01L 27/32* (2006.01)
*G06F 3/041* (2006.01)
*G06F 3/044* (2006.01)
*H01L 51/52* (2006.01)
*H01L 51/50* (2006.01)

(52) U.S. Cl.
CPC .......... *H01L 27/323* (2013.01); *G06F 3/044* (2013.01); *G06F 3/0412* (2013.01); *G06F 3/0414* (2013.01); *G06F 3/0416* (2013.01); *H01L 27/3225* (2013.01); *H01L 51/5012* (2013.01); *H01L 51/5234* (2013.01); *G06F 2203/04102* (2013.01); *G06F 2203/04108* (2013.01); *G06F 2203/04112* (2013.01); *H01L 2251/5323* (2013.01); *H01L 2251/5338* (2013.01)

(58) Field of Classification Search
CPC ............... H01L 27/323; H01L 51/5012; H01L 51/5234; H01L 2251/5338; G06F 3/0412; G06F 3/0414; G06F 3/0416; G06F 3/044
USPC ......................................................... 345/173
See application file for complete search history.

(56) References Cited

U.S. PATENT DOCUMENTS

| 5,703,436 | A  | 12/1997 | Forrest et al. |
| 7,936,121 | B2 | 5/2011  | Kim |
| 8,723,813 | B2 | 5/2014  | Park et al. |
| 8,979,291 | B2 | 3/2015  | Hack et al. |
| 9,024,907 | B2 | 5/2015  | Bolender |
| 9,547,374 | B2 | 1/2017  | Maciocci et al. |

(Continued)

FOREIGN PATENT DOCUMENTS

| KR | 10-0685844     | 2/2007 |
| KR | 10-2014-0095279 | 8/2014 |

(Continued)

*Primary Examiner* — Jennifer Mehmood
*Assistant Examiner* — Ngan T Pham Lu
(74) *Attorney, Agent, or Firm* — H.C. Park Associates, PLC

(57) ABSTRACT

A display device includes a flexible display module and provides a display area including a fingerprint recognition area, and a non-display area outside the display area. The flexible display module includes a display panel including a light-emitting element, a touch sensing unit disposed on the display panel, and a fingerprint recognition unit overlapping with the fingerprint recognition area. The touch sensing unit is configured to sense pressure applied to the flexible display module in an in-folding mode in which the flexible display module is folded such that a portion of the display area faces another portion of the display area.

20 Claims, 44 Drawing Sheets

(56) References Cited

U.S. PATENT DOCUMENTS

| | | |
|---|---|---|
| 9,652,098 B2 | 5/2017 | Choi et al. |
| 2006/0197753 A1 | 9/2006 | Hotelling |
| 2007/0045620 A1 | 3/2007 | Park et al. |
| 2010/0020041 A1* | 1/2010 | Park ................... G06F 3/0412 345/174 |
| 2013/0147760 A1* | 6/2013 | Lai ..................... G06F 3/044 345/174 |
| 2013/0321296 A1 | 12/2013 | Lee et al. |
| 2014/0042406 A1 | 2/2014 | Degner et al. |
| 2014/0253477 A1* | 9/2014 | Shim .................. G06F 3/0487 345/173 |
| 2015/0268766 A1* | 9/2015 | Kim .................... G06F 3/044 345/174 |
| 2015/0352437 A1 | 12/2015 | Koseki et al. |
| 2015/0370356 A1 | 12/2015 | Hwang et al. |
| 2015/0378465 A1 | 12/2015 | Shih et al. |
| 2016/0062498 A1 | 3/2016 | Huppi et al. |
| 2016/0147362 A1* | 5/2016 | Eim ..................... G06F 1/1641 345/173 |
| 2016/0155371 A1* | 6/2016 | Ikeda ................. G09G 3/2003 345/694 |
| 2016/0179236 A1* | 6/2016 | Shin ................... G06F 1/1616 |
| 2016/0196892 A1* | 7/2016 | Ohori .................. H01B 1/127 345/173 |
| 2016/0216822 A1 | 7/2016 | Jang |
| 2017/0285837 A1* | 10/2017 | Zeng ................... G06F 1/1641 |
| 2017/0344148 A1* | 11/2017 | Han .................... G06F 3/0416 |
| 2018/0033837 A1 | 2/2018 | Bok et al. |
| 2018/0150153 A1* | 5/2018 | Yoon .................. G06F 3/041 |

FOREIGN PATENT DOCUMENTS

| | | |
|---|---|---|
| KR | 10-2016-0000100 | 1/2016 |
| KR | 10-2016-0039765 | 4/2016 |
| KR | 10-2017-0047542 | 5/2017 |
| KR | 10-2018-0012382 | 2/2018 |
| KR | 10-2018-0028597 | 3/2018 |

* cited by examiner

DISPLAY DEVICE

CROSS-REFERENCE TO RELATED APPLICATION

This application claims priority from and the benefit of Korean Patent Application No. 10-2016-0145405, filed Nov. 2, 2016, which is hereby incorporated by reference for all purposes as if fully set forth herein.

BACKGROUND

Field

The disclosure generally relates to a display device, and, more particularly, to a display device capable of sensing external applied pressure and recognizing epidermal ridge information, such as a fingerprint.

Discussion

Various types of display devices may be used in multimedia devices, such as televisions, portable phones, tablet computers, navigation systems, game consoles, etc. Input units (or interfaces) of a display device may include a keyboard, mouse, and/or the like. A display device may additionally or alternatively include a touch sensing unit as an input unit. To this end, display devices may further include enhanced security functions.

The above information disclosed in this section is only for understanding the background of the inventive concepts, and, therefore, may contain information that does not form prior art.

SUMMARY

Some exemplary embodiments are capable of providing a display device configured to sense a touch of a user and applied pressure.

Some exemplary embodiments are capable of providing a display device configured to recognize epidermal ridge information (e.g., a fingerprint) of a user.

Additional aspects will be set forth in the detailed description which follows, and, in part, will be apparent from the disclosure, or may be learned by practice of the inventive concepts.

According to some exemplary embodiments, a display device includes a flexible display module and provides a display area including a fingerprint recognition area, and a non-display area outside the display area. The flexible display module includes a display panel including a light-emitting element, a touch sensing unit disposed on the display panel, and a fingerprint recognition unit overlapping with the fingerprint recognition area. The touch sensing unit is configured to sense pressure applied to the flexible display module in an in-folding mode in which the flexible display module is folded such that a portion of the display area faces another portion of the display area.

According to some exemplary embodiments, a display device includes a flexible display module and a force sensor. The display device provides a display area including a fingerprint recognition area, and a non-display area outside the display area. The flexible display module includes a display panel including a light-emitting element, a touch sensing unit disposed on the display panel, and a fingerprint recognition unit overlapping with the fingerprint recognition area. The display panel is disposed between the touch sensing unit and the force sensor. The force sensor is configured to sense pressure applied to the flexible display module in an out-folding mode in which the flexible display module is folded such that a portion of the display area faces an opposite direction from another portion of the display area.

According to some exemplary embodiments, a display device may include a flexible display module and may provide a display area including a fingerprint recognition area, and a non-display area outside the display area. The flexible display module may include a display panel including a light-emitting element, a touch sensing unit disposed on the display panel, and a fingerprint recognition unit overlapping with the fingerprint recognition area. The touch sensing unit is configured to sense a capacitance between a portion of the display area and another portion of the display area in an in-folding mode in which the flexible display module is folded such that the portion of the display area faces the another portion of the display area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
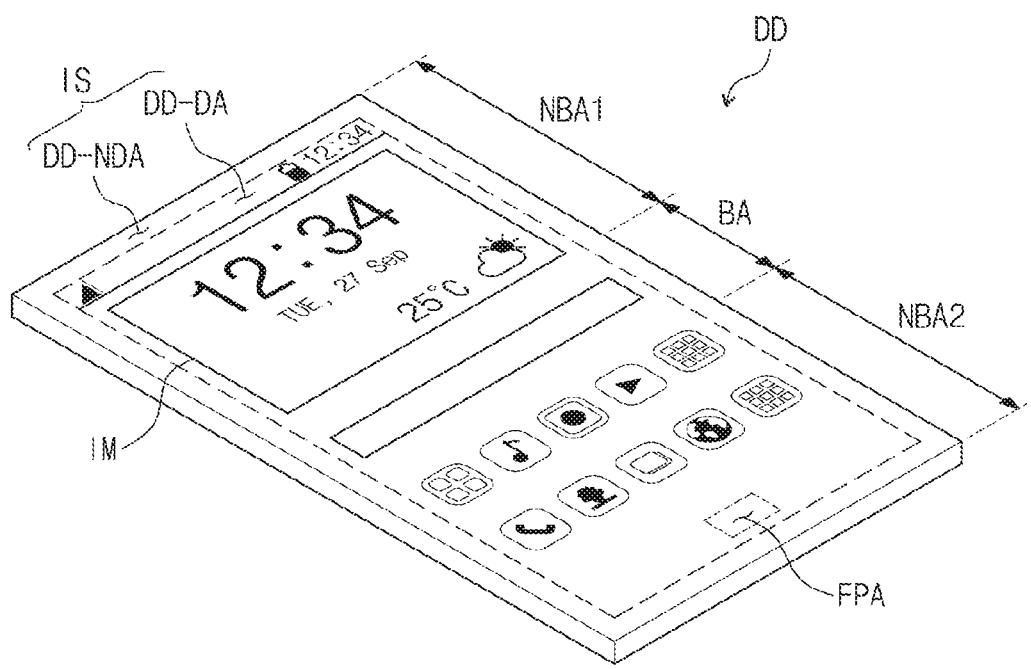
FIG. 1 is a perspective view illustrating a display device in a normal mode according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. Thus, the accompanying drawings are schematic in nature, and, therefore, exemplary embodiments are not be construed as limited to the illustrated shapes, but are to include deviations that result, for example, from manufacturing. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "approximately," "substantially," "about," and other similar terms, are inclusive of a stated value, but used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Figure 2A:
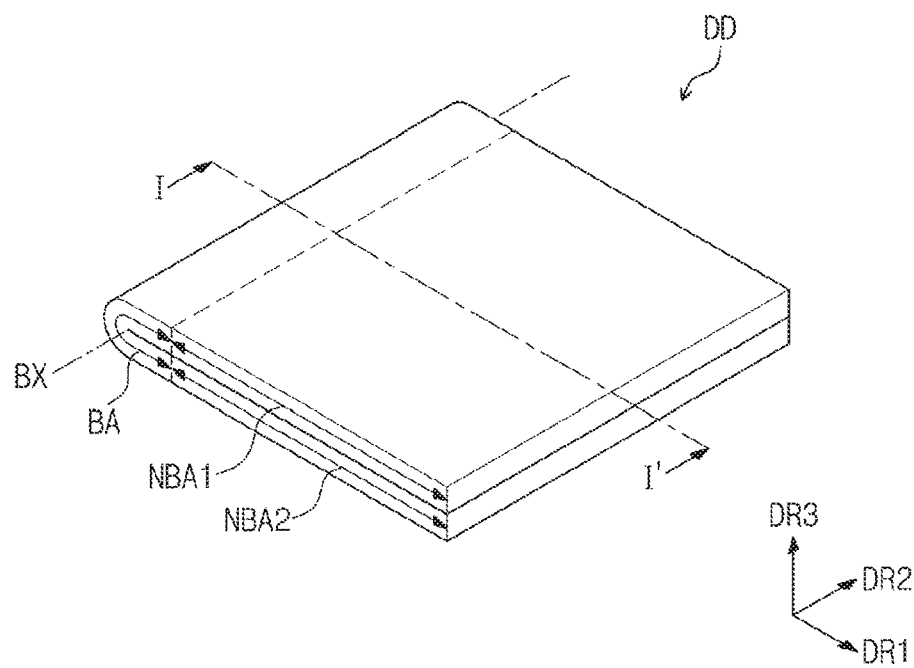
FIGS. 2A and 2B are perspective views illustrating the display device of FIG. 1 in in-folding modes according to various exemplary embodiments.
Figure 2B:
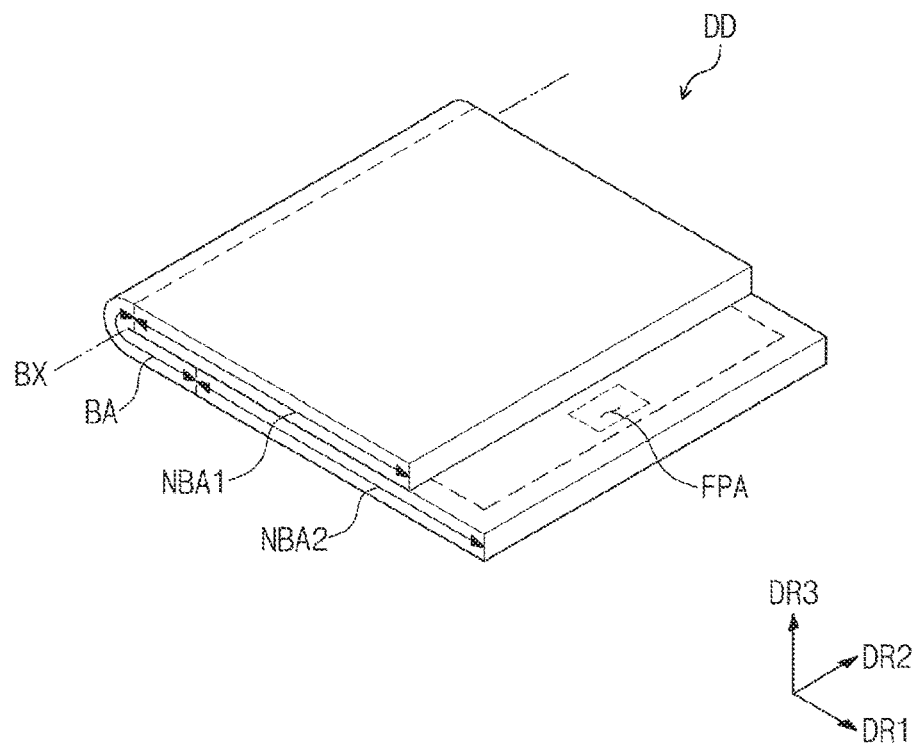

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein FIG. 1 is a perspective view illustrating a display device DD in a normal mode according to some exemplary embodiments. FIGS. 2A and 2B are perspective views illustrating the display device DD in in-folding modes according to various exemplary embodiments.

As illustrated in FIG. 1, in a normal mode, a display surface IS on which an image IM is displayed is parallel to a plane defined by a first directional axis DR1 and a second directional axis DR2. A normal direction of the display surface IS (e.g., a thickness direction of the display device DD) is parallel to a third directional axis DR3. A front surface (or a top surface) and a back surface (or a bottom surface) of each of the members are defined by the third directional axis DR3. However, directions indicated by the first to third directional axes DR1, DR2, and DR3 may be relative concepts and may be changed into other directions. Hereinafter, first to third directions are the directions indicated by the first to third directional axes DR1, DR2, and DR3, respectively, and are indicated by the same reference designators as the first to third directional axes DR1, DR2, and DR3. For convenience, a flexible display device is described and illustrated; however, exemplary embodiments are not limited thereto. For instance, the display device DD may be a rigid display device.

FIGS. 1 and 2A illustrate a foldable display device as an example of the display device DD. However, the display device DD may be, but is not limited to, a rollable display device. The display device DD may be used in large-sized electronic devices (e.g., televisions, monitors, etc.) and small and medium-sized electronic devices (e.g., portable phones, tablets, car navigation units, game consoles, smart watches, etc.).

As illustrated in FIG. 1, the display surface IS of the display device DD may include a plurality of areas. The display surface IS includes a display (or active) area DD-DA in which the image IM is displayed, and a non-display (inactive) area DD-NDA adjacent to (e.g., outside) the display area DD-DA. An image is not displayed in the non-display area DD-NDA. In FIG. 1, application icons are illustrated as an example of the image IM, but exemplary embodiments are not limited thereto or thereby. The display area DD-DA may have a quadrilateral shape. The non-display area DD-NDA may surround the display area DD-DA. However, exemplary embodiments are not limited thereto or thereby. The shapes of the display area DD-DA and the non-display area DD-NDA may be relatively designed.

The display area DD-DA may include a fingerprint recognition area FPA. The fingerprint recognition area FPA may recognize a fingerprint of a user; however, it is contemplated that the fingerprint sensing area FPA may be utilized to sense other epidermal ridge information, such as a palm print, a footprint, etc., or may be utilized to sense other forms of three-dimensional patterns, such as a three-dimensional barcode, etc. For convenience, fingerprint detection will be described and illustrated.

When a user, for example, touches the fingerprint recognition area FPA, the display device DD may recognize a fingerprint of the user to determine whether the user is a valid user or not. The fingerprint of the user may be used for portable device security, financial transactions, and control of a system. According to some exemplary embodiments, the fingerprint recognition area FPA is included in the display area DD-DA. However, exemplary embodiments are not limited thereto or thereby. In other exemplary embodiments, the fingerprint recognition area FPA may be included in the non-display area DD-NDA. In still other exemplary embodiments, the fingerprint recognition area FPA may be included in both the display area DD-DA and the non-display area DD-NDA.

Although not shown in the drawings, the display device DD may include a housing. The housing may be disposed at an outer periphery of the display device DD and may receive and/or support various parts therein.

As illustrated in FIGS. 1, 2A, and 2B, the display device DD may include a plurality of areas defined according to an operation mode. The display device DD may include a bending area BA bent on the basis of a bending axis BX, a first non-bending area NBA1, and a second non-bending area NBA2. The first and second non-bending areas NBA1 and NBA2 are not bent.

As illustrated in FIG. 2A, the display device DD may be inner-bent such that the display surface IS of the first non-bending area NBA1 faces the display surface IS of the second non-bending area NBA2. In some exemplary embodiments, the bending case in which the display surface IS of the first non-bending area NBA1 faces the display surface IS of the second non-bending area NBA2 is defined as an in-folding mode. A case which is not the in-folding mode may be defined as a normal mode, such as illustrated in FIG. 1.

In some exemplary embodiments, the display device DD may include a plurality of bending areas BA. In addition, the bending area BA may be defined or designed to correspond to a manner in which a user operates the display device DD. For example, unlike FIG. 2A, the bending area BA may be defined or designed to be parallel to the first directional axis DR1 or may be defined or designed in a diagonal direction. An area of the bending area BA may not be fixed, but may be determined depending on to a radius of curvature. In some exemplary embodiments, the display device DD may be repeatedly operated between the operation modes illustrated in FIGS. 1, 2A, and 2B.

As previously described, FIG. 1 is a perspective view illustrating a display device DD in a normal mode, whereas FIGS. 2A and 2B are perspective views illustrating the display device DD of FIG. 1 in in-folding modes according to some exemplary embodiments. To this end, FIG. 2B illustrates an example of the display device DD in which a folding portion is different from that of the display device DD of FIG. 2A. As such, exemplary embodiments are not limited to the number of the bending area BA and the non-bending area NBA of the display device DD, nor are exemplary embodiments limited to a position of the bending area BA of the display device DD.

Referring to FIG. 2B, the fingerprint recognition area FPA is exposed to the outside in an in-folding mode. The fingerprint recognition area FPA exposed to the outside may recognize a fingerprint of a user. In some exemplary embodiments, a user can set security and/or control the device through fingerprint recognition even though the display device DD is in the in-folding mode, and, thus, convenience and security of a user can be improved.

FIGS. 3A, 3B, 3C, and 3D are cross-sectional views illustrating display devices according to some exemplary embodiments. It is noted that FIGS. 3A to 3D illustrate cross-sections defined by the second directional axis DR2 and the third directional axis DR3.

As illustrated in FIGS. 3A to 3D, the display device DD or DD-E includes a protective film PM, a window WM, a display module DM or DM-E, a first adhesive member AM1, and a second adhesive member AM2. The display module DM or DM-E is disposed between the protective film PM and the window WM. The first adhesive member AM1 couples the display module DM or DM-E and the protective film PM to each other, and the second adhesive member AM2 couples the display module DM or DM-E and the window WM to each other. In some exemplary embodiments, the first adhesive member AM1 and the second adhesive member AM2 may be omitted. Each of the protective film PM and the window WM may be continuously formed through a coating process.

The protective film PM protects the display module DM or DM-E. The protective film PM provides or includes a first outer surface OS-L exposed to the outside and an adhesive surface adhered to the first adhesive member AM1. The protective film PM prevents (or reduces) external moisture from permeating into the display module DM and absorbs an external impact.

The protective film PM may include a plastic film as a base layer. The protective film PM may include the plastic film that includes one selected from a group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and any combination thereof. The material of the protective film PM is not limited to plastic resins, but may include an organic/inorganic composite material. For example, the protective film PM may include a porous organic layer and an inorganic material filling pores of the porous organic layer. The protective film PM may further include a functional layer formed on the plastic film. The functional layer may include a resin layer. The functional layer may be formed by a coating method.

The window WM may protect the display module DM or DM-E from an external impact and may provide an input surface to a user. The window WM provides or includes a second outer surface OS-U exposed to the outside and an adhesive surface adhered to the second adhesive member AM2. The display surface IS illustrated in FIGS. 1, 2A, and 2B may be the second outer surface OS-U. The second outer surface OS-U may also be a touch sensing surface for sensing a touch of a user.

As illustrated in FIGS. 1, 2A, and 2B, the window WM of the display device DD may not be disposed in the bending area BA; however, exemplary embodiments are not limited thereto or thereby. In some exemplary embodiments, the window WM may also be disposed in the bending area BA.

Adverting to FIGS. 3A to 3D, in some exemplary embodiments, the display module DM or DM-E may include a display panel DP, a touch sensing unit (or structure) TS, and a fingerprint recognition unit (or structure) FPS or FPS-E. The display panel DP may include a light-emitting element. The display panel DP generates the image IM (see FIG. 1) corresponding to input image data. The display panel DP provides or includes a first display panel surface BS1-L and a second display panel surface BS1-U that are opposite to each other in the thickness direction DR3. A process of forming the display panel DP may include a low-temperature polycrystalline silicon (LTPS) process or a low-temperature polycrystalline oxide (LTPO) process.

The touch sensing unit TS obtains information on coordinates of external input. The touch sensing unit TS may also be referred to as an input sensing unit. The external input may include a touch by a human finger FG, a touch by a touch pen, a hovering action, an approach, and/or the like. The touch sensing unit TS may be disposed directly on the second display panel surface BS1-U. That is, the touch sensing unit TS may be integrally manufactured with the display panel DP by continuous processes; however, exemplary embodiments are not limited thereto or thereby. In some exemplary embodiments, the touch sensing unit TS may be manufactured by a separate process and may be adhered to the display panel DP.

Although not shown in the drawings, the display module DM or DM-E according to some exemplary embodiments may further include an anti-reflection layer. The anti-reflection layer may include a color filter, a stack structure of a conductive layer/a dielectric layer/a conductive layer, or an optical member. The anti-reflection layer may absorb, destructively interfere with, or polarize external light incident from the outside to reduce a reflectance of the external light.

Each of the first and second adhesive members AM1 and AM2 may be at least one of optically clear adhesive (OCA) film, an optically clear resin (OCR), and a pressure sensitive adhesive (PSA) film. Each of the first and second adhesive members AM1 and AM2 may include, but is not limited to, a photo-curing adhesive material or a thermosetting adhesive material.

Although not shown in the drawings, the display device DD or DD-E may further include a frame structure that supports functional layers to maintain the states of the display device DD illustrated in FIGS. 1, 2A, and 2B. The frame structure may include a joint structure or a hinge structure; however, any other suitable structure may be utilized.

In some exemplary embodiments, the touch sensing unit TS may be single-layered. In other words, the touch sensing unit TS may include a single conductive layer. Here, the single conductive layer means that a conductive layer separated by an insulating layer is one. A stack structure of a first metal layer/a second metal layer/a metal oxide layer corresponds to the single conductive layer, and a stack structure of a metal layer/an insulating layer/a metal oxide layer corresponds to a double conductive layer.

According to various exemplary embodiments, the single conductive layer is patterned to form a plurality of touch sensors and a plurality of touch signal lines, as will become more apparent below, but are not illustrated in FIGS. 3A to 3D. In other words, the touch sensors of the touch sensing unit TS may be disposed on the same layer. The touch sensors may be disposed directly on a thin film sealing layer TFE (refer to FIG. 6). In addition, a portion of each of the touch signal lines may be disposed on the same layer as the touch sensors.

In some exemplary embodiments, the touch signal lines and the touch sensors may include indium-tin oxide (ITO), indium-zinc oxide (IZO), zinc oxide (ZnO), indium-tin-zinc oxide (ITZO), PEDOT, a metal nanowire, and/or graphene. In some exemplary embodiments, the touch signal lines and the touch sensors may include a metal layer, e.g., molybdenum, silver, titanium, copper, aluminum, or any alloy thereof. The touch signal lines and the touch sensors may include the same material or materials different from each other. However, exemplary embodiments are not limited thereto or thereby. In some exemplary embodiments, the touch sensing unit TS may have a multi-layered structure including a plurality of conductive layers.

Figure 3A:
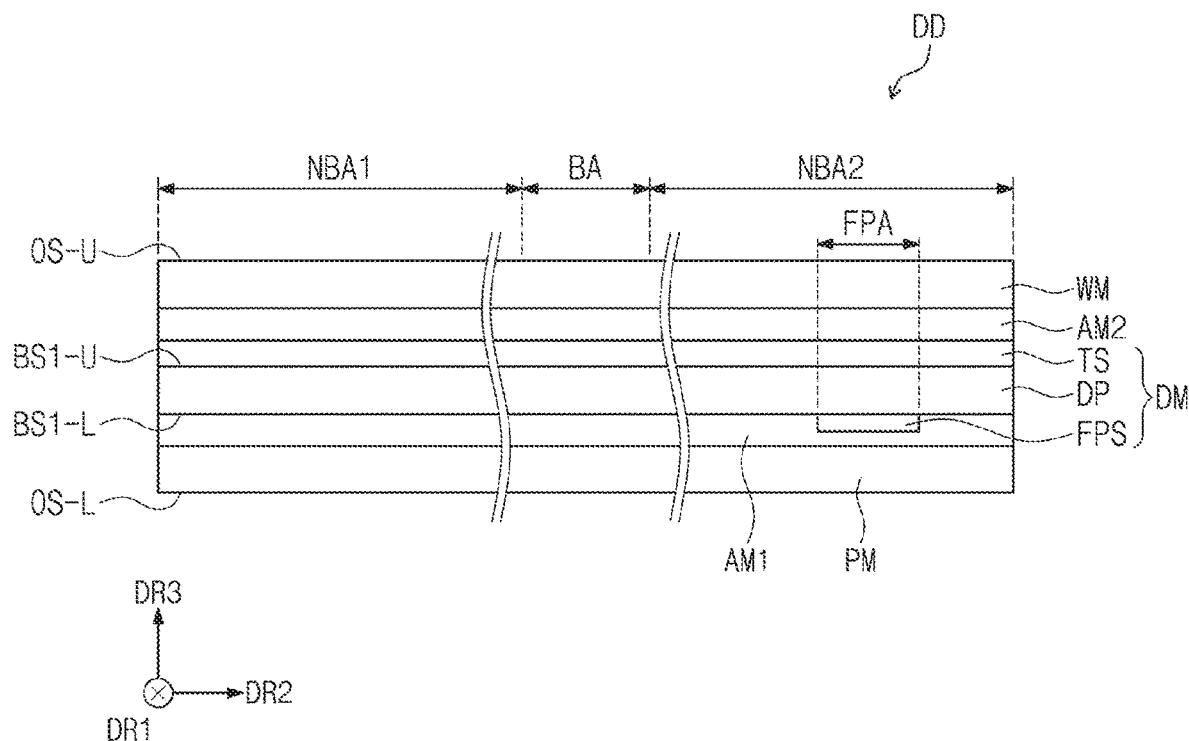
FIGS. 3A, 3B, 3C, and 3D are cross-sectional views illustrating display devices according to some exemplary embodiments.
Figure 3B:
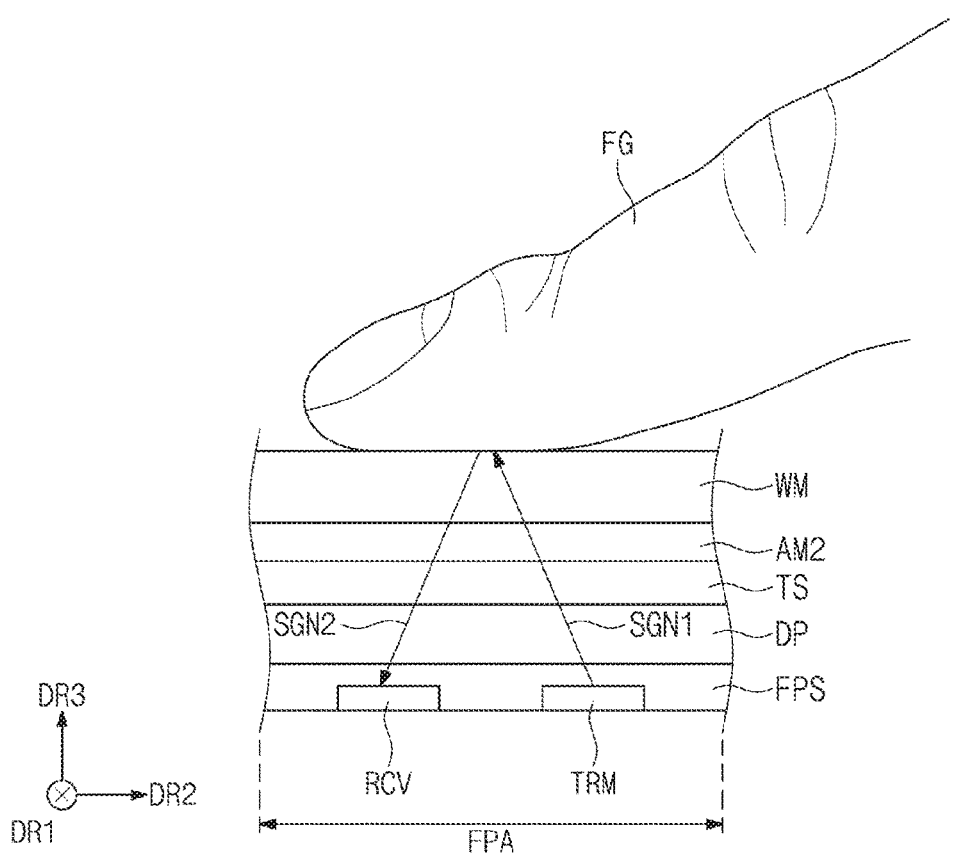

Referring to FIGS. 3A and 3B, the fingerprint recognition unit FPS is disposed to overlap with the fingerprint recognition area FPA in the third direction DR3. The fingerprint recognition unit FPS may be disposed under the display panel DP. In some exemplary embodiments, the fingerprint recognition unit FPS may include a sensing module TRM and RCV. The sensing module TRM and RCV may include at least one of an optical sensing module or an ultrasonic sensing module. The sensing module TRM and RCV may include a signal generator TRM and a signal receiver RCV.

The signal generator TRM generates a first signal SGN1 directed to a fingerprint of a finger FG of a user. In some exemplary embodiments, in the case in which the sensing module TRM and RCV is the optical sensing module, the first signal SGN1 may be an optical signal. In some exemplary embodiments, in the case in which the sensing module TRM and RCV is the ultrasonic sensing module, the first signal SGN1 may be an ultrasonic signal.

The signal receiver RCV receives a second signal SGN2. The second signal SGN2 is generated by reflection of the first signal SGN1 from the fingerprint of the finger FG of the user. When the first signal SGN1 is the optical signal, the second signal SGN2 may also be an optical signal. When the first signal SGN1 is the ultrasonic signal, the second signal SGN2 may also be an ultrasonic signal.

In some exemplary embodiments, the sensing module TRM and RCV may analyze the first signal SGN1 generated from the signal generator TRM and the second signal SGN2 received by the signal receiver RCV, thereby recognizing the fingerprint of the finger FG of the user. In other words, the sensing module TRM and RCV may recognize the fingerprint by using a difference between light (or sound) reflected from a ridge of the fingerprint and light (or sound) reflected from a valley of the fingerprint.

Figure 3C:
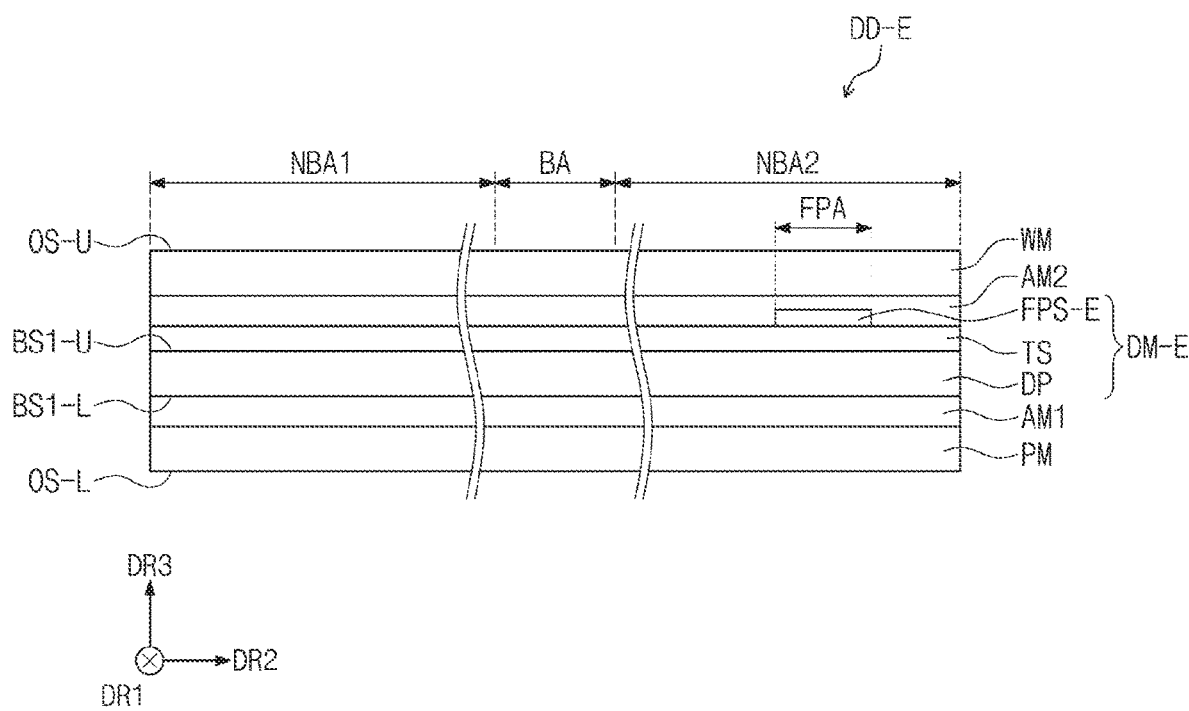
Figure 3D:
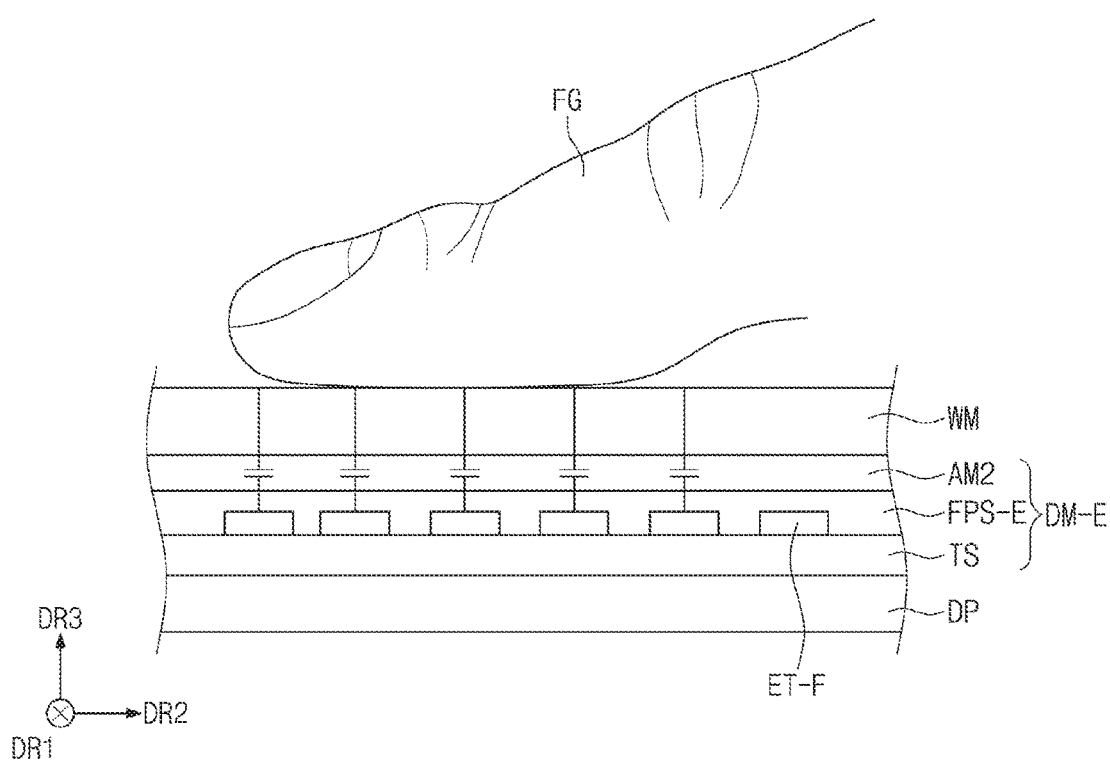

Referring to FIGS. 3C and 3D, a fingerprint recognition unit FPS-E of the display module DM-E of the display device DD-E is disposed to overlap with the fingerprint recognition area FPA in the third direction DR3. The fingerprint recognition unit FPS-E may be disposed on the touch sensing unit TS.

The fingerprint recognition unit FPS-E may include a plurality of fingerprint sensing electrodes ET-F. The fingerprint sensing electrodes ET-F may be capacitively coupled to a finger FG of a user. Capacitances generated between the fingerprint of the finger FG of the user and the fingerprint sensing electrodes ET-F may be different from each other according to a pattern of the fingerprint, e.g., a pattern of the valleys and ridges of the fingerprint. As such, the fingerprint recognition unit FPS-E may sense these differences between the capacitances to recognize the fingerprint. In other words, the fingerprint recognition unit FPS-E may recognize the fingerprint by using a difference between a capacitance occurring in association with a ridge of the fingerprint and a capacitance occurring in association with a valley of the fingerprint.

The fingerprint recognition unit FPS or FPS-E can recognize the fingerprint not only when the finger FG of the user is in contact with the unit FPS or FPS-E, but also when the finger FG moves in the state in which the finger FG is in contact with the unit FPS or FPS-E. However, the fingerprint recognition units FPS and FPS-E are not limited to or by the aforementioned exemplary embodiments. In some exemplary embodiments, at least one of other various kinds of sensors may be used as the fingerprint recognition unit FPS or FPS-E. For example, the fingerprint recognition unit may be a heat sensing type or a non-contact type.

Figure 4:
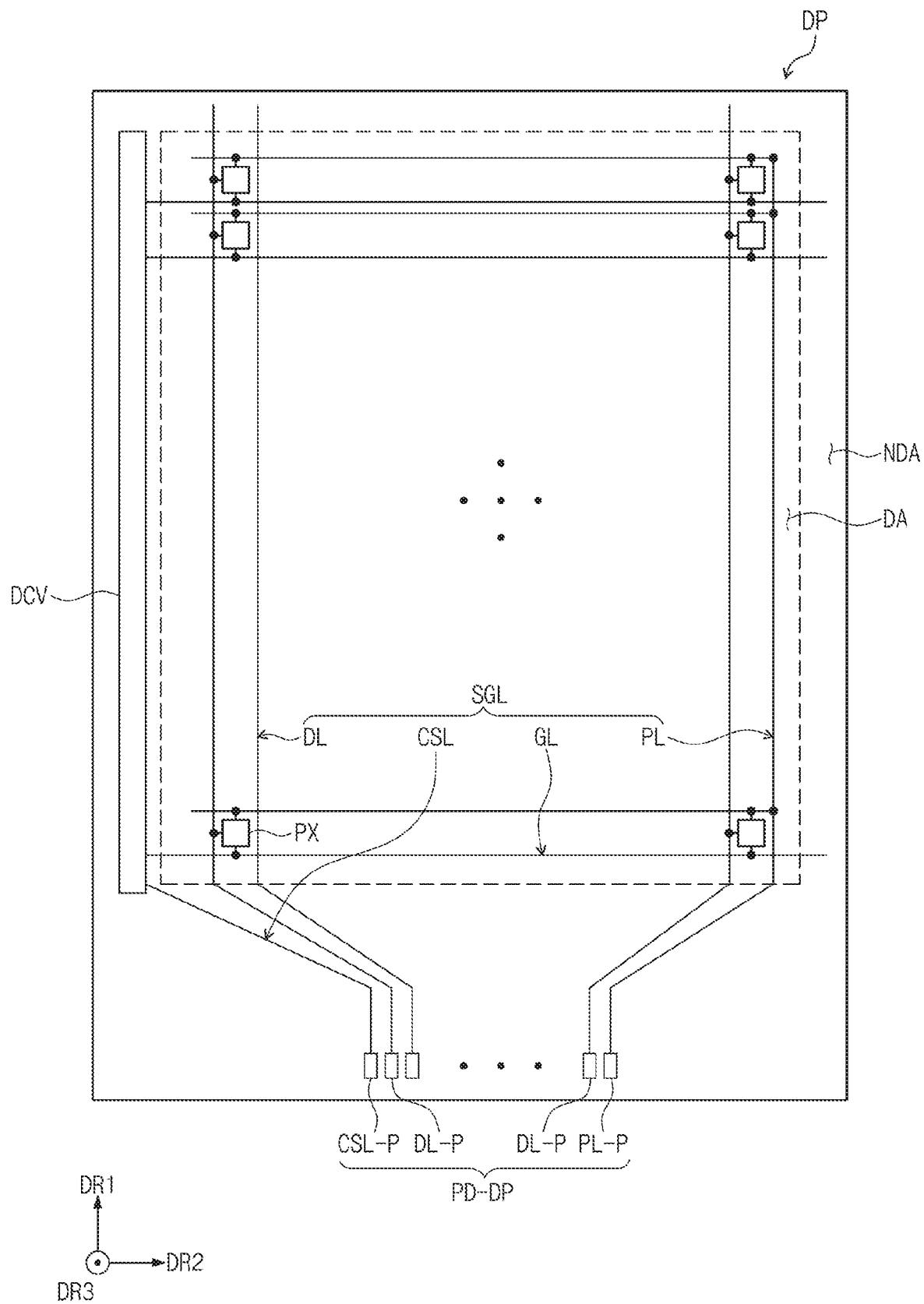
FIG. 4 is a plan view illustrating a display panel according to some exemplary embodiments.
Figure 5:
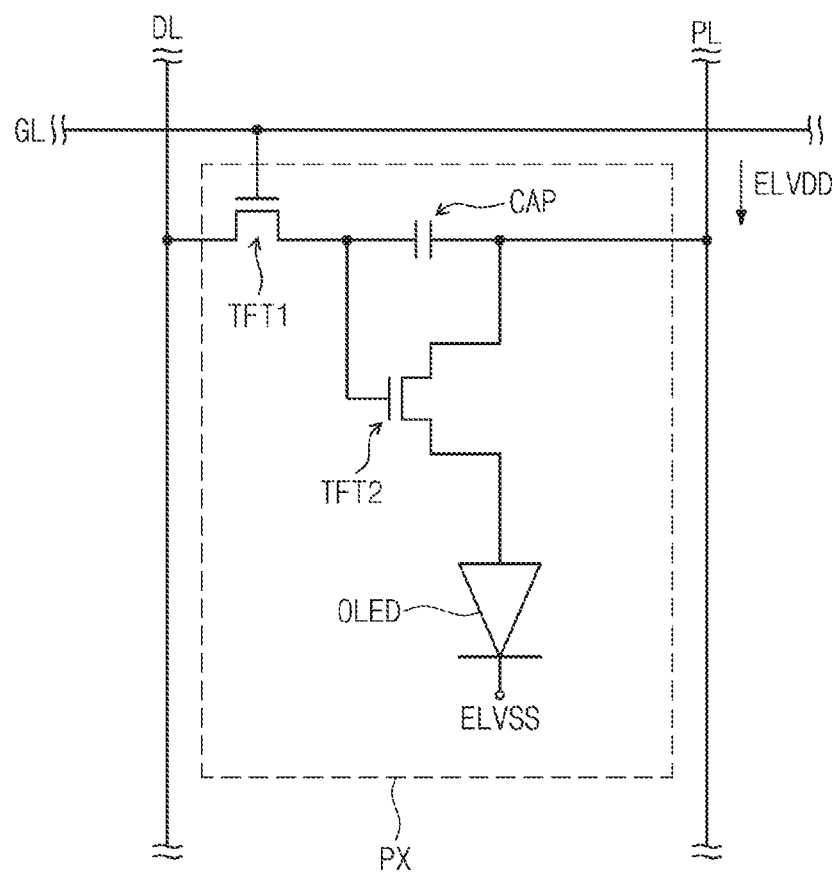
FIG. 5 is an equivalent circuit diagram of a pixel according to some exemplary embodiments.
Figure 6:
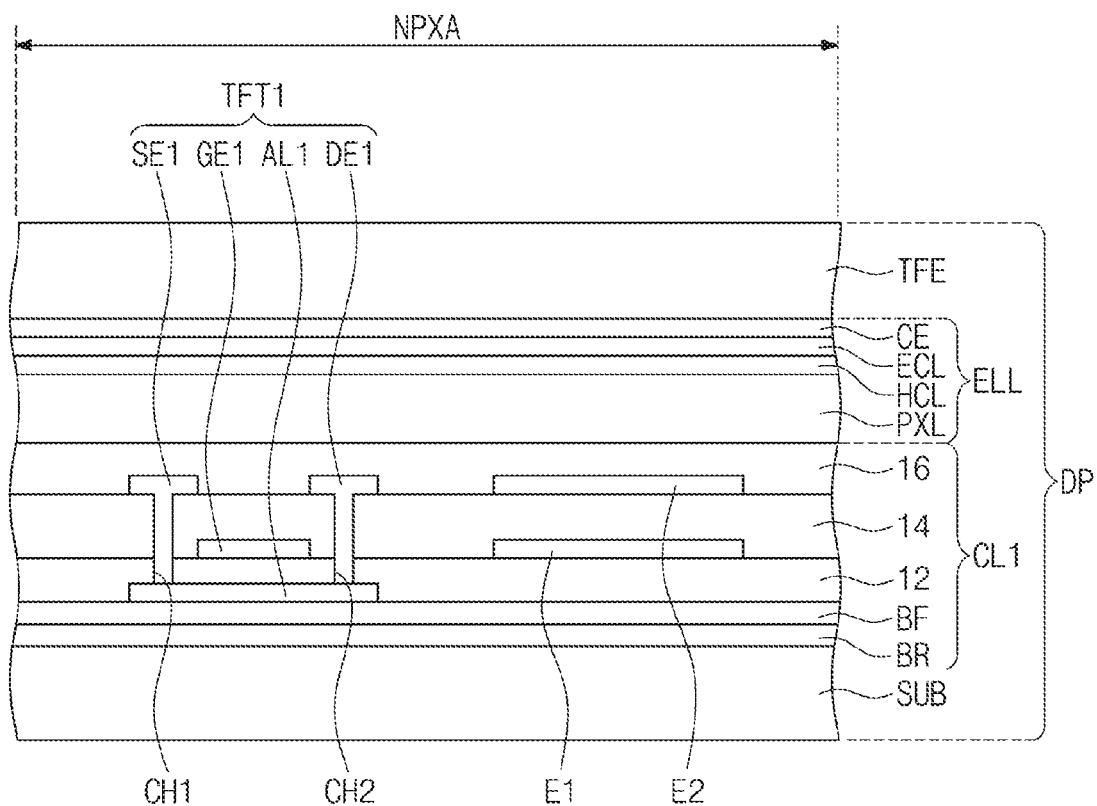
FIGS. 6 and 7 are partial cross-sectional views illustrating a display panel according to some exemplary embodiments.
Figure 6:
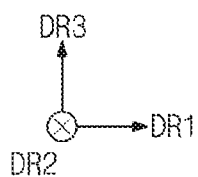
Figure 7:
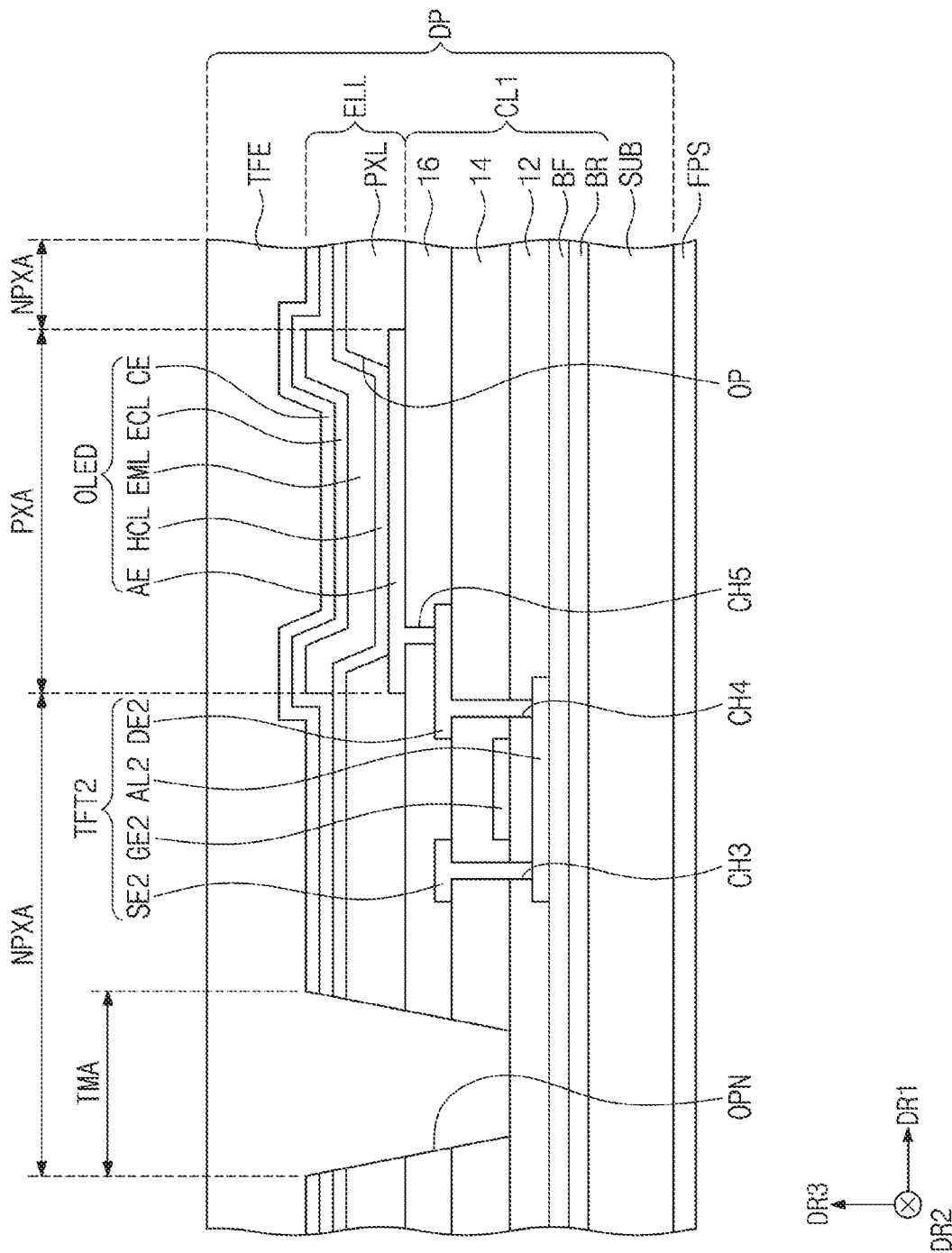

FIG. 4 is a plan view illustrating a display panel DP according to some exemplary embodiments. FIG. 5 is an equivalent circuit diagram of a pixel PX according to some exemplary embodiments. FIGS. 6 and 7 are partial cross-sectional views illustrating a display panel DP according to some exemplary embodiments.

As illustrated in FIG. 4, the display panel DP includes a display area DA and a non-display area NDA when viewed in a plan view. The display area DA and the non-display area NDA of the display panel DP correspond to the display area DD-DA and the non-display area DD-NDA of the display device DD, respectively. However, the display area DA and the non-display area NDA of the display panel DP need not be the same as the display area DD-DA and the non-display area DD-NDA of the display device DD, but may be changed according to a structure and/or a design of the display panel DP.

The display panel DP includes a plurality of signal lines SGL and a plurality of pixels PX. An area in which the plurality of pixels PX is disposed is defined as the display area DA. In some exemplary embodiments, the non-display area NDA may be defined along a border of the display area DA.

The plurality of signal lines SGL may include gate lines GL, data lines DL, a power line PL, and a control signal line CSL. Each of the gate lines GL is connected to corresponding ones of the plurality of pixels PX, and each of the data lines DL is connected to corresponding ones of the plurality of pixels PX. The power line PL is connected to the plurality of pixels PX. A gate driving circuit DCV to which the gate lines GL are connected may be disposed at one side portion of the non-display area NDA; however, exemplary embodiments are not limited thereto or thereby. The control signal line CSL may provide control signals to the gate driving circuit DCV.

One or some of the gate lines GL, the data lines DL, the power line PL, and the control signal line CSL may be disposed in one layer, and another or others of the gate lines GL, the data lines DL, the power line PL, and the control signal line CSL may be disposed in another layer different from the one layer. The signal lines SGL disposed in the one layer of the gate lines GL, the data lines DL, the power line PL, and the control signal line CSL may be defined as first signal lines, and the signal lines SGL disposed in the another layer may be defined as second signal lines. The signal lines disposed in still another layer may be defined as third signal lines.

Each of the gate lines GL, the data lines DL, the power line PL, and the control signal line CSL may include a signal interconnection portion and a display panel pad PD-DP connected to an end of the signal interconnection portion. The signal interconnection portion may be defined as a portion of each of the signal lines SGL except the display panel pads PD-DP.

The display panel pads PD-DP may be formed in a same process as transistors (see, e.g., first transistor TFT1 of FIG. 6) for driving the pixels PX. For example, the display panel pads PD-DP may be formed in the same low-temperature polycrystalline silicon (LTPS) process or low-temperature polycrystalline oxide (LTPO) process as the transistors for driving the pixels PX.

In some exemplary embodiments, the display panel pads PD-DP may include a control pad CSL-P, a data pad DL-P, and a power pad PL-P. A gate pad is not illustrated; however, the gate pad may overlap with the gate driving circuit DCV and/or may be connected to the gate driving circuit DCV. Even though not indicated in the drawings, a portion of the non-display area NDA in which the control pad CSL-P, the data pad DL-P, and the power pad PL-P are arranged, may be defined as a pad area. As described later, pads of the touch sensing unit TS may be disposed adjacent to the aforementioned pads of the display panel PD.

The pixel PX connected to one gate line GL, one data line DL, and the power line PL is illustrated as a representative example in FIG. 5. It is noted, however, that the configuration of the pixel PX is not limited to the configuration illustrated and described in association with FIG. 5, but may be variously modified.

The pixel PX includes a light-emitting element OLED used as a display element. The light-emitting element OLED may be a front surface light-emitting type diode or a back surface light-emitting type diode. Alternatively, the light-emitting element OLED may be a both surface light-emitting type diode. The pixel PX includes a first transistor (or a switching transistor) TFT1, a second transistor (or a driving transistor) TFT2, and a capacitor CAP that constitute a circuit part for driving the light-emitting element OLED. The light-emitting element OLED generates light based on an electrical signal provided from the first and second transistors TFT1 and TFT2.

The first transistor TFT1 outputs a data signal applied to the data line DL (or corresponding to another data signal applied to the data line DL) in response to a scan signal applied to the gate line GL. The capacitor CAP is charged with a voltage corresponding to the data signal received from the first transistor TFT1.

The second transistor TFT2 is connected to the light-emitting element OLED. The second transistor TFT2 controls a driving current flowing through the light-emitting element OLED in response to the amount of charge stored in the capacitor CAP. The light-emitting element OLED emits light while the second transistor TFT2 is turned-on.

FIG. 6 is a cross-sectional view of a portion of the display panel DP including or corresponding to the first transistor TFT1 and the capacitor CAP of the equivalent circuit illustrated in FIG. 5. FIG. 7 is a cross-sectional view of a portion of the display panel DP including or corresponding to the second transistor TFT2 and the light-emitting element OLED of the equivalent circuit illustrated in FIG. 5.

As illustrated in FIGS. 6 and 7, a first circuit layer CL1 is disposed on a base layer SUB. A semiconductor pattern AL1 (hereinafter, referred to as a "first semiconductor pattern") of the first transistor TFT1 and a semiconductor pattern AL2 (hereinafter, referred to as a "second semiconductor pattern") of the second transistor TFT2 are disposed on the base layer SUB. Each of the first and second semiconductor patterns AL1 and AL2 may include at least one of amorphous silicon, poly-silicon, or a metal oxide semiconductor. Here, the first and second semiconductor patterns AL1 and AL2 may include the same material or different materials from each other.

The first circuit layer CL1 may include organic/inorganic layers BR, BF, 12, 14, and 16, the first transistor TFT1, the second transistor TFT2, and electrodes E1 and E2. The organic/inorganic layers BR, BF, 12, 14, and 16 may include a functional layer BR and BF, a first insulating layer 12, a second insulating layer 14, and a third insulating layer 16.

The functional layer BR and BF may be disposed on one surface of the base layer SUB. The functional layer BR and BF includes at least one of a barrier layer BR and a buffer layer BF. The first semiconductor pattern AL1 and the second semiconductor pattern AL2 may be disposed on the barrier layer BR or the buffer layer BF.

The first insulating layer 12 is disposed on the base layer SUB and covers the first semiconductor pattern AL1 and the second semiconductor pattern AL2. The first insulating layer 12 includes an organic layer and/or an inorganic layer. The first insulating layer 12 may include a plurality of inorganic thin layers. The plurality of inorganic thin layers may include a silicon nitride layer and a silicon oxide layer.

A control electrode GE1 (hereinafter, referred to as a "first control electrode") of the first transistor TFT1 and a control electrode GE2 (hereinafter, referred to as a "second control electrode") of the second transistor TFT2 are disposed on the first insulating layer 12. A first electrode E1 of the capacitor CAP is disposed on the first insulating layer 12. The first control electrode GE1, the second control electrode GE2, the first electrode E1, and the gate lines GL (see FIG. 5) may be formed using the same photolithography process. In other words, the first control electrode GE1, the second control electrode GE2, the first electrode E1, and the gate lines GL may be formed of the same material and the same stack structure, and may be disposed on the same layer, e.g., the first insulating layer 12.

The second insulating layer 14 is disposed on the first insulating layer 12 and covers the first control electrode GE1, the second control electrode GE2, and the first electrode E1. The second insulating layer 14 includes an organic layer and/or an inorganic layer. For instance, the second insulating layer 14 may include a plurality of inorganic thin layers. The plurality of inorganic thin layers may include a silicon nitride layer and a silicon oxide layer.

The data lines DL (see FIG. 5) may be disposed on the second insulating layer 14. An input electrode SE1 (hereinafter, referred to as a "first input electrode") and an output electrode DE1 (hereinafter, referred to as a "first output electrode") of the first transistor TFT1 are disposed on the second insulating layer 14. An input electrode SE2 (hereinafter, referred to as a "second input electrode") and an output electrode DE2 (hereinafter, referred to as a "second output electrode") of the second transistor TFT2 are disposed on the second insulating layer 14. The first input electrode SE1 is branched from a corresponding one of the data lines DL. The power line PL (see FIG. 5) and the data lines DL may be disposed on the same layer. The second input electrode SE2 may be branched from the power line PL.

A second electrode E2 of the capacitor CAP is disposed on the second insulating layer 14. The second electrode E2, the data lines DL and the power line PL may be formed using the same photolithography process, may have the same material and the same stack structure, and may be disposed on the same layer.

The first input electrode SE1 and the first output electrode DE1 are connected to portions of the first semiconductor pattern AL1 through a first through-hole CH1 and a second through-hole CH2 penetrating the first and second insulating layers 12 and 14, respectively. The first output electrode DE1 may be electrically connected to the first electrode E1. For example, the first output electrode DE1 may be connected to the first electrode E1 through a through-hole (not shown) penetrating the second insulating layer 14. The second input electrode SE2 and the second output electrode DE2 are connected to portions of the second semiconductor pattern AL2 through a third through-hole CH3 and a fourth through-hole CH4 penetrating the first and second insulating layers 12 and 14, respectively. Although described and illustrated as top gate structures, in some exemplary embodiments, the first transistor TFT1 and/or the second transistor TFT2 may have bottom gate structures, dual gate structures, etc.

The third insulating layer 16 is disposed on the second insulating layer 14 and covers the first input electrode SE1, the first output electrode DE1, the second input electrode SE2, and the second output electrode DE2, and the second electrode E2. The third insulating layer 16 includes an organic layer and/or an inorganic layer. For instance, the third insulating layer 16 may include an organic material to provide a flat surface.

One of the first, second, and third insulating layers 12, 14, and 16 may be omitted according to a circuit structure of the pixel PX. Each of the second and third insulating layers 14 and 16 may be defined as an interlayer insulating layer. The interlayer insulating layer is disposed between a conductive pattern disposed thereunder and a conductive pattern disposed thereon to insulate the conductive patterns from each other.

A light-emitting element layer ELL is disposed on the third insulating layer 16. The light-emitting element layer ELL includes a pixel-defining layer PXL and the light-emitting element OLED. An anode AE is disposed on the third insulating layer 16. The anode AE is connected to the second output electrode DE2 through a fifth through-hole CH5 penetrating the third insulating layer 16. An opening OP is defined in the pixel-defining layer PXL. The opening OP of the pixel-defining layer PXL exposes at least a portion of the anode AE.

The light-emitting element layer ELL includes a light emitting area PXA and a non-light emitting area NPXA adjacent to the light emitting area PXA. The non-light emitting area NPXA may surround the light emitting area PXA. In some exemplary embodiments, the light emitting area PXA is defined to correspond to the anode AE. However, the light emitting area PXA is not limited thereto or thereby. In other words, it is sufficient that the light emitting area PXA is defined as an area from which light is generated. In some exemplary embodiments, the light emitting area PXA may be defined to correspond to a portion of the anode AE that is exposed by the opening OP.

A hole control layer HCL may be disposed in common in both the light emitting area PXA and the non-light emitting area NPXA. Even though not shown in the drawings, a common layer, such as the hole control layer HCL, may be formed in common in the plurality of pixels PX (see FIG. 4).

A light-emitting layer EML is disposed on the hole control layer HCL. The light-emitting layer EML may be disposed in only an area corresponding to the opening OP. In other words, the light-emitting layers EML of the pixels PX may be separated from each other. The light-emitting layer EML may include an organic material or an inorganic material.

An electron control layer ECL is disposed on the light-emitting layer EML. A cathode CE is disposed on the electron control layer ECL. The cathode CE is disposed in common in the plurality of pixels PX.

In some exemplary embodiments, the patterned light-emitting layer EML is illustrated as an example. In some exemplary embodiments, the light-emitting layer EML may be disposed in common in the plurality of pixels PX. In this manner, the light-emitting layer EML may generate white light. In some exemplary embodiments, the light-emitting layer EML may have a multi-layered structure.

According to some exemplary embodiments, a thin film sealing layer TFE directly covers the cathode CE. In some exemplary embodiments, a capping layer (not shown) covering the cathode CE may further be disposed. In this case, the thin film sealing layer TFE may directly cover the capping layer. The thin film sealing layer TFE may include an organic layer including an organic material and an inorganic layer including an inorganic material.

In some exemplary embodiments, the non-light emitting area NPXA may include a transmission area TMA. An opening OPN overlapping with the transmission area TMA may be defined in the display panel DP. In the transmission area TMA, the light or ultrasonic wave generated from the fingerprint recognition unit FPS may pass through the opening OPN. When, however, the display module DM-E includes the capacitance-type fingerprint recognition unit FPS-E illustrated in FIGS. 3C and 3D, the non-light emitting area NPXA may not include the transmission area TMA.

Figure 8:
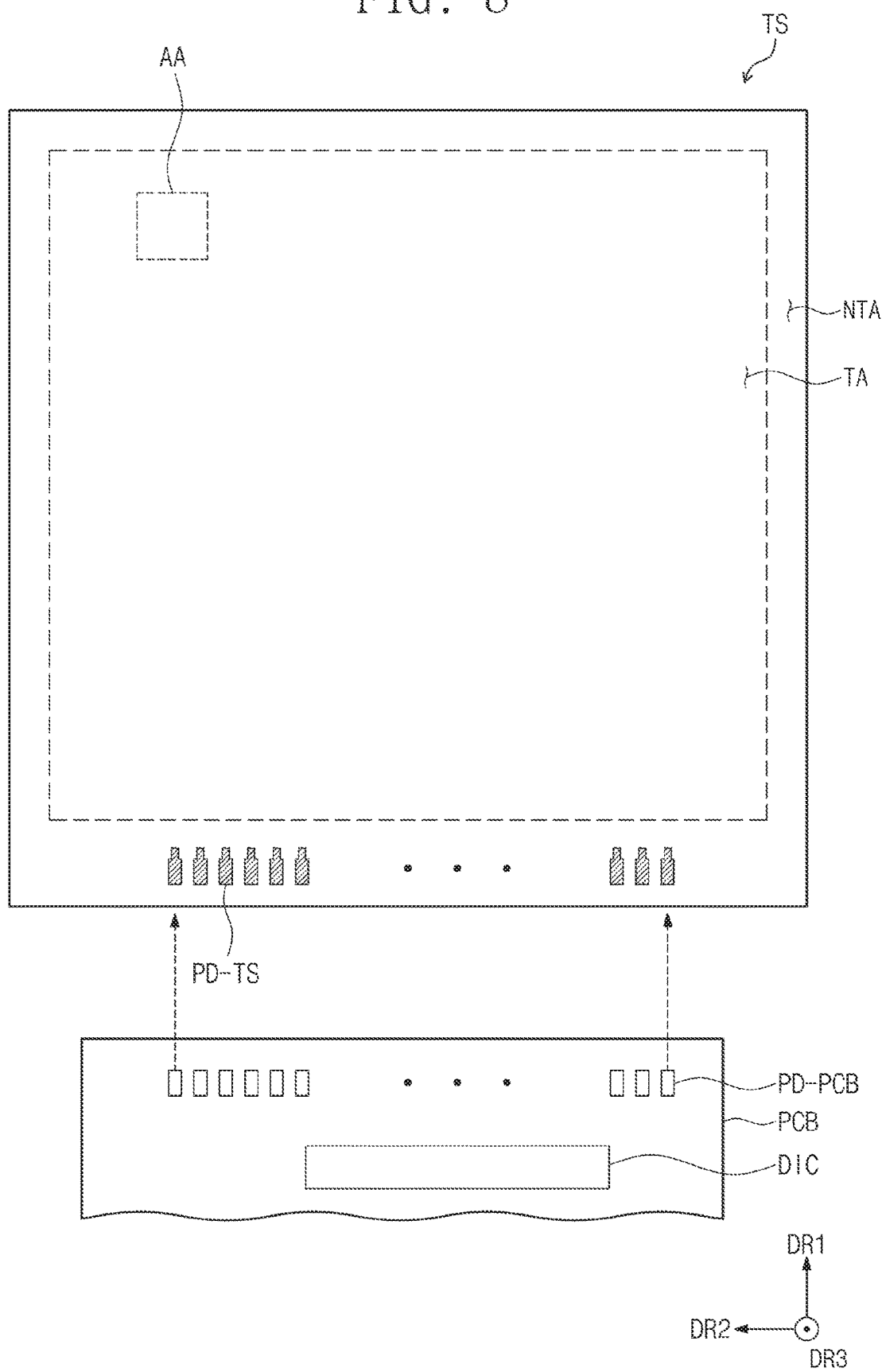
FIG. 8 is a plan view illustrating a touch sensing unit according to some exemplary embodiments.

FIG. 8 is a plan view illustrating a touch sensing unit TS according to some exemplary embodiments.

The touch sensing unit TS includes a touch sensing area (or active area) TA and a touch non-sensing area (or inactive area) NTA when viewed in a plan view. The touch sensors for sensing a touch may be disposed in the touch sensing area TA. Touch signal lines for electrically connecting the touch sensors to touch sensing unit pads PD-TS may be disposed in the touch non-sensing area NTA.

The touch sensing unit pads PD-TS are electrically connected to pads PD-PCB of a printed circuit board PCB. An integrated circuit DIC may be disposed on the printed circuit board PCB. The integrated circuit DIC may be formed by a chip-on-flexible printed circuit (COF) method. The integrated circuit DIC may control the touch sensing unit TS. In some exemplary embodiments, the integrated circuit DIC may control the display panel DP as well as the touch sensing unit TS.

Figure 9:
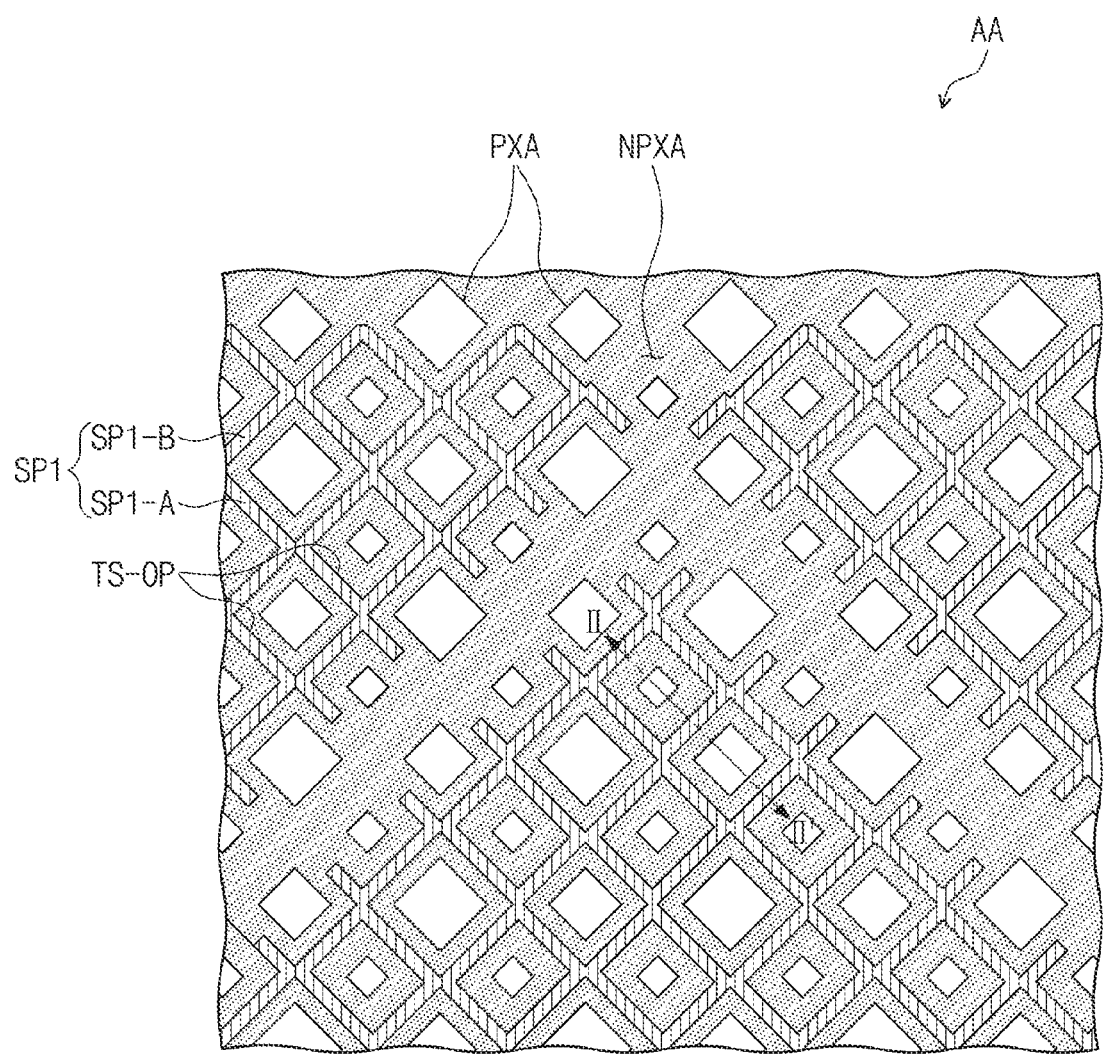
FIG. 9 is an enlarged view of portion AA of FIG. 8 according to some exemplary embodiments.
Figure 10A:
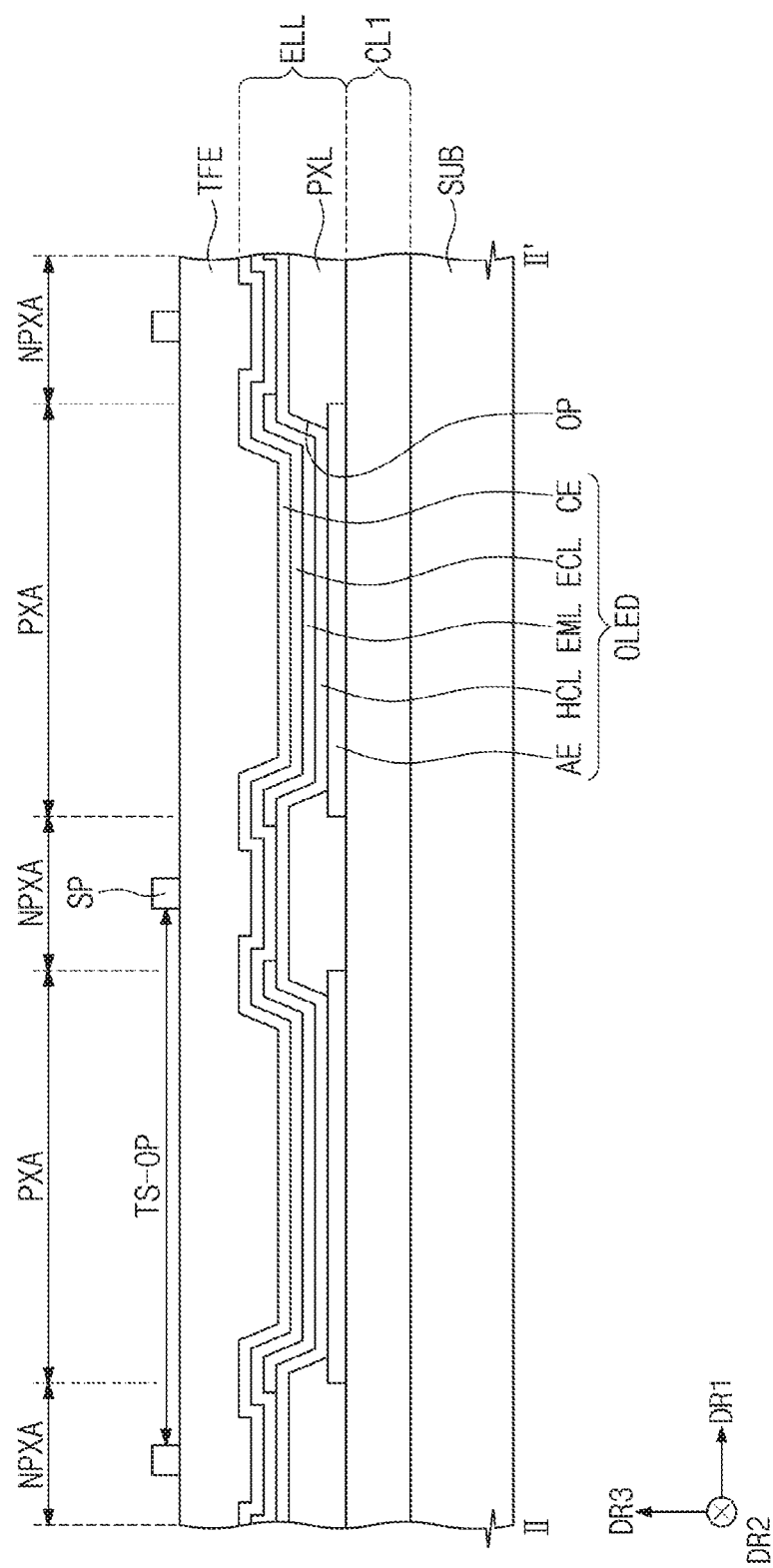
FIGS. 10A and 10B are cross-sectional views taken along sectional line II-II' of FIG. 9 according to some exemplary embodiments.
Figure 10B:
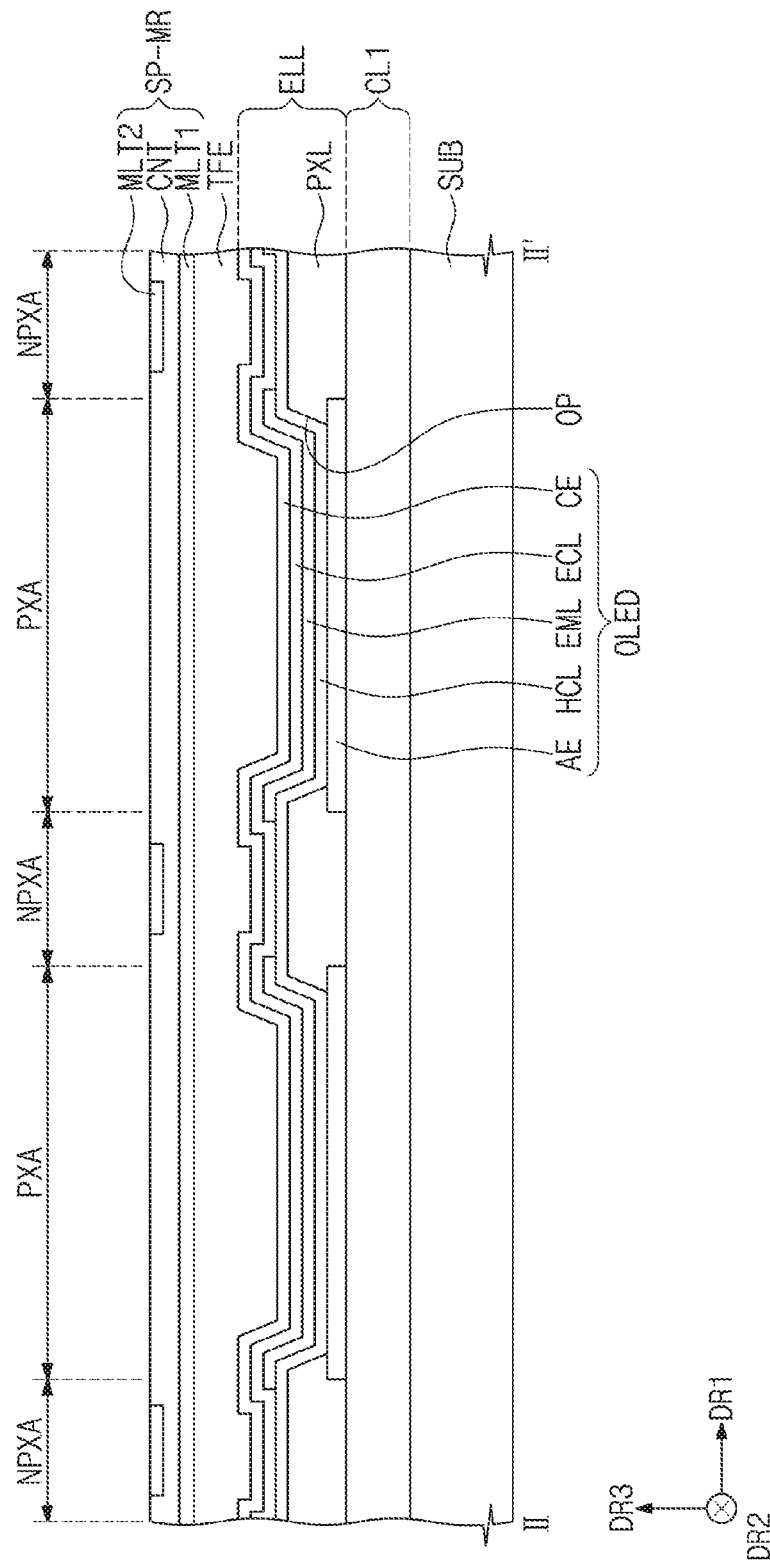

FIG. 9 is an enlarged view of portion AA of FIG. 8 according to some exemplary embodiments. FIGS. 10A and 10B are cross-sectional views taken along sectional line II-II' of FIG. 9 according to some exemplary embodiments.

Referring to FIG. 9, the touch sensing area TA includes a plurality of the light emitting areas PXA and the non-light emitting area NPXA surrounding the light emitting areas PXA. A first touch sensor SP1 overlaps with the non-light emitting area NPXA. The first touch sensor SP1 includes a plurality of first extensions SP1-A extending in a fifth direction DR5 and a plurality of second extensions SP1-B extending in a sixth direction DR6 intersecting the fifth direction DR5. Each of the plurality of first extension SP1-A and each of the plurality of second extension SP1-B may be defined as a mesh line. A width of the mesh line may be several micrometers.

The plurality of first extensions SP1-A and the plurality of second extensions SP1-B are connected to each other to define a plurality of touch openings TS-OP. In other words, the first touch sensor SP1 has a mesh shape including the plurality of touch openings TS-OP. In some exemplary embodiments, the touch openings TS-OP correspond to the light emitting areas PXA, respectively. However, exemplary embodiments are not limited thereto or thereby. In some exemplary embodiments, one touch opening TS-OP may correspond to two or more light emitting areas PXA.

Sizes (e.g., areas) of the light emitting areas PXA may be various. For example, the sizes of the light emitting areas PXA providing blue light may be different from those of the light emitting areas PXA providing red light. Thus, sizes (e.g., areas) of the touch openings TS-OP may also be various. The light emitting areas PXA having various sizes are illustrated as an example in FIG. 9; however, exemplary embodiments are not limited thereto or thereby. In some exemplary embodiments, the sizes of the light emitting areas PXA may be equal to each other, and the sizes of the touch openings TS-OP may also be equal to each other.

FIGS. 9 and 10A illustrate a touch sensor SP exposed to the outside. Alternatively, the display module DM may further include an insulating layer that is disposed on the thin film sealing layer TFE to cover the first touch sensor SP.

Referring to FIG. 10B, a touch sensor SP-MR may include a first touch electrode MLT1, an insulating pattern CNT, and a second touch electrode MLT2. The insulating pattern CNT insulates the first touch electrode MLT1 from the second touch electrode MLT2. Each of the first and second touch electrodes MLT1 and MLT2 may reflect incident light. Thus, the first and second touch electrodes MLT1 and MLT2 may provide a mirror function to a user.

Figure 11A:
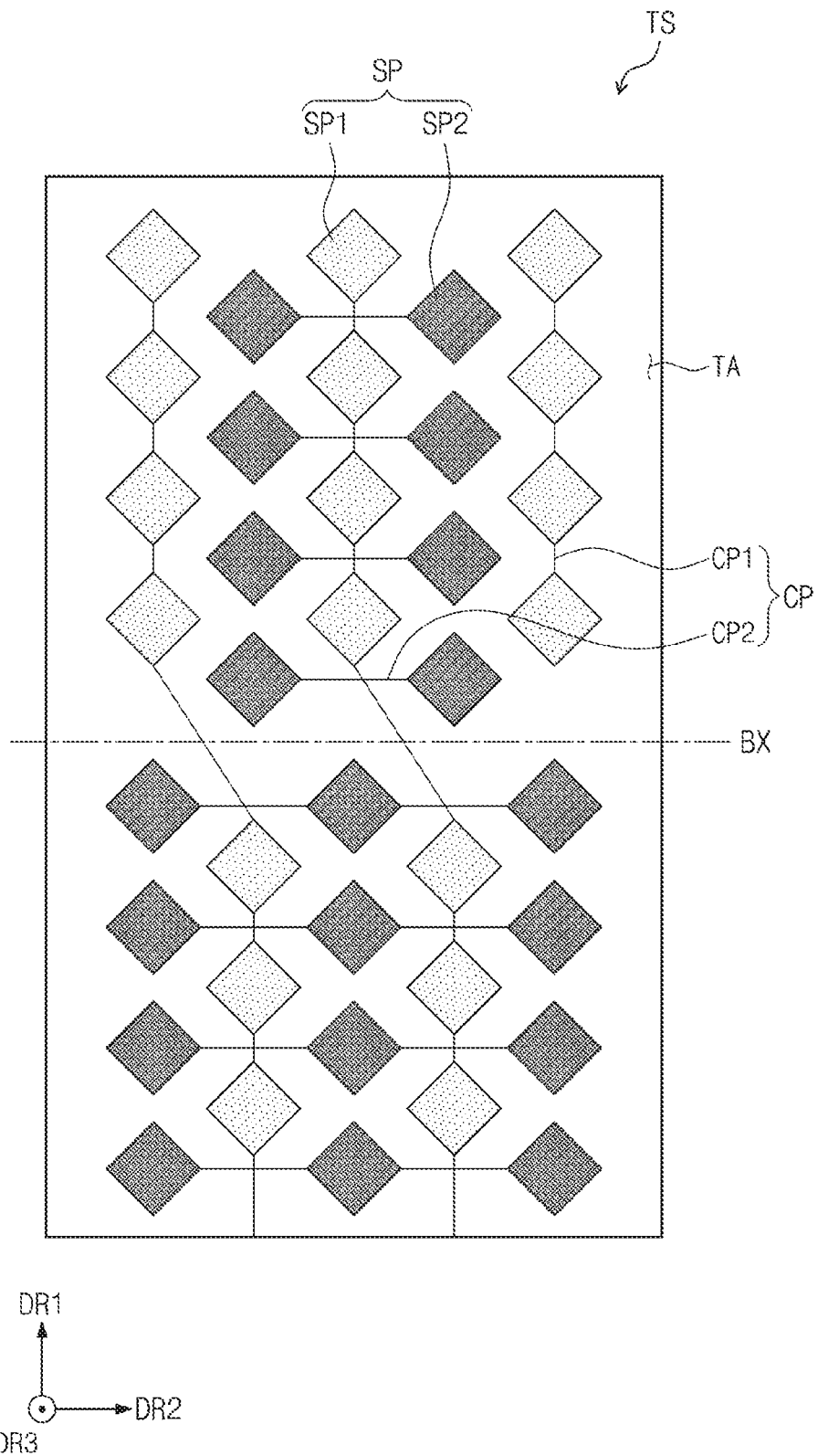
FIG. 11A is a plan view illustrating touch sensors disposed in a touch sensing area according to some exemplary embodiments.
Figure 11B:
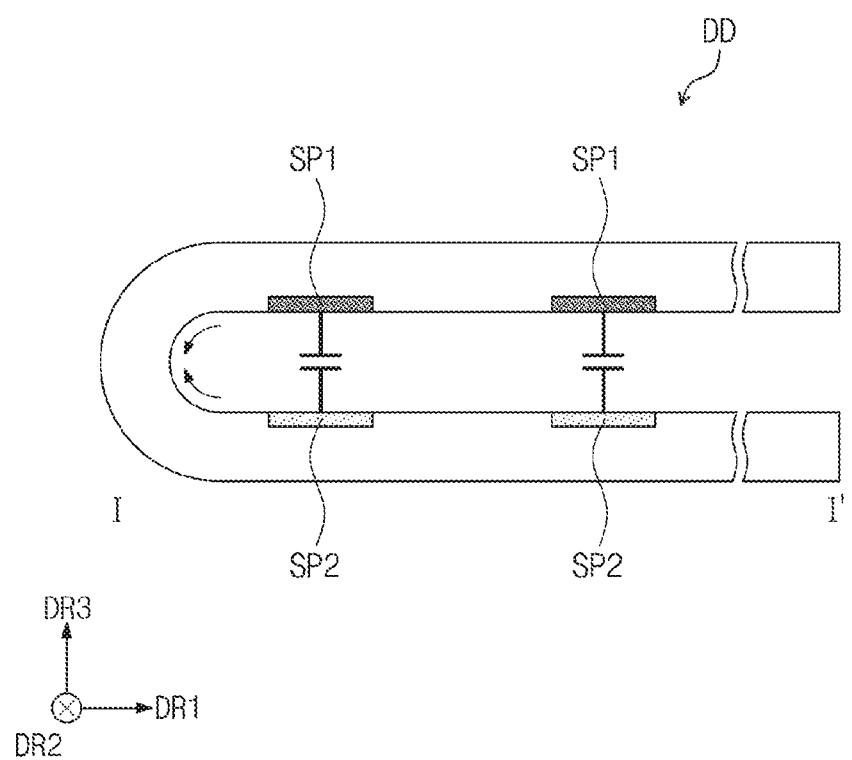
FIG. 11B is a cross-sectional view taken along sectional line I-I' of FIG. 2A according to some exemplary embodiments.

FIG. 11A is a plan view illustrating touch sensors SP disposed in a touch sensing area TA according to some exemplary embodiments. FIG. 11B is a cross-sectional view taken along sectional line I-I' of FIG. 2A according to some exemplary embodiments.

Referring to FIG. 11A, a touch sensing unit TS includes touch sensors SP and connection patterns CP, which are disposed in the touch sensing area TA.

The touch sensors SP may include first touch sensors SP1 and second touch sensors SP2. The first touch sensors SP1 may be arranged to constitute a plurality of columns parallel to the first direction DR1, and each of the columns may include the first touch sensors SP1 that are arranged in the first direction DR1 and are electrically connected to each other. The columns of the first touch sensors SP1 may be arranged in the second direction DR2. Each of the first touch sensors SP1 may have a mesh shape in which a plurality of touch openings TS-OP is defined.

The second touch sensors SP2 may be insulated from the first touch sensors SP1 by insulating patterns CNT. The insulating patterns CNT may include at least one of an inorganic material and an organic material. The inorganic material may include at least one of silicon oxide and silicon nitride. The organic material may include at least one of an acrylic-based resin, a methacrylic-based resin, polyisoprene, a vinyl-based resin, an epoxy-based resin, a urethane-based resin, a cellulose-based resin, and a perylene-based resin.

The second touch sensors SP2 may be arranged to constitute a plurality of rows parallel to the second direction DR2, and each of the rows may include the second touch sensors SP2 that are arranged in the second direction DR2 and are electrically connected to each other. Each of the second touch sensors SP2 may have a mesh shape in which a plurality of touch openings TS-OP is defined.

The connection patterns CP may include first connection patterns CP1 and second connection patterns CP2. Each of the first connection patterns CP1 connects adjacent first touch sensors SP1. Each of the second connection patterns CP2 connects adjacent second touch sensors SP2.

In some exemplary embodiments, at least one of the first touch sensors SP1 and the second touch sensors SP2 may include a conductive polymer material. The conductive polymer material may include a polythiophene-based compound, a polypyrrole-based compound, a polyaniline-based compound, a polyacetylene-based compound, a polyphenylene-based compound, or any mixture thereof. For instance, the conductive polymer material may include PEDOT/PSS among the polythiophene-based compounds. The conductive polymer material may be easily manufactured. In addition, flexibility of the conductive polymer material may be higher than that of a conductive metal oxide (e.g., ITO), and, thus, the possibility of occurrence of a crack in the conductive polymer material may be reduced when the conductive polymer material is bent.

In some exemplary embodiments, the first connection patterns CP1 or the second connection patterns CP2 may have a bridge function.

The first touch sensors SP1 may be capacitively coupled to the second touch sensors SP2. In some exemplary embodiments, the first touch sensors SP1 may transmit electric fields, and the second touch sensors SP2 may receive the electric fields transmitted from the first touch sensors SP1. In other exemplary embodiments, the second touch sensors SP2 may transmit electric fields, and the first touch sensors SP1 may receive the electric fields transmitted from the second touch sensors SP2.

The above mentioned shapes of the first and second touch sensors SP1 and SP2 are provided as an example. However, exemplary embodiments are not limited thereto or thereby. In some exemplary embodiments, each of the first and second touch sensors SP1 and SP2 may have a bar shape having a uniform width.

The first touch sensors SP1 and the second touch sensors SP2 may be disposed symmetrically with respect to the bending axis BX.

Referring to FIG. 11B, the first touch sensor SP1 overlaps with the second touch sensor SP2 in the in-folding mode in which the display device DD is in-folded along the bending axis BX. In this manner, the first touch sensor SP1 and the second touch sensor SP2 overlapping with each other are capacitively coupled to each other. When external pressure is applied, a capacitance between the first and second touch sensors SP1 and SP2 capacitively coupled to each other may be changed and the display device DD may sense the change in the capacitance to measure the external pressure.

As described above, the display device DD may sense a touch of a user in the normal mode and may sense pressure applied by a user in the in-folding mode. However, exemplary embodiments are not limited thereto or thereby. In some exemplary embodiments, the touch sensing unit TS may not sense the applied pressure.

Figure 12A:
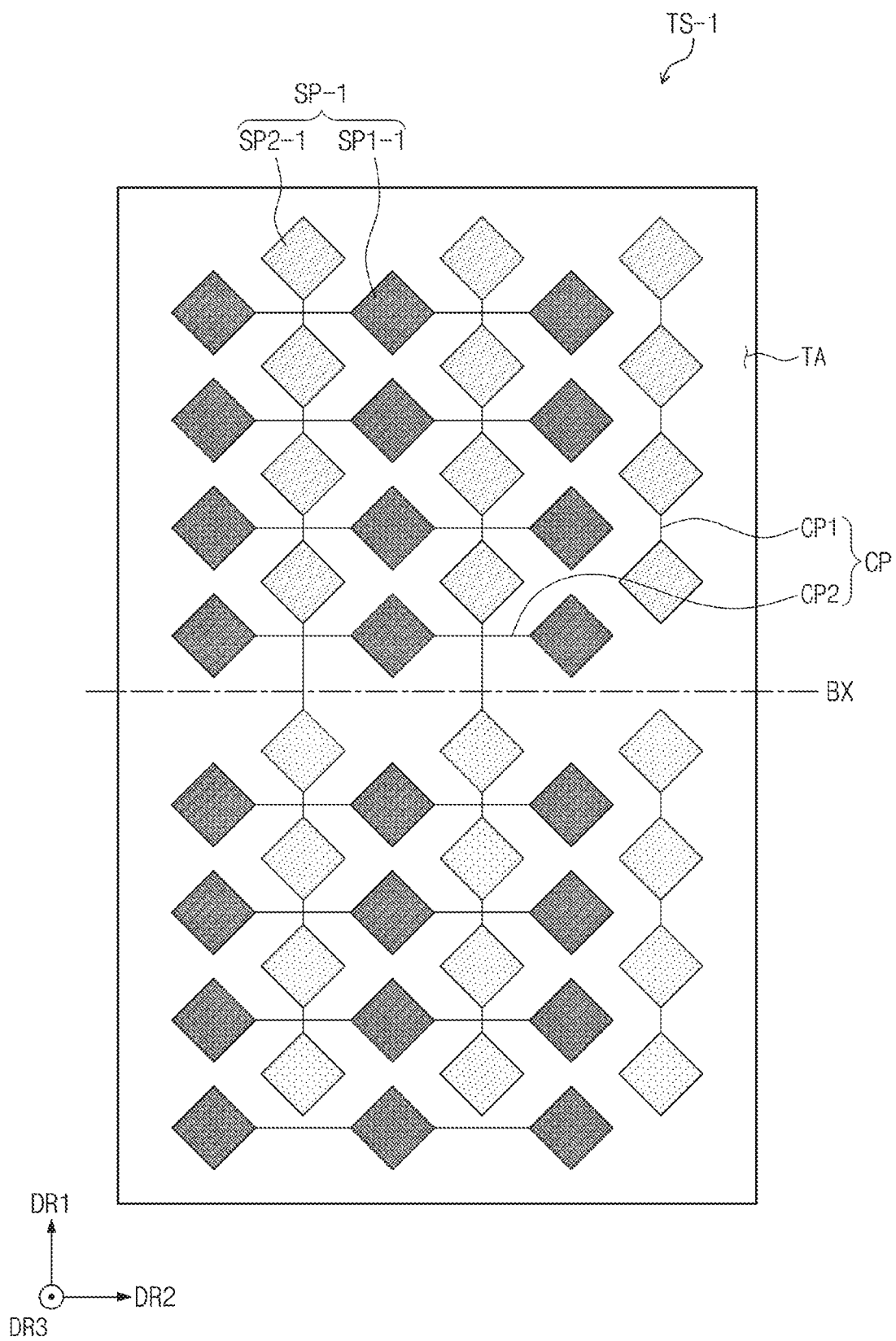
FIG. 12A is a plan view illustrating touch sensors disposed in a touch sensing area according to some exemplary embodiments.
Figure 12B:
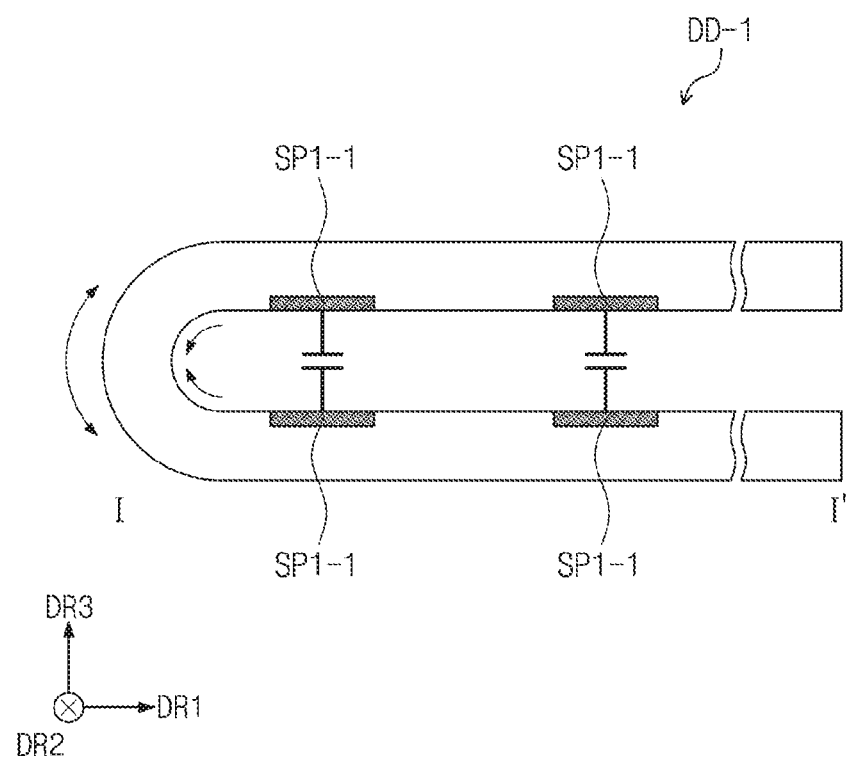
FIG. 12B is a cross-sectional view taken along the line I-I' of FIG. 2A according to some exemplary embodiments.

FIG. 12A is a plan view illustrating touch sensors SP-1 disposed in a touch sensing area TA according to some exemplary embodiments. FIG. 12B is a cross-sectional view taken along sectional line I-I' of FIG. 2A according to some exemplary embodiments.

Referring to FIG. 12A, a touch sensing unit TS-1 includes touch sensors SP-1 and connection patterns CP that are disposed in the touch sensing area TA. Te touch sensors SP-1 may include first touch sensors SP1-1 and second touch sensors SP2-1. Unlike the touch sensors SP illustrated in FIGS. 11A and 11B, the same kind of the touch sensors SP-1 are symmetrical with respect to the bending axis BX in FIG. 12A. For example, one or some of the first touch sensors SP1-1 and another or others of the first touch sensors SP1-1 are disposed symmetrically with respect to the bending axis BX. In addition, one or some of the second touch sensors SP2-1 and another or others of the second touch sensors SP2-1 are disposed symmetrically with respect to the bending axis BX.

Referring to FIG. 12B, the one or some of the first touch sensors SP1-1 may overlap with the another or others of the first touch sensor SP1-1 in the in-folding mode in which the display device DD is in-folded along the bending axis BX. At this time, the first touch sensors SP1-1, which overlap with each other, are capacitively coupled to each other. When external pressure is applied, a capacitance between the first touch sensors SP1-1 capacitively coupled to each other may be changed and the display device DD may sense the change in the capacitance to measure the external pressure.

In the normal mode, the first touch sensors SP1-1 of a display device DD-1 may selectively perform one of a function of transmitting electric fields and a function of receiving the electric fields. However, in the in-folding mode of the display device DD-1, one of the overlapping two first touch sensors SP1-1 transmits the electric field and the other of the overlapping two first touch sensors SP1-1 receives the electric field.

In the normal mode, the second touch sensors SP2-1 of the display device DD-1 may selectively perform one of a function of transmitting electric fields and a function of receiving the electric fields. However, in the in-folding mode of the display device DD-1, one of overlapping two second touch sensors SP2-1 transmits the electric field and the other of the overlapping two second touch sensors SP2-1 receives the electric field.

The integrated circuit DIC (see FIG. 8) may control the role change of the first and second touch sensors SP1-1 and SP2-1 according to the mode change between the normal mode and the in-folding mode.

Figure 13:
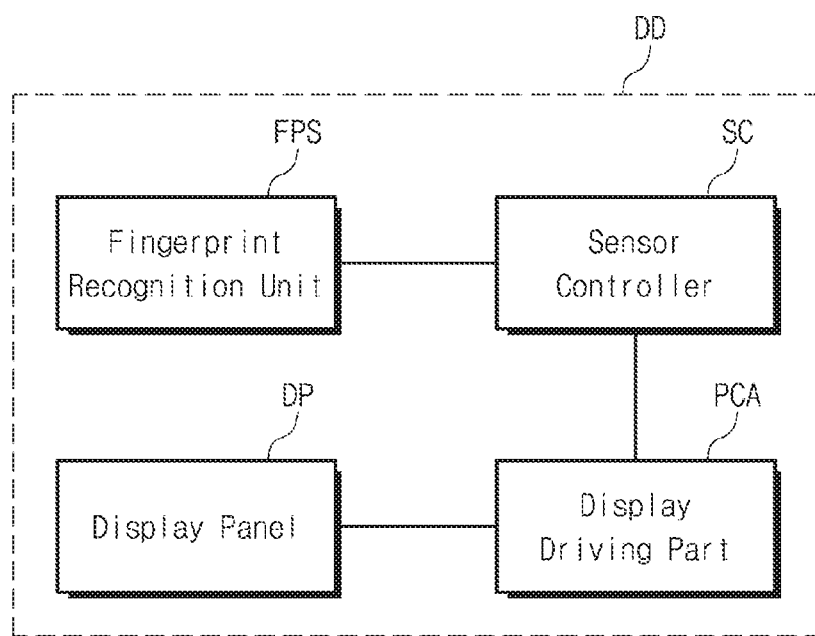
FIG. 13 is a block diagram illustrating a display device according to some exemplary embodiments.

FIG. 13 is a block diagram illustrating a display device according to some exemplary embodiments.

Referring to FIG. 13, the display device DD may further include a sensor controller SC and a display driving part PCA.

The sensor controller SC may control operations of the fingerprint recognition unit FPS and may sense, for example, the change in amount of light in the fingerprint recognition unit FPS to recognize a fingerprint of a user.

The display driving part PCA may supply an image driving signal to the display panel DP to control an image displaying operation of the display panel DP. To achieve this, the display driving part PCA may generate the image driving signal using image data and a control signal that are supplied from the outside. For example, the display driving part PCA may be supplied with the image data and the control signal from a host (not shown), and the control signal may include a vertical synchronization signal, a horizontal synchronization signal, and/or a main clock signal. In addition, the image driving signal may include a scan signal and data signals generated using the image data.

In some exemplary embodiments, the sensor controller SC may be integrated with the display driving part PCA. For example, the sensor controller SC and the display driving part PCA may be realized as a single integrated circuit (IC).

Figure 14A:
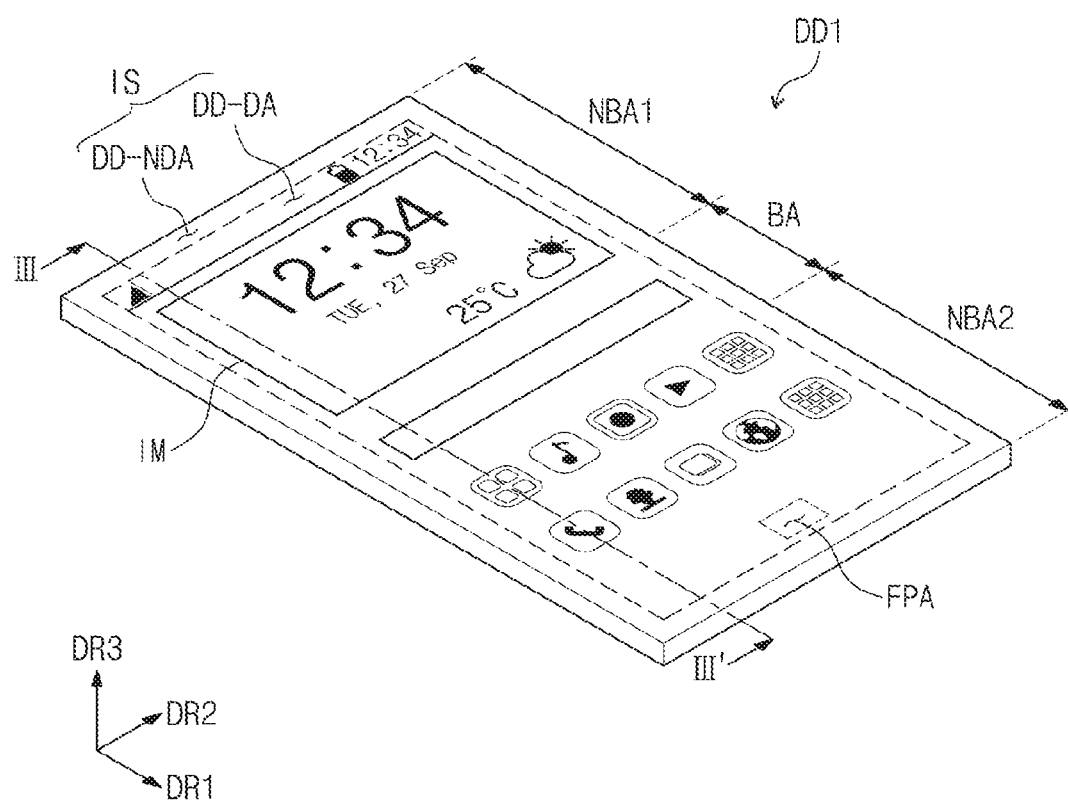
FIG. 14A is a perspective view illustrating a display device in a normal mode according to some exemplary embodiments.
Figure 14B:
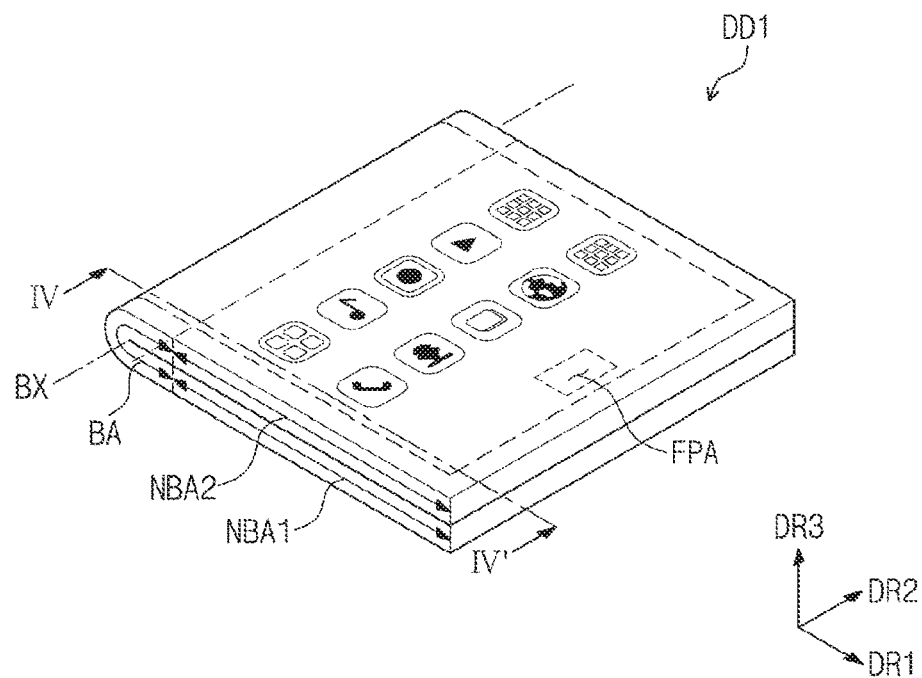
FIGS. 14B and 14C are perspective views illustrating the display device of FIG. 14A in out-folding modes according to various exemplary embodiments.
Figure 14C:
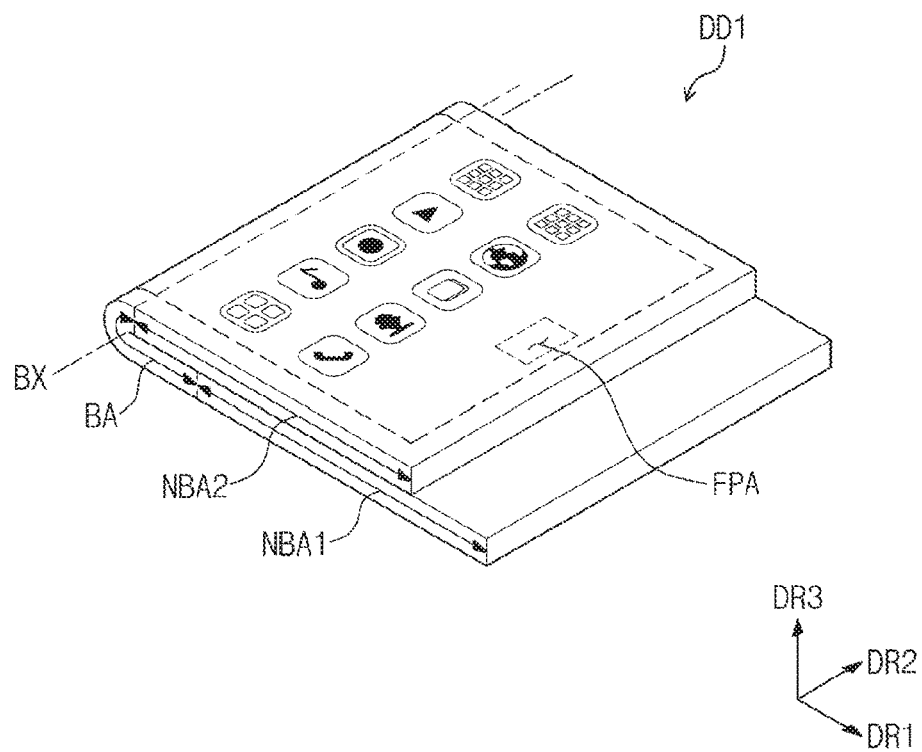

FIG. 14A is a perspective view illustrating a display device DD1 in a normal mode according to some exemplary embodiments. FIGS. 14B and 14C are perspective views illustrating the display device DD1 of FIG. 14A in out-folding modes according to various exemplary embodiments. The display device DD1 in a normal mode in FIG. 14A may be substantially the same as the display device DD in the normal mode in FIG. 1, and, thus, duplicative descriptions will be omitted.

As illustrated in FIG. 14B, the display device DD1 may be outer-bent such that a display surface IS of the display device DD1 is exposed to the outside. For the purposes of this specification, a case in which a back surface of a first non-bending area NBA1 faces a back surface of a second non-bending area NBA2 is defined as the out-folding mode. A case which is not the out-folding mode may be defined as the normal mode.

FIG. 14C illustrates another example of the display device DD1, and illustrates the display device DD1 of which a folding portion is different from that of the display device DD1 of FIG. 14B. As such, exemplary embodiments are not limited to or by the numbers of the bending area BA and the non-bending area NBA of the display device DD1 or a position of the bending area of the display device DD1.

A user can set security and/or control the display device DD1 through fingerprint recognition even though the display device DD1 is in the out-folding mode, and, thus, convenience of a user can be improved.

Figure 15A:
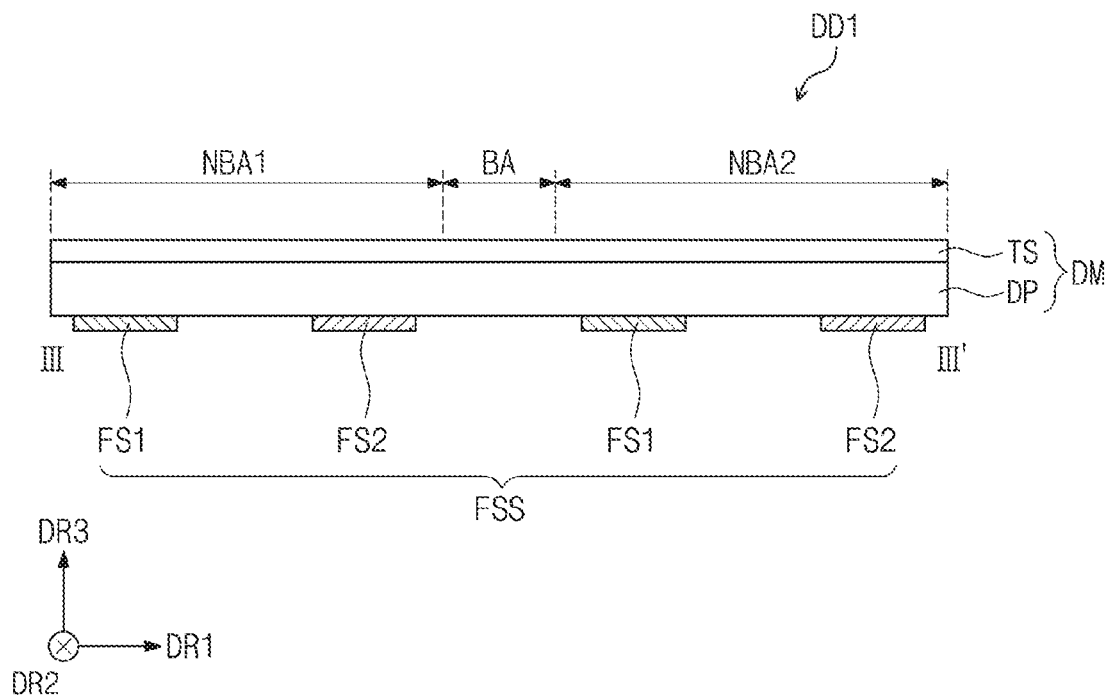
FIG. 15A is a cross-sectional view taken along sectional line III-III' of FIG. 14A according to some exemplary embodiments.
Figure 15B:
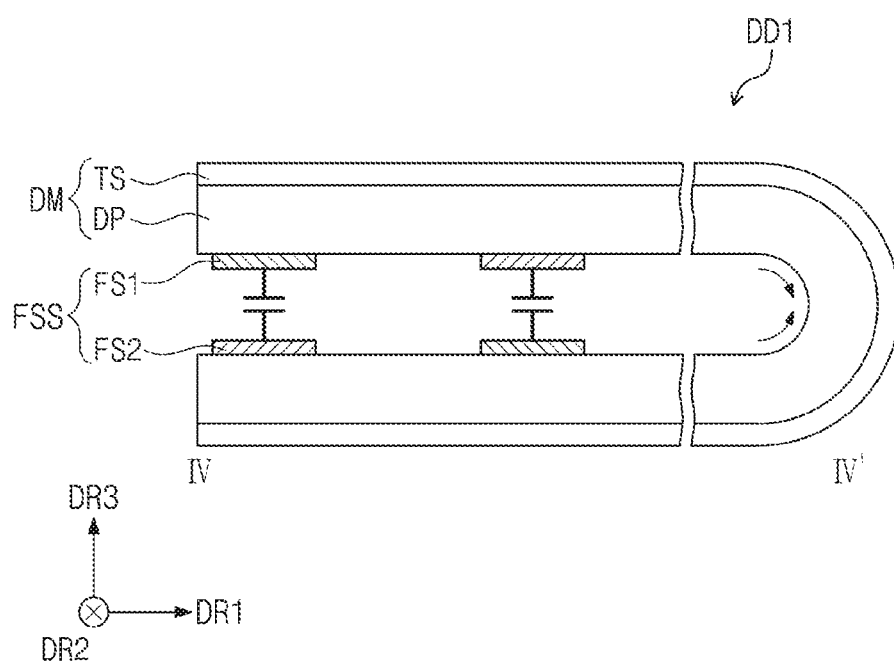
FIG. 15B is a cross-sectional view taken along sectional line IV-IV' of FIG. 14B according to some exemplary embodiments.

FIG. 15A is a cross-sectional view taken along a line III-III' of FIG. 14A to illustrate a display device according to some embodiments of the invention. FIG. 15B is a cross-sectional view taken along a line IV-IV' of FIG. 14B to illustrate a display device according to some embodiments of the invention.

Referring to FIG. 15A, a force sensor FSS is disposed under the display module DM. The force sensor FSS includes a first force-sensing electrode FS1 and a second force-sensing electrode FS2. The first force-sensing electrode FS1 and the second force-sensing electrode FS2 may be symmetrical with respect to the bending axis BX.

Referring to FIG. 15B, the first force-sensing electrode FS1 overlaps with the second force-sensing electrode FS2 in the out-folding mode. The first and second force-sensing electrodes FS1 and FS2 overlapping with each other are capacitively coupled to each other. When external pressure is applied, a capacitance between the first and second force-sensing electrodes FS1 and FS2 capacitively coupled to each other may be changed and the display device DD1 may sense the change in the capacitance to measure the external pressure.

Figure 16A:
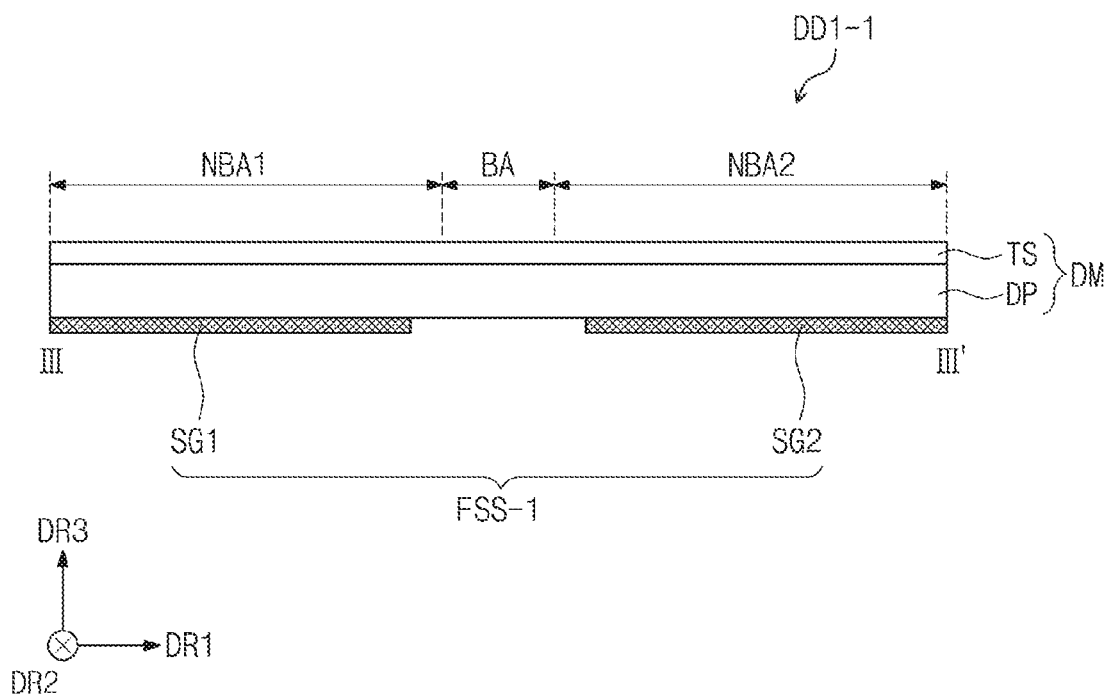
FIG. 16A is a cross-sectional view taken along sectional line III-III' of FIG. 14A according to some exemplary embodiments.
Figure 16B:
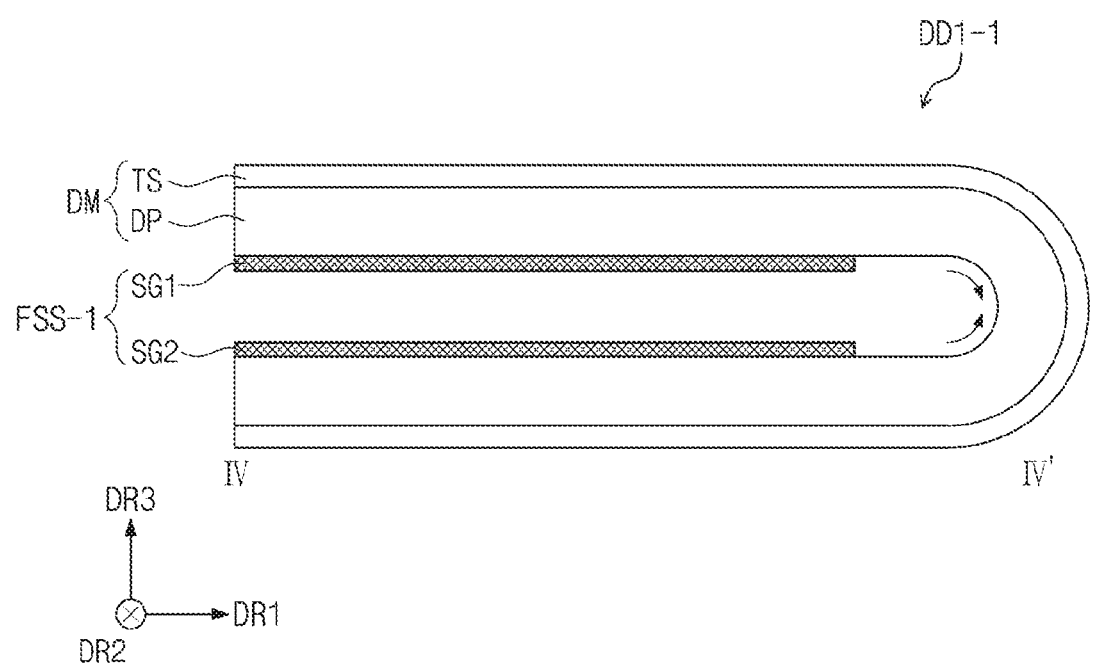
FIG. 16B is a cross-sectional view taken along sectional line IV-IV' of FIG. 14B according to some exemplary embodiments.
Figure 16C:
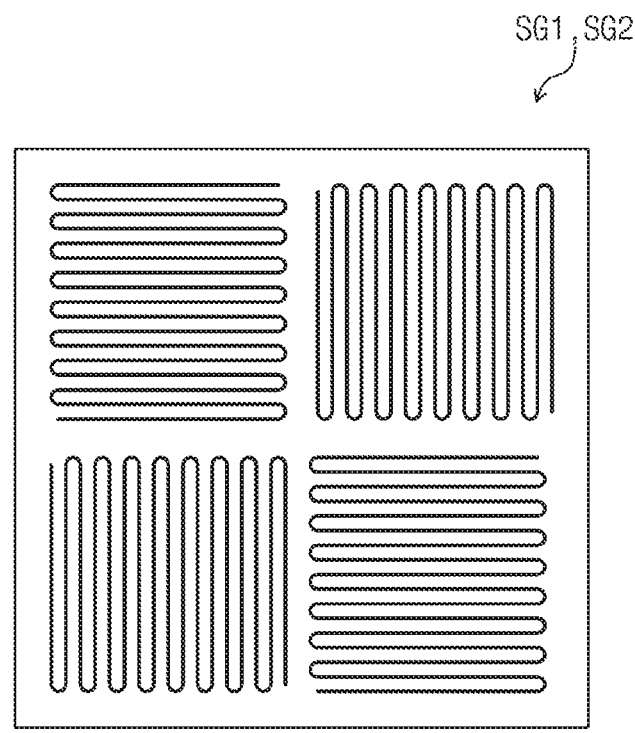
FIG. 16C illustrates strain gauges of the display device of FIG. 16A according to some exemplary embodiments.
Figure 16C:
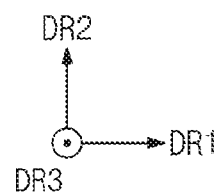

FIG. 16A is a cross-sectional view taken along sectional line III-III' of FIG. 14A according to some exemplary embodiments. FIG. 16B is a cross-sectional view taken along sectional line IV-IV' of FIG. 14B according to some exemplary embodiments. FIG. 16C illustrates strain gauges SG1 and SG2 of FIG. 16A according to some exemplary embodiments.

Referring to FIG. 16A, a force sensor FSS-1 is disposed under the display module DM. The force sensor FSS-1 includes strain gauges SG1 and SG2. The strain gauges SG1 and SG2 may include a first strain gauge SG1 and a second strain gauge SG2. The first strain gauge SG1 may be disposed to overlap with the first non-bending area NBA1, and the second strain gauge SG2 may be disposed to overlap with the second non-bending area NBA2. The strain gauge SG1 and SG2 is used to measure pressure, torque, or stress using a pressure resistance effect that a resistance value of a resistor formed of a metal or semiconductor is varied when the resistor is deformed.

Referring to FIG. 16C, a metal pattern of each of the strain gauges SG1 and SG2 may have a specific direction. The direction of the metal pattern of one of the strain gauges SG1 and SG2 may be perpendicular to the direction of the metal pattern of another, adjacent to the one strain gauge, of the strain gauges SG1 and SG2. Like this, the strain gauges SG1 and SG2 may be disposed such that the directions of the metal patterns are perpendicular to each other, and thus, the sensitivity of measuring pressure may be improved.

Figure 17:
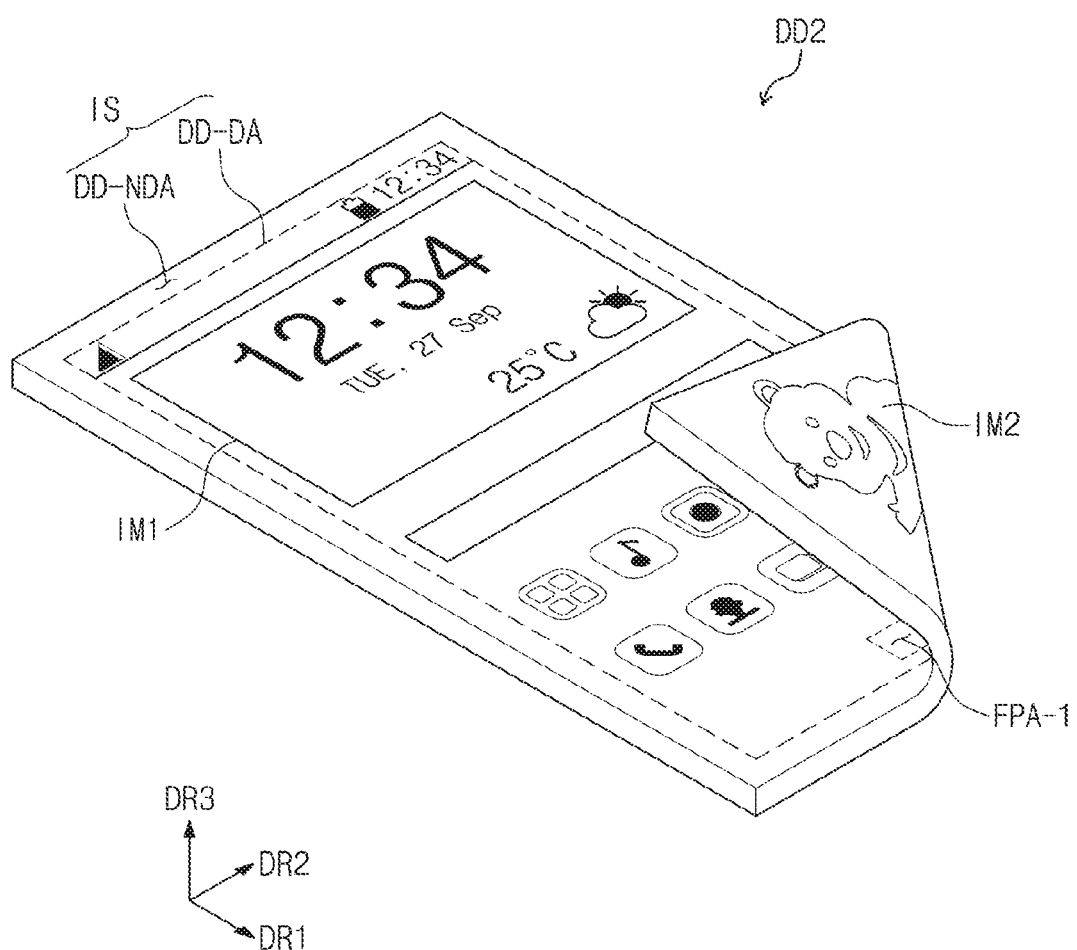
FIG. 17 is a perspective view illustrating a display device according to some exemplary embodiments.

FIG. 17 is a perspective view illustrating a display device DD2 according to some exemplary embodiments. The display device DD2 of FIG. 17 is similar to the display device DD of FIG. 1, and, therefore, duplicative descriptions are omitted.

The display device DD2 is a both surface light-emitting display device that provides images IM1 and IM2 through its front surface and back surface. The display device DD2 provides a first image IM1 through the front surface. In FIG. 17, application icons are illustrated as an example of the first image IM1. The display device DD2 provides a second image IM2 through the back surface. In FIG. 17, a bear doll image is illustrated as an example of the second image IM2. A fingerprint recognition area FPA-1 may be defined in at least one of the front surface and the back surface of the display device DD2. The fingerprint recognition area FPA-1 may be substantially the same as the fingerprint recognition area FPA of FIG. 1. A fingerprint recognition unit may be included in the display device DD2 and may overlap with the fingerprint recognition area FPA-1. The fingerprint recognition unit of the display device DD2 may be one of the fingerprint recognition units FPS and FPS-E described with reference to FIGS. 3A to 3D.

Figure 18:
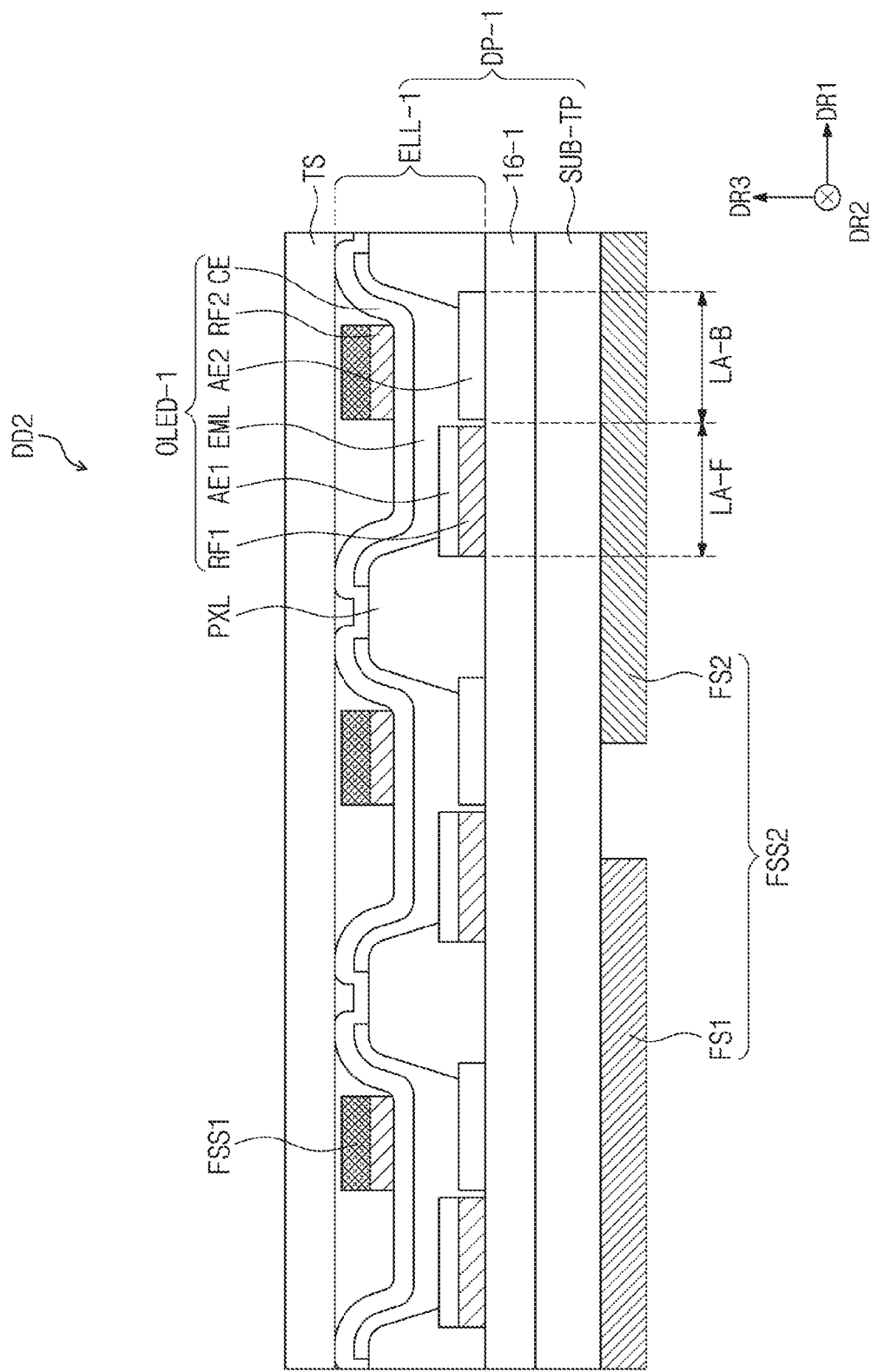
FIG. 18 is a partial cross-sectional view illustrating a display device according to some exemplary embodiments.

FIG. 18 is a partial cross-sectional view illustrating the display device DD2 according to some exemplary embodiments.

As seen in FIG. 18, the display device DD2 includes a display panel DP-1, a touch sensing unit TS, a first force sensor FSS1, and a second force sensor FSS2. The display panel DP-1 includes a transparent base layer SUB-TP, an insulating layer 16-1, and a light-emitting element layer ELL-1.

The transparent base layer SUB-TP may transmit at least a portion of incident light. For example, the transparent base layer SUB-TP may include glass. The insulating layer 16-1 is disposed on the transparent base layer SUB-TP. A function and a material of the insulating layer 16-1 may be substantially the same as those of the third insulating layer 16 of FIGS. 6 and 7, and, thus, duplicative descriptions will be omitted. The light-emitting element layer ELL-1 is disposed on the insulating layer 16-1. The light-emitting element layer ELL-1 includes a light-emitting element OLED-1. The light-emitting element OLED-1 may include a front surface light emitting area LA-F and a back surface light emitting area LA-B.

The light-emitting element OLED-1 includes a first reflection layer RF1, a first anode AE1, a second anode AE2, a light-emitting layer EML, a cathode CE, and a second reflection layer RF2.

The first reflection layer RF1 is disposed on the insulating layer 16-1 and overlaps with the front surface light emitting area LA-F. The first reflection layer RF1 may reflect incident light, e.g., reflect incident light toward touch sensing unit TS.

The first anode AE1 is disposed on the first reflection layer RF1 and overlaps with the front surface light emitting area LA-F. The second anode AE2 is disposed on the insulating layer 16-1 and overlaps with the back surface light emitting area LA-B.

The light-emitting layer EML is disposed on the first anode AE1 and the second anode AE2, and overlaps with the front surface light emitting area LA-F and the back surface light emitting area LA-B. The cathode CE is disposed on the light-emitting layer EML, and overlaps with the front surface light emitting area LA-F and the back surface light emitting area LA-B. The second reflection layer RF2 is disposed on the cathode CE, and overlaps with the back surface light emitting area LA-B. The second reflection layer RF2 may reflect incident light, e.g., reflect incident light towards transparent base layer SUB-TP.

Light generated in the light-emitting layer EML is reflected by the first reflection layer RF1 so as to be emitted to the front surface of the display device DD2. Light generated in the light-emitting layer EML is reflected by the second reflection layer RF2 so as to be emitted to the back surface of the display device DD2. Thus, the light-emitting element OLED-1 may emit the light to the front surface and the back surface of the display device DD2.

The first force sensor FSS1 is disposed on the second reflection layer RF2, and overlaps with the back surface light emitting area LA-B. The first force sensor FSS1 may sense pressure applied to the display device DD2. The first force sensor FSS1 may include a strain gauge. The touch sensing unit TS may be disposed on the first force sensor FSS1.

The second force sensor FSS2 is disposed under the display panel DP-1. When the display device DD2 is folded, the second force sensor FSS2 may sense pressure applied to the display device DD2. The second force sensor FSS2 includes a first force-sensing electrode FS1 and a second force-sensing electrode FS2. The first and second force-sensing electrodes FS1 and FS2 may be substantially the same as described with reference to FIG. 15A, and, thus, duplicative descriptions will be omitted.

Figure 19:
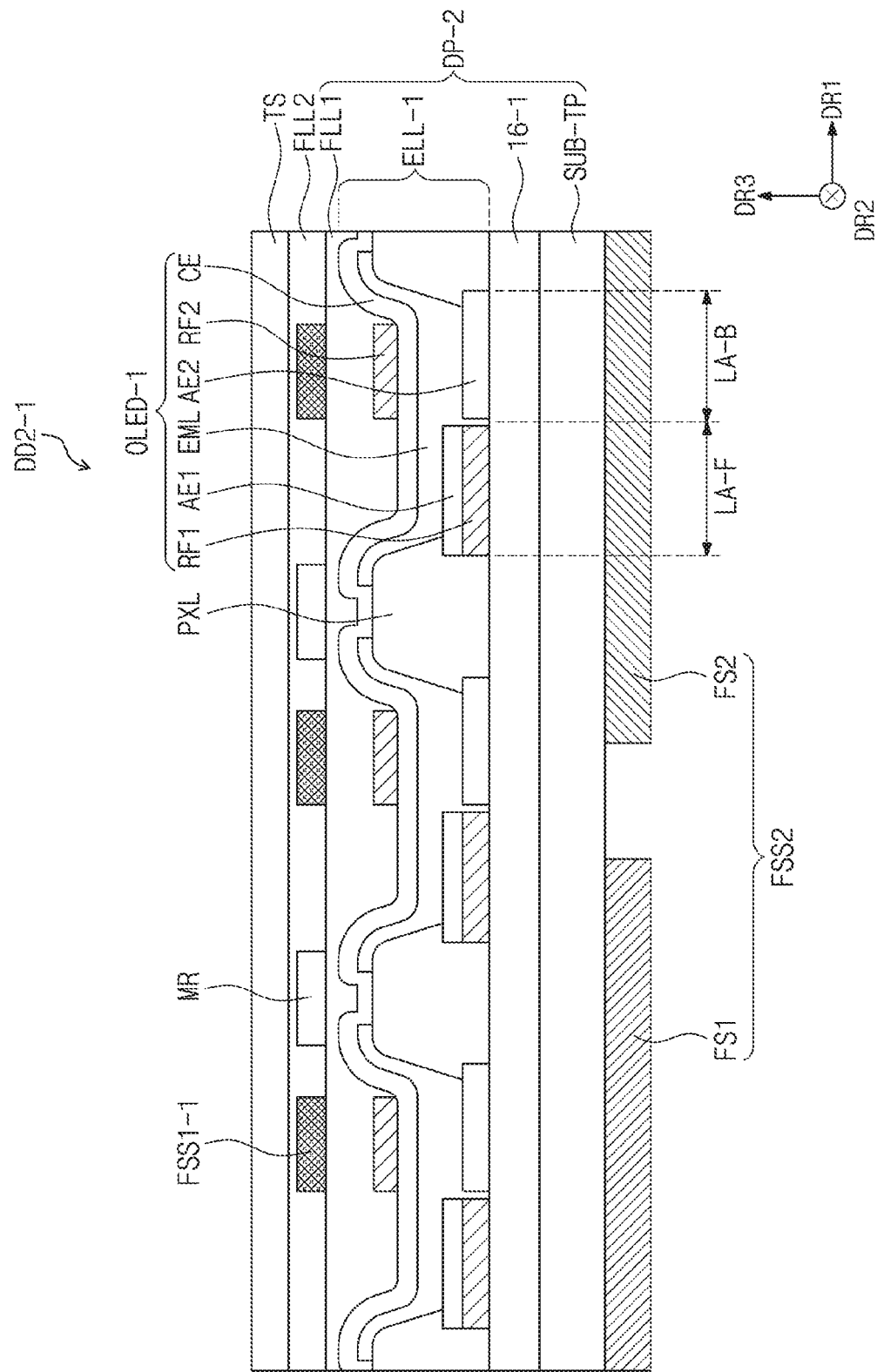
FIG. 19 is a partial cross-sectional view illustrating a display device according to some exemplary embodiments.

FIG. 19 is a partial cross-sectional view illustrating a display device DD2-1 according to some embodiments of the invention.

The display device DD2-1 includes a display panel DP-2, a touch sensing unit TS, a first force sensor FSS1-1, a second force sensor FSS2, and a reflection member MR. The display panel DP-2 includes a transparent base layer SUB-TP, an insulating layer 16-1, a light-emitting element layer ELL-1, and a planarization layer FLL1.

The reflection member MR is disposed on the planarization layer FLL1. The reflection member MR is disposed between the first force sensors FSS1-1. The reflection member MR may reflect light to provide a mirror function to a user.

The planarization layer FFL1 covers the light-emitting element layer ELL-1 and provides a planarized surface. The planarization layer FLL1 may include an organic material. In some exemplary embodiments, the planarization layer FLL1 may act as a sealing material that seals the light-emitting element layer ELL-1.

The first force sensor FSS1-1 is similar to the first force sensor FSS1 of FIG. 18, however, the first force sensor FSS1-1 may be disposed on the planarization layer FLL1. The first force sensor FSS1-1 may be covered with an additional planarization layer FFL2.

Other components of the display device DD2-1 may be substantially the same as described with reference to FIG. 18, and, thus, duplicative descriptions will be omitted.

Figure 20:
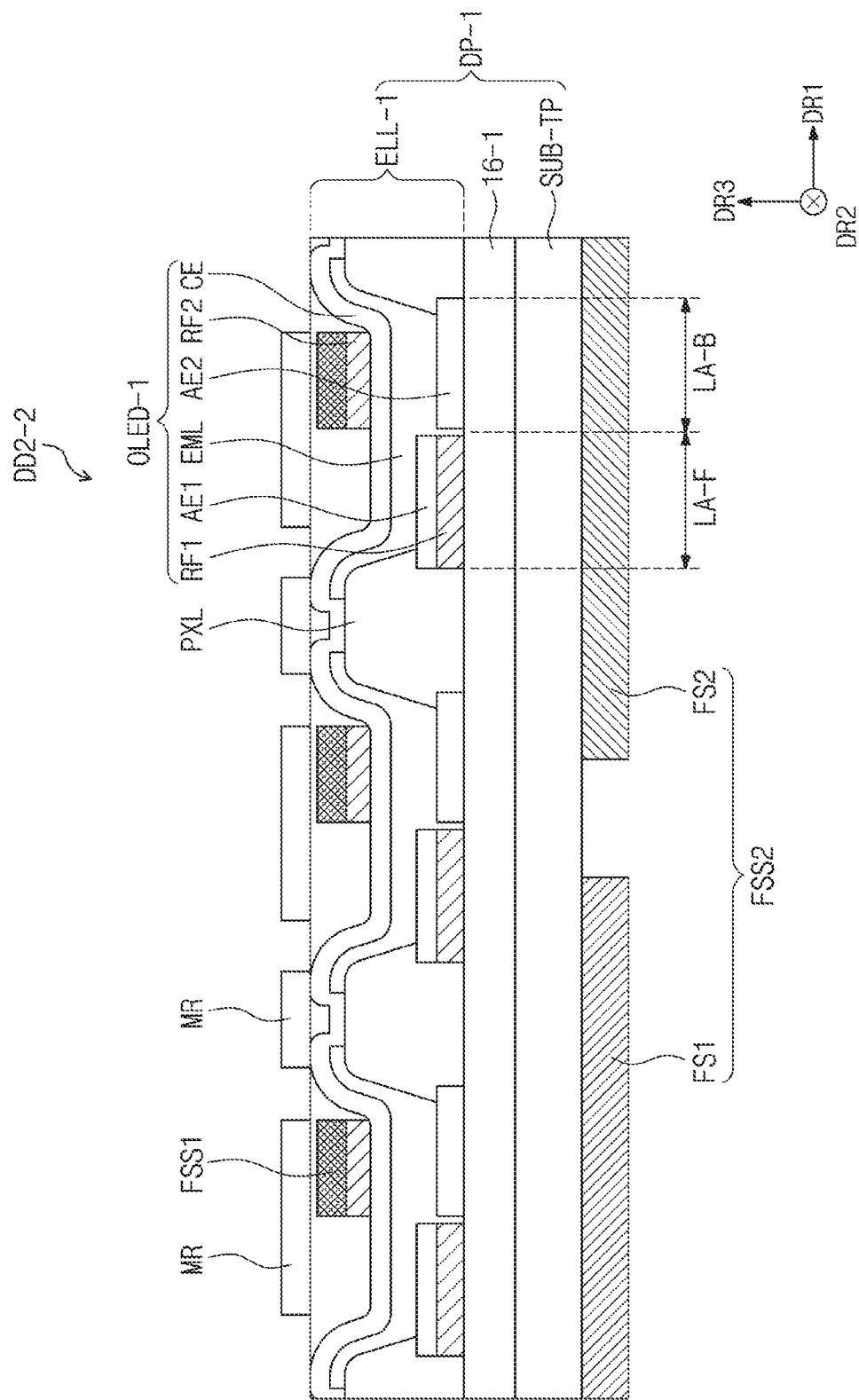
FIG. 20 is a partial cross-sectional view illustrating a display device according to some exemplary embodiments.

FIG. 20 is a partial cross-sectional view illustrating a display device DD2-2 according to some exemplary embodiments.

The display device DD2-2 includes a display panel DP-1, a reflection member MR, a first force sensor FSS1, and a second force sensor FSS2.

The reflection member MR is disposed on the first force sensor FSS1 and overlaps with the front surface light emitting area LA-F and the back surface light emitting area LA-B. The reflection member MR may reflect light to provide a mirror function to a user. The reflection member MR may be capacitively coupled to the first force sensor FSS1 to sense a touch of a user. For example, the reflection member MR and the first force sensor FSS1 may sense a touch by a self-capacitance method.

Figure 21:
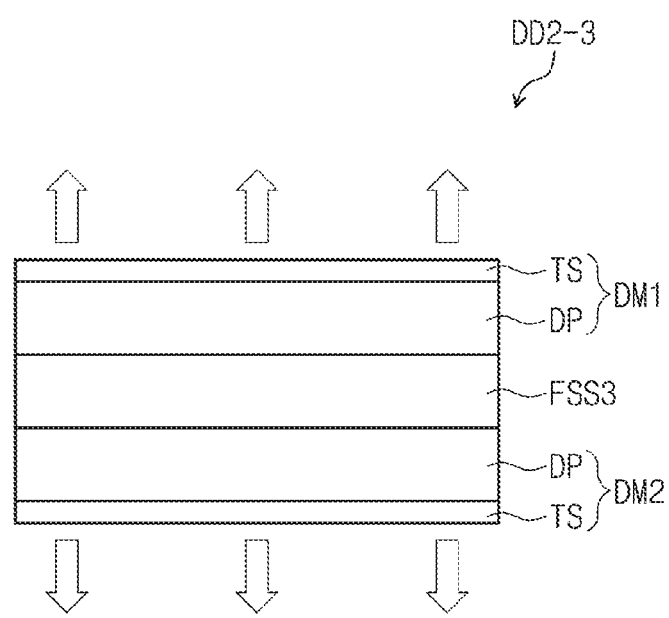
FIG. 21 is a cross-sectional view illustrating a display device according to some exemplary embodiments.
Figure 21:
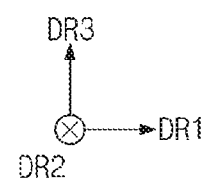

FIG. 21 is a cross-sectional view illustrating a display device DD2-3 according to some exemplary embodiments.

The display device DD2-3 includes a first display module DM1, a second display module DM2, and a force sensor FSS3. Each of the first and second display modules DM1 and DM2 may be substantially the same as the display module DM described with reference to FIGS. 3 to 7, and, thus, duplicative descriptions will be omitted. The force sensor FSS3 is disposed between the first display module DM1 and the second display module DM2. The force sensor FSS3 may sense pressure applied to the display device DD2-3.

FIGS. 22, 23, 24, 25, and 26 are cross-sectional views illustrating force sensors FSS3, FSS3-1, FSS3-2, FSS3-3, and FSS3-4 according to various exemplary embodiments.

Figure 22:
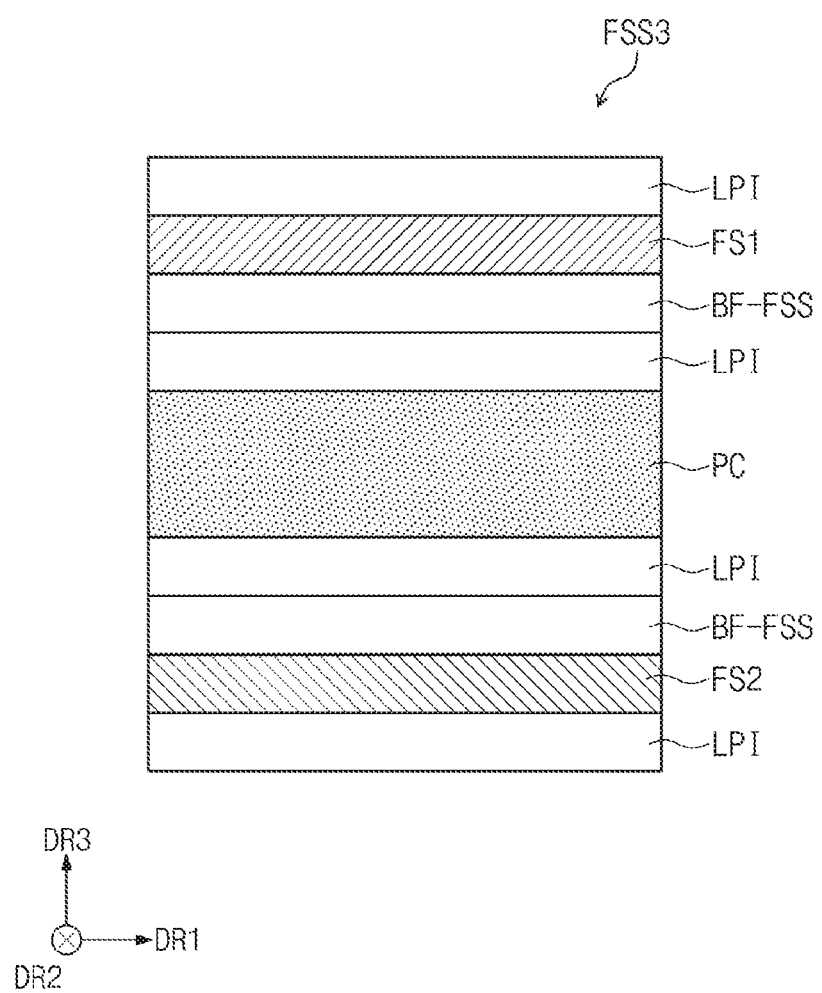
FIGS. 22, 23, 24, 25, and 26 are cross-sectional views illustrating force sensors according to various exemplary embodiments.

Referring to FIG. 22, the force sensor FSS3 includes an insulating layer LPI, a buffer layer BF-FSS, a pressure cushion PC, a first force-sensing electrode FS1, and a second force-sensing electrode FS2. In some exemplary embodiments, the force sensor FSS3 may include the insulating layer LPI, the second force-sensing electrode FS2, the buffer layer BF-FSS, the insulating layer LPI, the pressure cushion PC, the insulating layer LPI, the buffer layer BF-FSS, the first force-sensing electrode FS1 and the insulating layer LPI which are stacked in the order listed. However, exemplary embodiments are not limited to or by the stack order of the force sensor FSS3. In some exemplary embodiments, the insulating layer LPI, the buffer layer BF-FSS, the pressure cushion PC, the first force-sensing electrode FS1, and the second force-sensing electrode FS2 may be stacked in another stack order.

The first force-sensing electrode FS1 is capacitively coupled to the second force-sensing electrode FS2. In some exemplary embodiments, the first force-sensing electrode FS1 may transmit an electric field and the second force-sensing electrode FS2 may receive the electric field. In some exemplary embodiments, roles of the first and second force-sensing electrodes FS1 and FS2 of the force sensor FSS3 may be changed with each other, according to a driving mode. For example, in a first driving mode, the first force-sensing electrode FS1 may transmit the electric field and the second force-sensing electrode FS2 may receive the electric field. In a second driving mode, the second force-sensing electrode FS2 may transmit the electric field and the first force-sensing electrode FS1 may receive the electric field.

Figure 23:
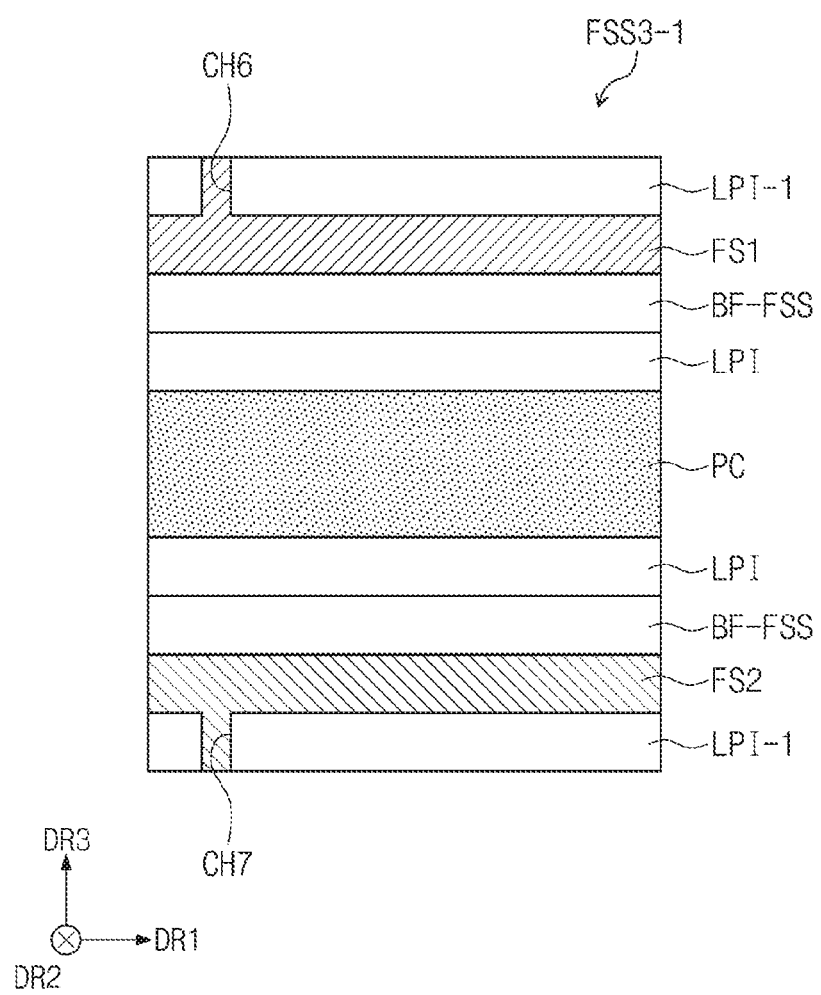

Referring to FIG. 23, the first force-sensing electrode FS1 of the force sensor FSS3-1 may be electrically connected to the touch sensing unit TS of the first display module DM1 through a sixth through-hole CH6 in the insulating layer LPI-1. The second force-sensing electrode FS2 of the force sensor FSS3-1 may be electrically connected to the touch sensing unit TS of the second display module DM2 through a seventh through-hole CH7 in the insulating layer LPI-1. In this manner, the force sensor FSS3-1 may be driven and controlled by electrical signals supplied from the touch sensing units TS.

Figure 24:
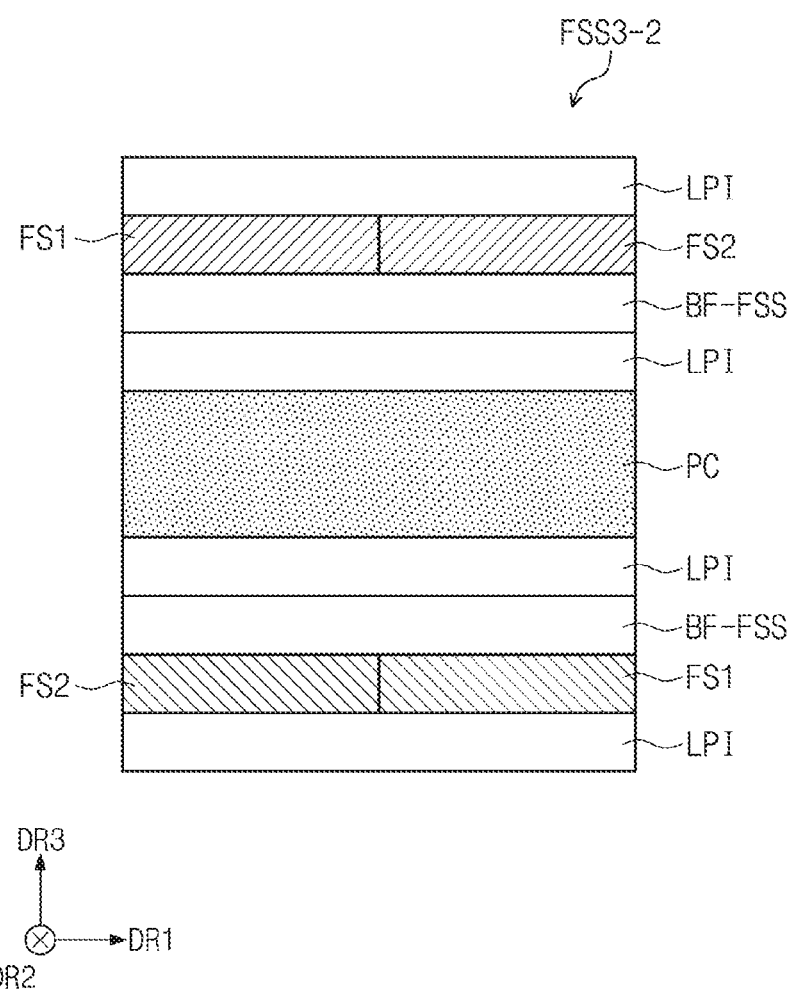

Referring to FIG. 24, first and second force-sensing electrodes FS1 and FS2 of the force sensor FSS3-2 may be alternately arranged on the same layer in a lateral direction, e.g., in the first direction DR1.

Figure 25:
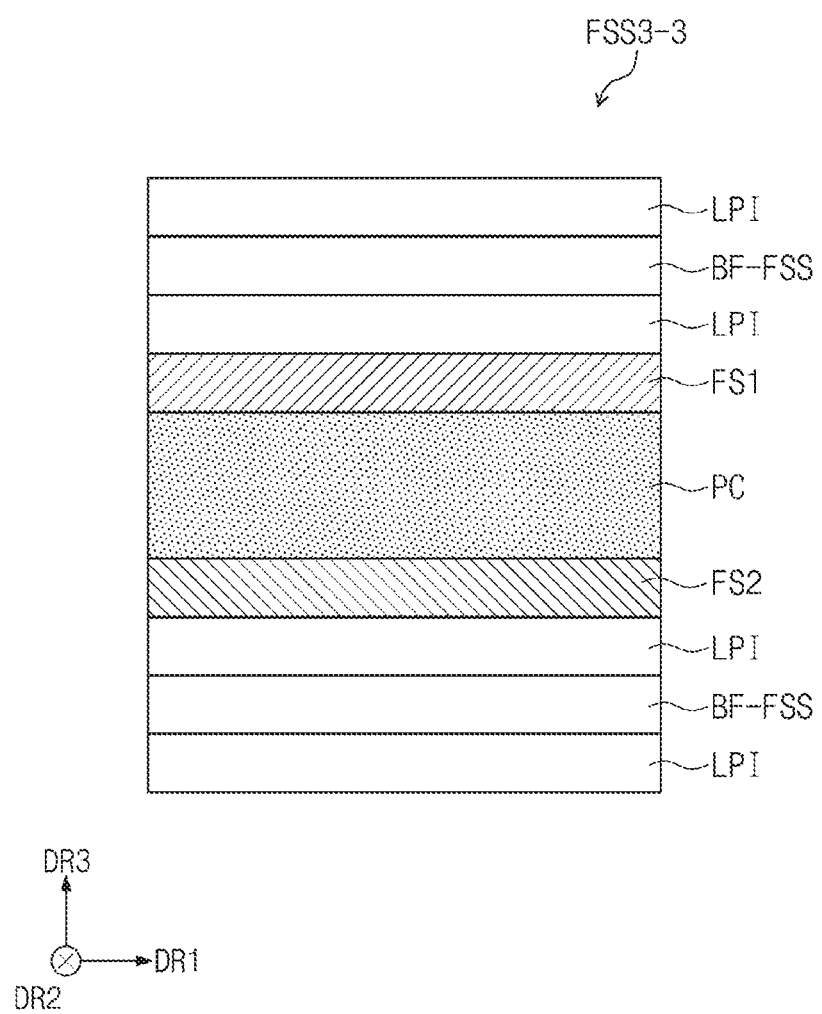

Referring to FIG. 25, the force sensor FSS3-3 may include the insulating layer LPI, the buffer layer BF-FSS, the insulating layer LPI, the second force-sensing electrode FS2, the pressure cushion PC, the first force-sensing electrode FS1, the insulating layer LPI, the buffer layer BF-FSS, and the insulating layer LPI that are stacked in the order listed.

Figure 26:
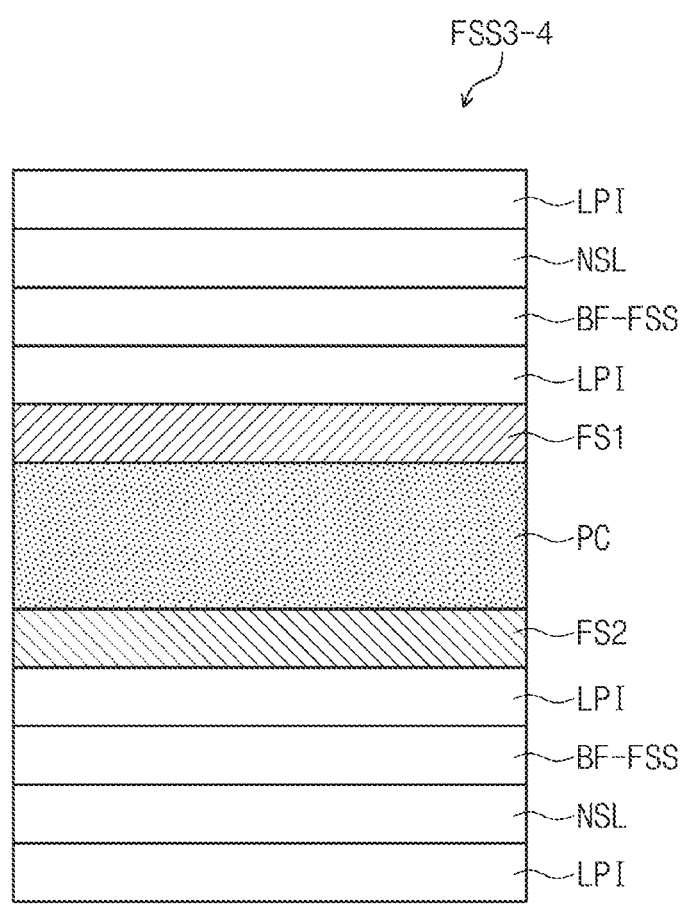

Referring to FIG. 26, the force sensor FSS3-4 may further include a noise-shielding layer NSL. The noise-shielding layer NSL may be disposed between the insulating layer LPI and the buffer layer BF-FSS. However, exemplary embodiments are not limited to or by the position of the noise-shielding layer NSL. The noise-shielding layer NSL may shield noise occurring from transistors of the first and second display modules DM1 and DM2, and, thus, the force sensor FSS3-4 may more effectively sense pressure.

Figure 27:
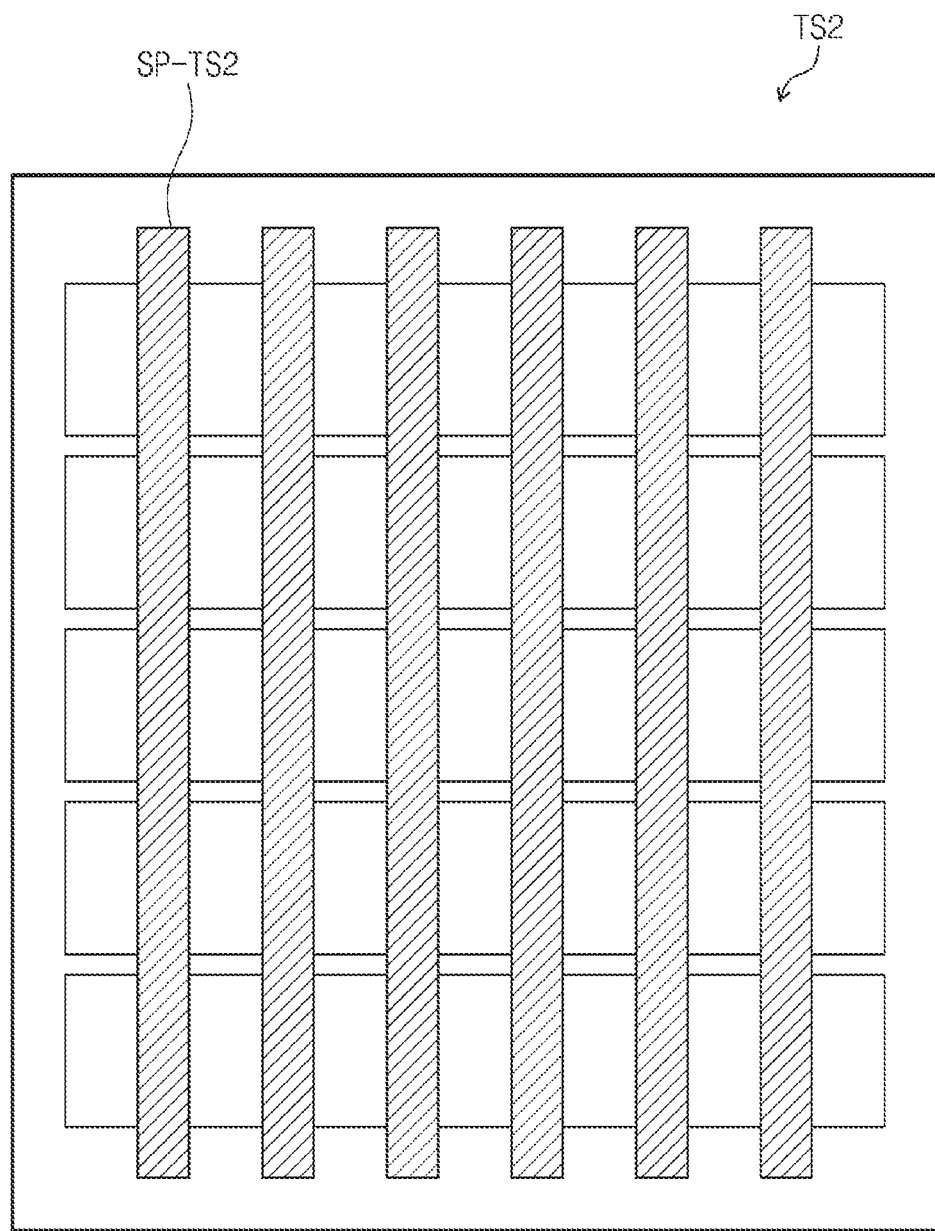
FIGS. 27, 28, and 29 illustrate touch sensing units according to various exemplary embodiments.
Figure 28:
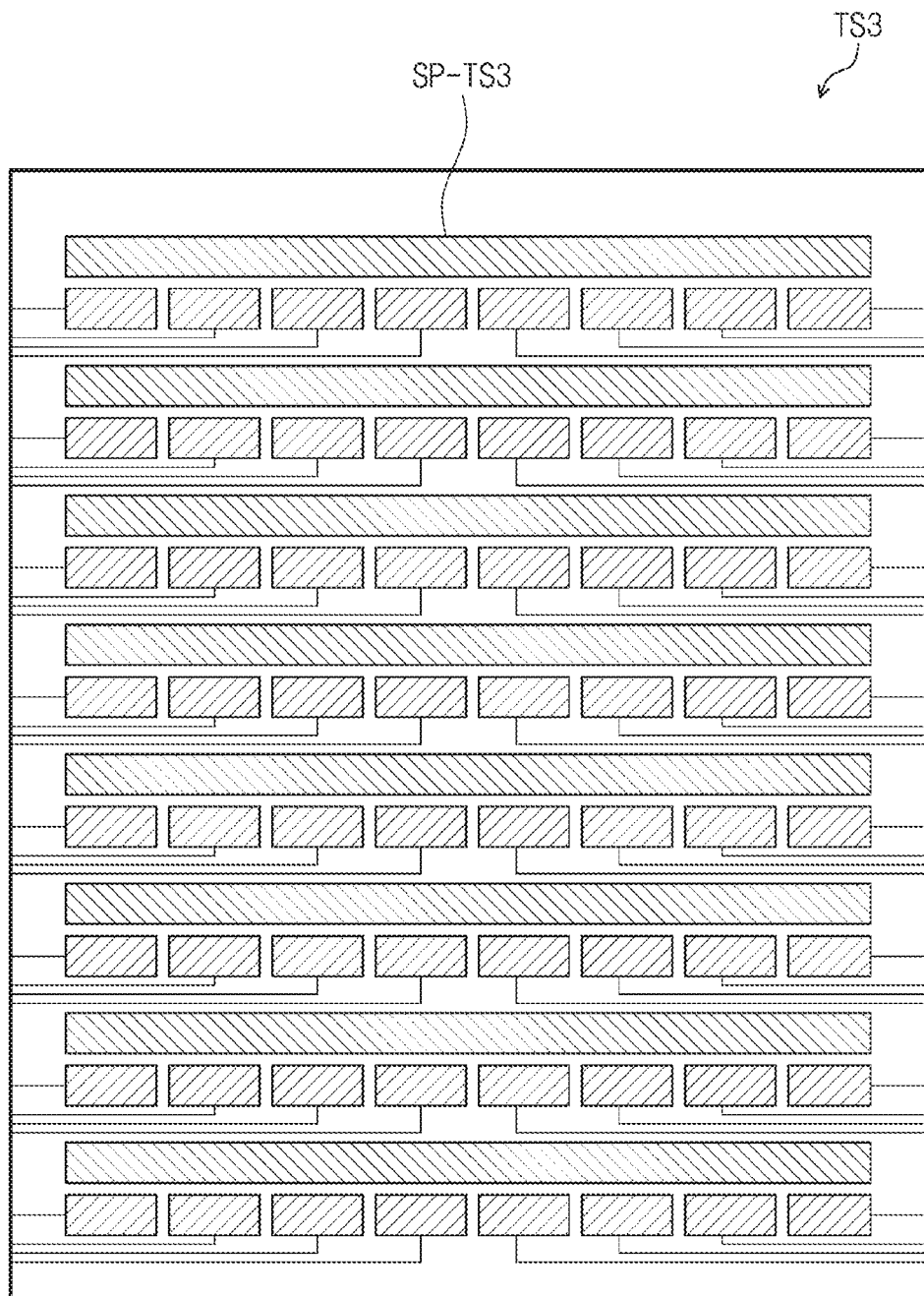
Figure 29:
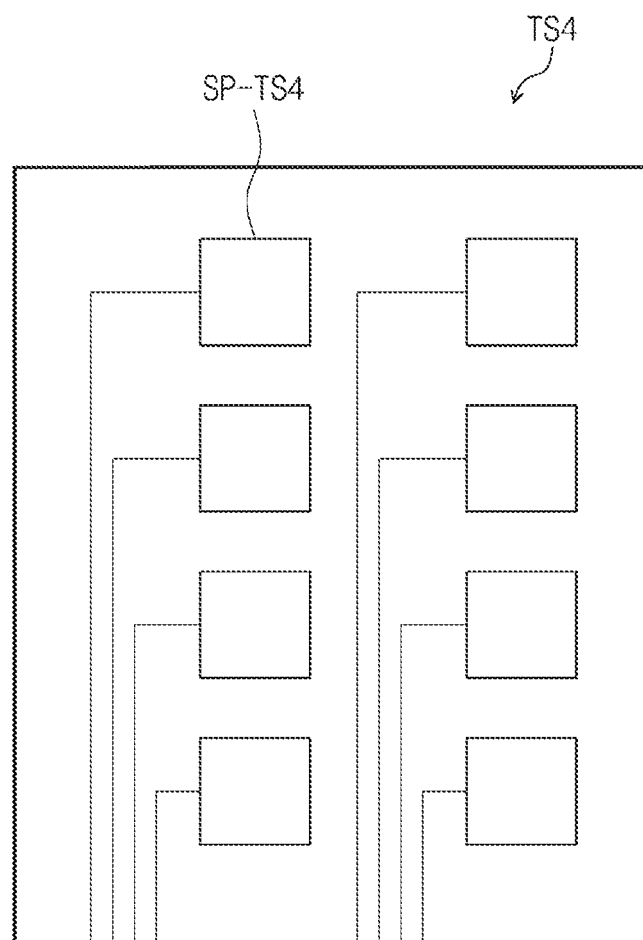

FIGS. 27, 28, and 29 illustrate touch sensing units TS2, TS3, and TS4 according to various exemplary embodiments.

Referring to FIG. 27, a touch sensor SP-TS2 of the touch sensing unit TS2 may have a stripe pattern shape, unlike the touch sensor SP of the touch sensing unit TS.

Referring to FIGS. 28 and 29, each of touch sensors SP-TS3 and SP-TS4 of the touch sensing units TS3 and TS4 may have a shape including a plurality of quadrilateral patterns, unlike the touch sensor SP of the touch sensing unit TS.

Figure 30A:
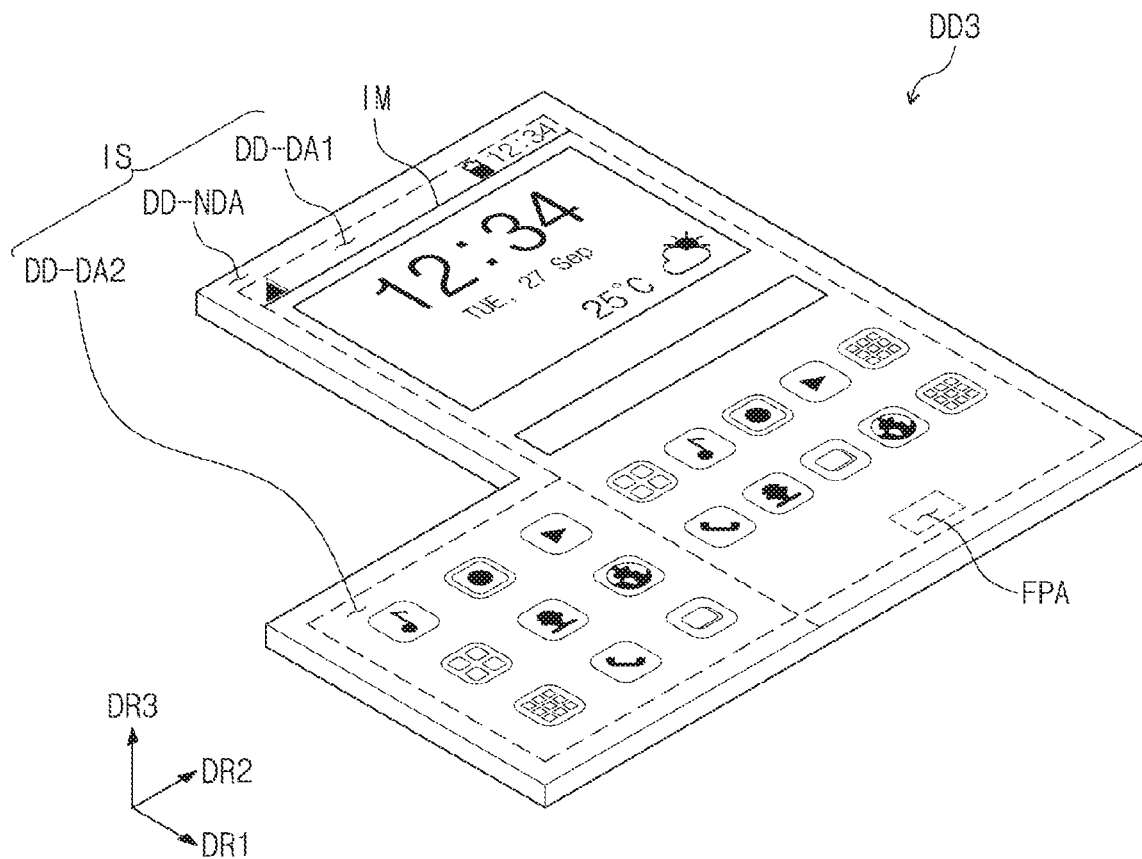
FIG. 30A is a perspective view illustrating a display device in a normal mode according to some exemplary embodiments.
Figure 30B:
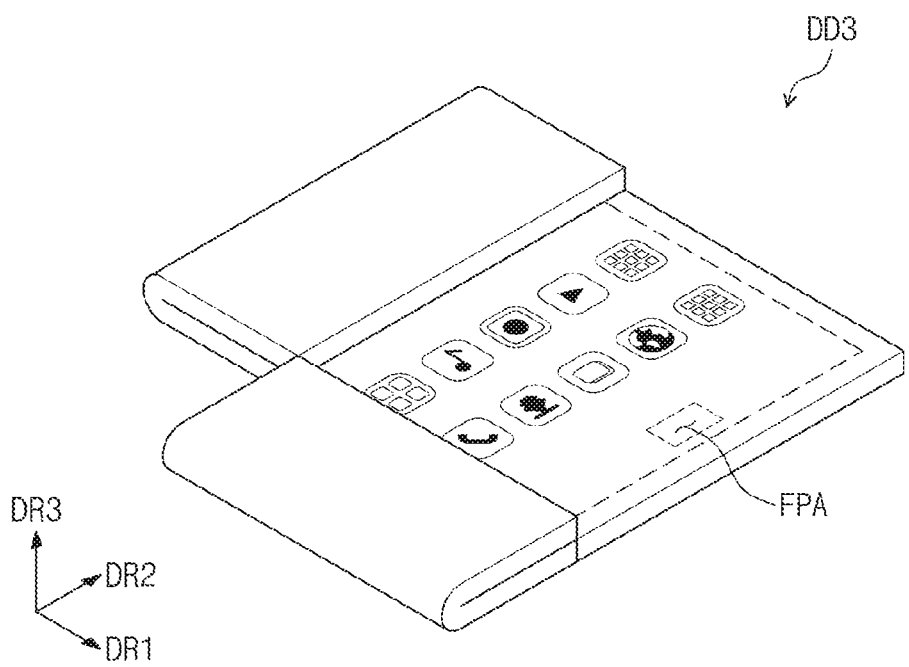
FIG. 30B is a perspective view illustrating the display device of FIG. 30A in an in-folding mode according to some exemplary embodiments.

FIG. 30A is a perspective view illustrating a display device DD3 in a normal mode according to some exemplary embodiments. FIG. 30B is a perspective view illustrating the display device DD3 of FIG. 30A in an in-folding mode according to some exemplary embodiments. The display device DD3 is similar to the display devices DD, DD1, and DD2, and, therefore, duplicative descriptions will be primarily omitted.

Referring to FIG. 30A, the display device DD3 may include a first display area DD-DA1, a second display area DD-DA2, and a non-display area DD-NDA. In some exemplary embodiments, the first display area DD-DA1 and the second display area DD-DA2 may display images IM independently of each other. In some exemplary embodiments, the first display area DD-DA1 and the second display area DD-DA2 may display images IM which are dependent on each other.

Referring to FIG. 30B, a portion of the display device DD3, which corresponds to the first display area DD-DA1, may be bent or folded. Likewise, another portion of the display device DD3, which corresponds to the second display area DD-DA2, may be bent or folded. In an in-folding mode, the fingerprint recognition area FPA of the display device DD3 may be exposed to the outside. The display device DD3 in the in-folding mode is illustrated in FIG. 30B. However, exemplary embodiments are not limited thereto or thereby. In some exemplary embodiments, the display device DD3 may be out-folded.

Figure 31A:
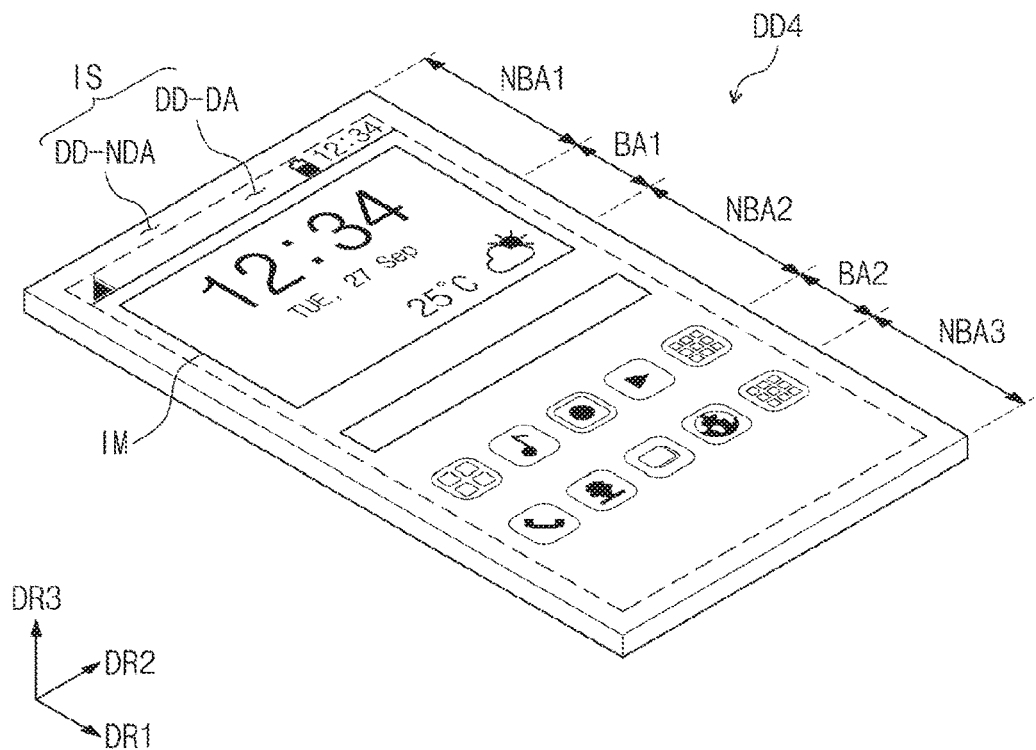
FIG. 31A is a perspective view illustrating a display device in a normal mode according to some exemplary embodiments.
Figure 31B:
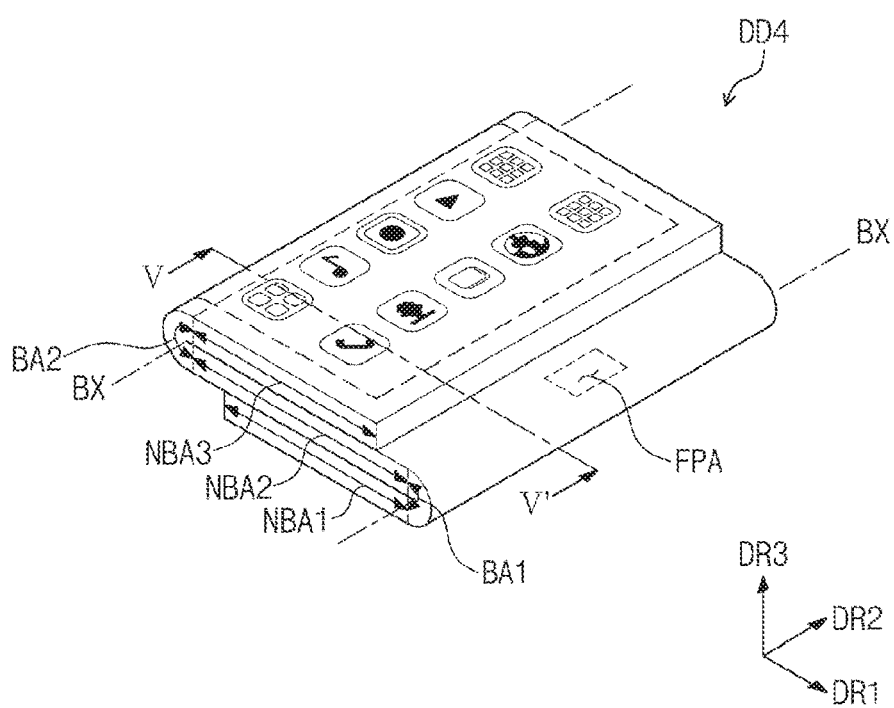
FIGS. 31B and 31C are perspective views illustrating the display device of FIG. 31A in folding modes according to various exemplary embodiments.
Figure 31C:
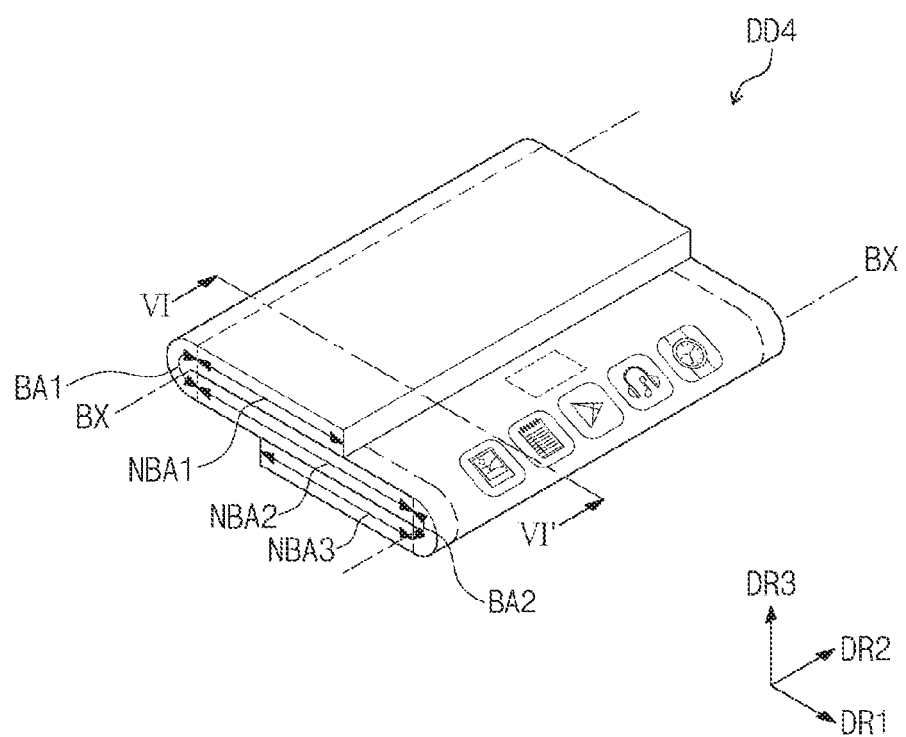

FIG. 31A is a perspective view illustrating a display device DD4 in a normal mode according to some exemplary embodiments. FIGS. 31B and 31C are perspective views illustrating the display device DD4 of FIG. 31A in folding modes according to various exemplary embodiments.

The display device DD4 may include a first bending area BA1, a second bending area BA2, a first non-bending area NBA1, a second non-bending area NBA2, and a third non-bending area NBA3 on the basis of bending axes BX. The display device DD4 may be in-folded such that a portion of the display surface IS of the first non-bending area NBA1 faces a portion of the display surface IS of the second non-bending area NBA2, and may be out-folded such that a portion of the display surface IS of the second non-bending area NBA2 does not face a portion of the display surface IS of the third non-bending area NBA3.

Referring to FIG. 31B, in some exemplary embodiments, a fingerprint recognition area FPA may be formed in (or on) a back surface of the display device DD4. In other words, the fingerprint recognition area FPA may be formed on a surface opposite to the display surface IS of the display device DD4.

Referring to FIG. 31C, in some exemplary embodiments, the fingerprint recognition area FPA may be formed in (or on) a front surface of the display device DD4. In other words, the fingerprint recognition area FPA may be formed on the display surface IS of the display device DD4.

As illustrated in FIGS. 31A to 31C, the fingerprint recognition area FPA is exposed to the outside even though the display device DD4 is folded. Thus, a user may touch the exposed fingerprint recognition area FPA and may conveniently use the display device DD4.

Figure 32A:
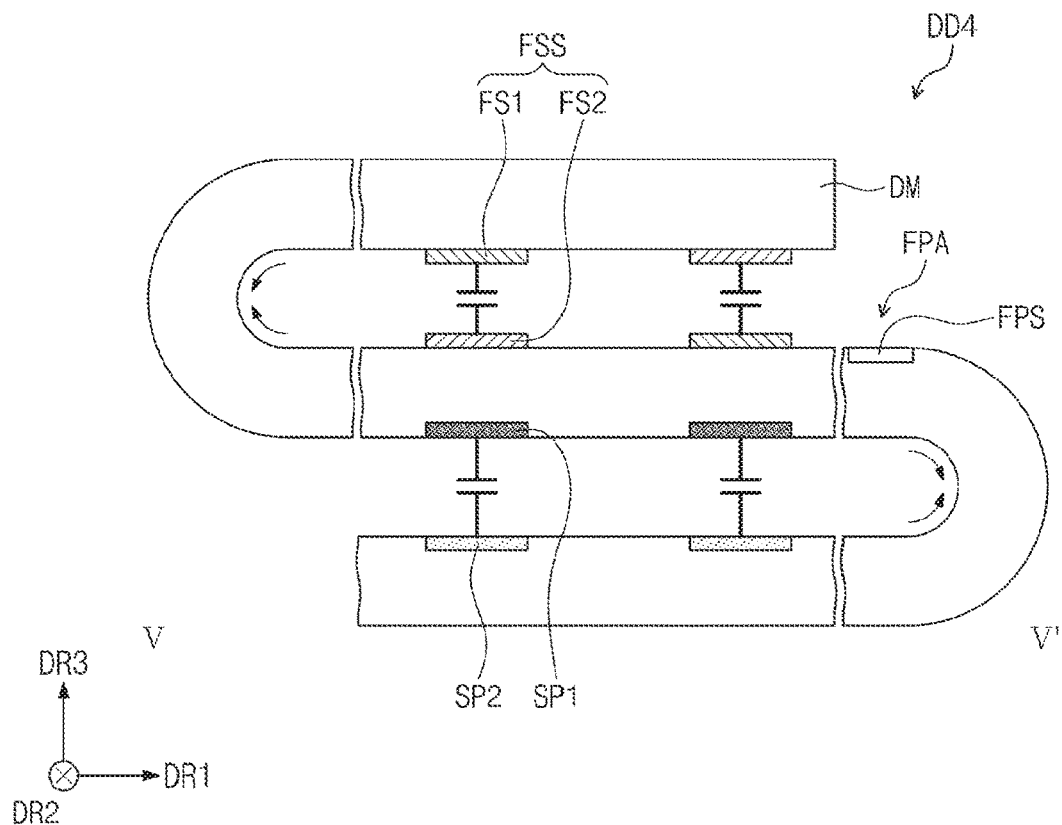
FIG. 32A is a cross-sectional view taken along sectional line V-V' of FIG. 31B according to some exemplary embodiments.
Figure 32B:
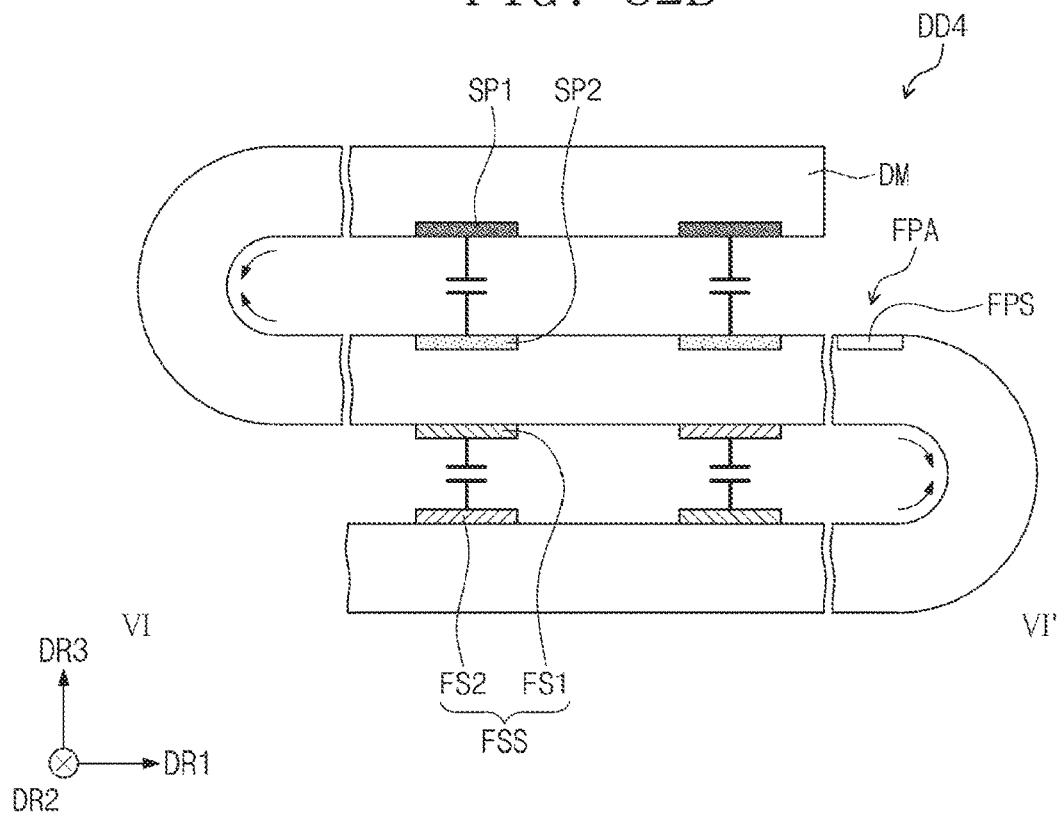
FIG. 32B is a cross-sectional view taken along sectional line VI-VI' of FIG. 31C according to some exemplary embodiments.

FIG. 32A is a cross-sectional view taken along sectional line V-V' of FIG. 31B according to some exemplary embodiments. FIG. 32B is a cross-sectional view taken along sectional line VI-VI' of FIG. 31C according to some exemplary embodiments.

The display device DD4 may sense pressure applied from the outside using the force sensor FSS and the touch sensors SP1 and SP2. The force sensor FSS includes a first force-sensing electrode FS1 and a second force-sensing electrode FS2. The force sensor FSS and the touch sensors SP1 and SP2 may be substantially the same as described above, and, thus, duplicative descriptions will be omitted. In some exemplary embodiments, however, the display device DD4 may include the force sensor FSS-1 described with reference to FIG. 16A. The force sensor FSS-1 may include the strain gauges SG1 and SG2 of FIG. 16C. The force sensor FSS-1 may be substantially the same as described above, and, thus, duplicative descriptions will be omitted.

Figure 33:
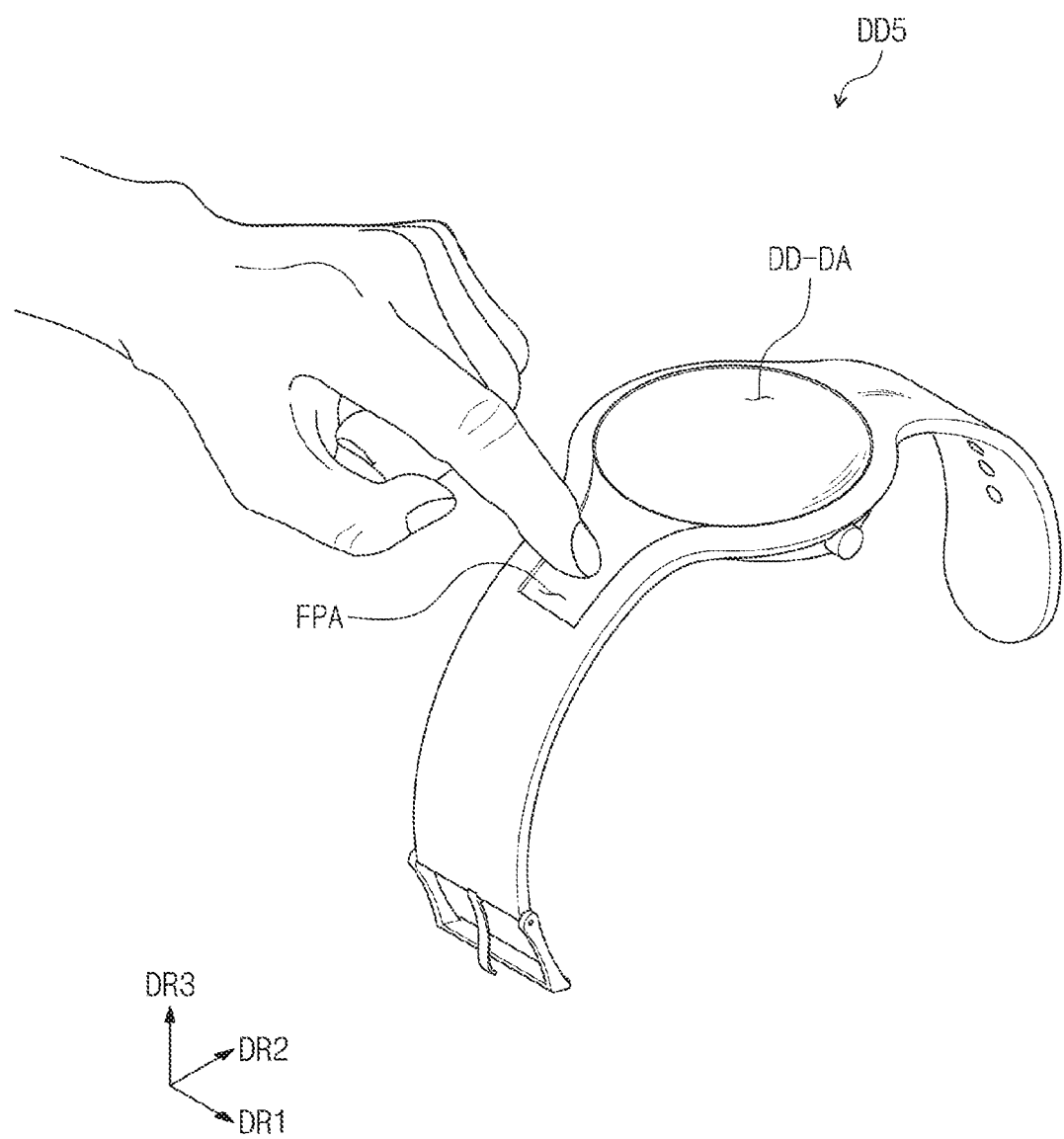
FIG. 33 is a perspective view illustrating a display device according to some exemplary embodiments.

FIG. 33 is a perspective view illustrating a display device DD5 according to some exemplary embodiments.

In one or more exemplary embodiments, the display device DD5 is a watch-type wearable device that can be worn on a wrist. The display device DD5 includes a display area DD-DA and a fingerprint recognition area FPA. In some exemplary embodiments, the display area DD-DA may include the fingerprint recognition area FPA. In other exemplary embodiments, the display area DD-DA and the fingerprint recognition area FPA may be separated from each other.

The fingerprint recognition area FPA may sense a touch of a user and/or may recognize a fingerprint of a user. The fingerprint recognition area FPA may be realized using an active self-capacitance (ASC) method, a mutual capacitance method, a self-capacitance method, an ultrasonic method, or an optical sensing method. However, the method of realizing the fingerprint recognition area FPA is not limited thereto or thereby. In some exemplary embodiments, the fingerprint recognition area FPA may use at least one of other various methods capable of sensing a touch and/or a fingerprint.

Signal lines and insulating layers of the fingerprint recognition area FPA and the display area DD-DA may be formed on the same layer.

The fingerprint recognition area FPA recognizes a fingerprint and senses a touch signal, and, thus, operations of a display panel of the display device DD5 can be performed. In other words, when the fingerprint recognition area FPA is formed by the active self-capacitance (ASC) method, gate lines and data lines of the fingerprint recognition area FPA may be formed on the same layer as gate lines GL (see FIG. 4) and data lines DL (see FIG. 4) of the display area DD-DA. In addition, transistors of the ASC method may be formed by the same processes as transistors TFT1 and TFT2 (see FIG. 5) of the display area DD-DA.

In other exemplary embodiments, when a fingerprint recognition unit or a touch sensing unit is formed by the mutual capacitance method or the self-capacitance method, touch sensor interconnections of the touch sensing unit and touch interconnections of the display area DD-DA may be formed at the same time.

Figure 34A:
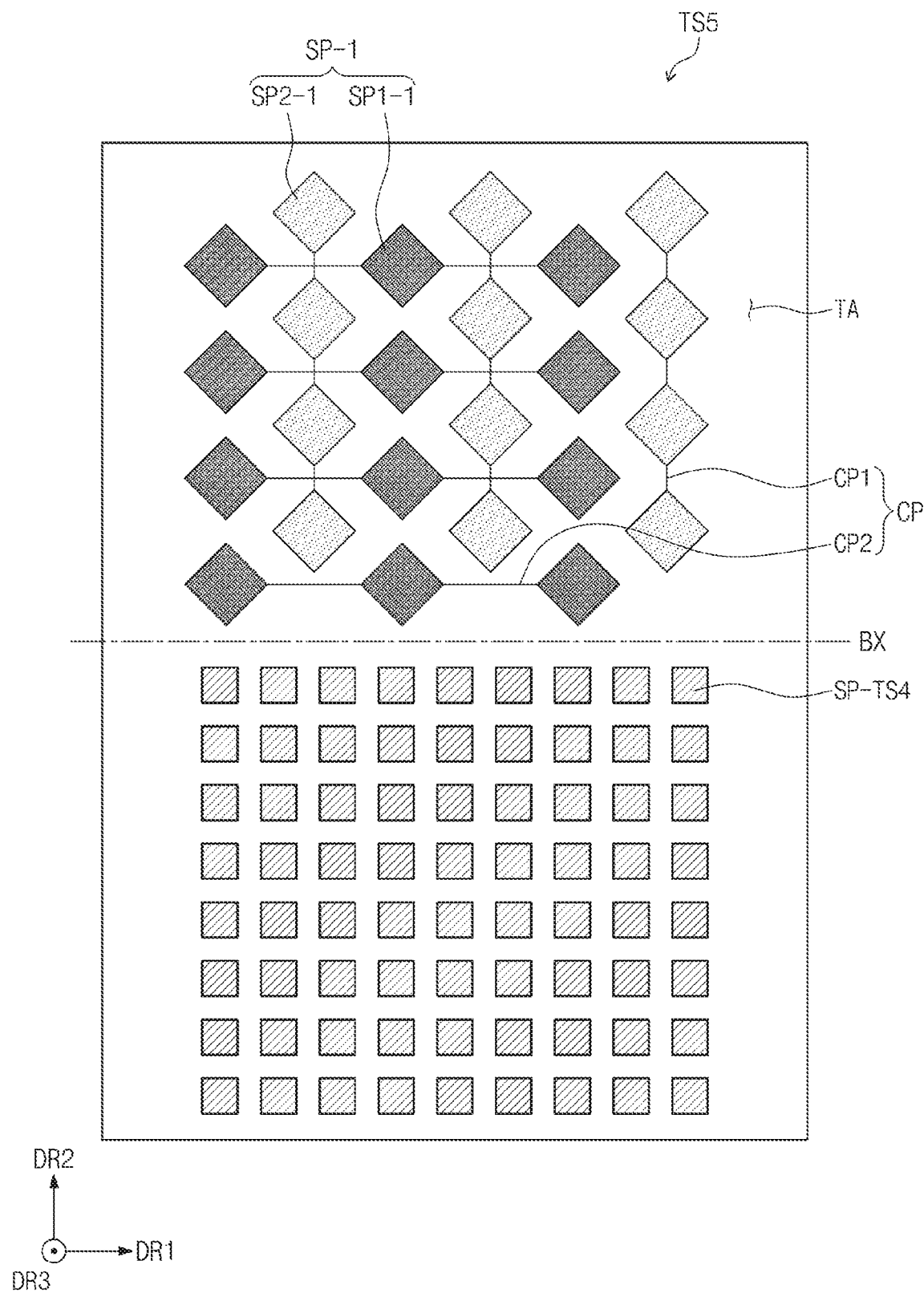
FIGS. 34A and 34B are plan views illustrating touch sensing units according to various exemplary embodiments.
Figure 34B:
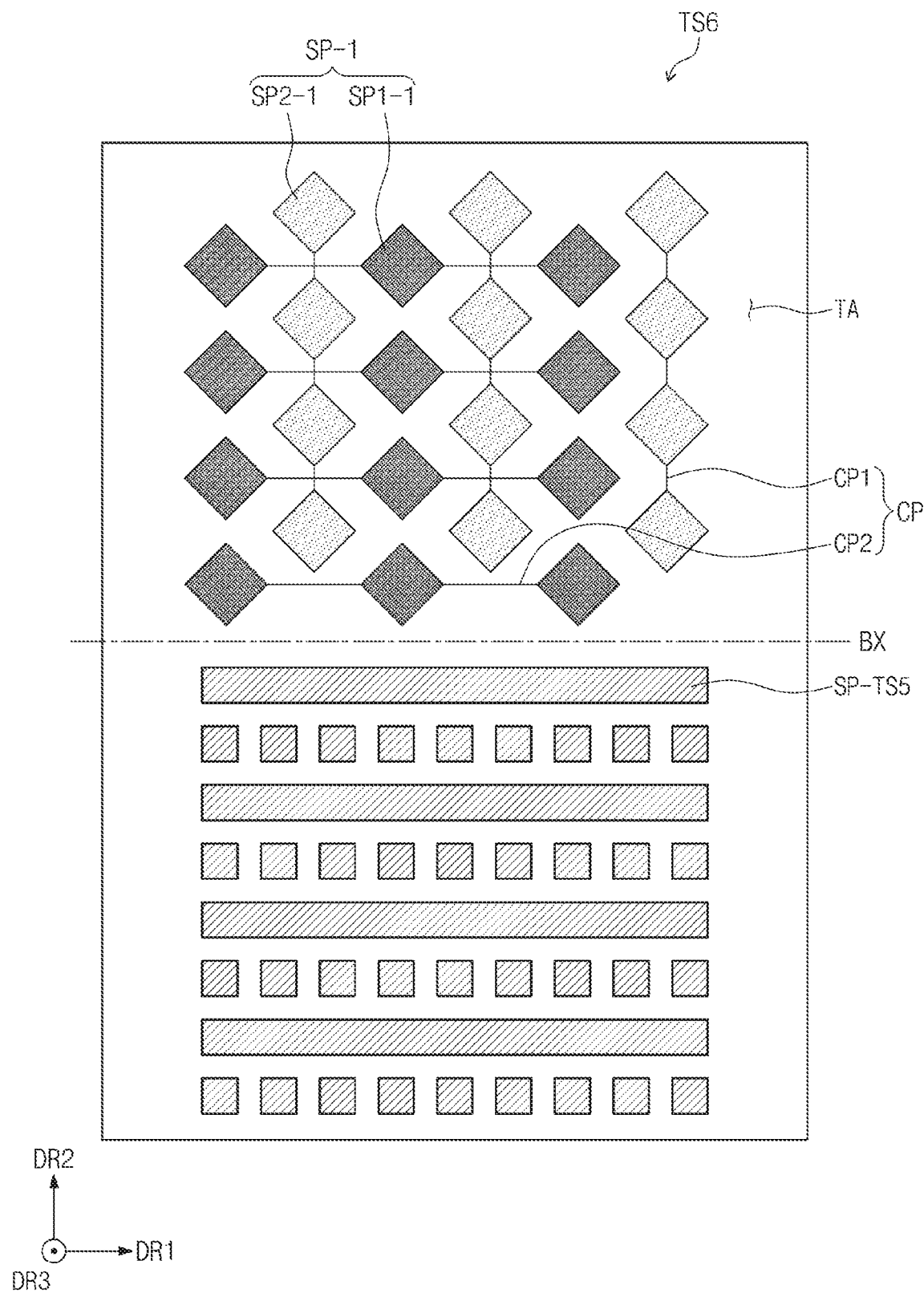

FIGS. 34A and 34B are plan views illustrating touch sensing units TS5 and TS6 according to various exemplary embodiments.

The touch sensing units TS5 and TS6 may include different kinds of touch sensors SP-1 and SP-TS4 or SP-TS5 disposed at both sides of a bending axis BX, respectively. For example, one of the touch sensors SP-1 and SP-TS4 or SP-TS5 may be a mutual capacitance type touch sensor (e.g., touch sensor SP-1), and the other of the touch sensors SP-1 and SP-TS4 or SP-TS5 may be a self-capacitance type touch sensor (e.g., touch sensor SP-TS4 or SP-TS5).

The touch sensing units TS5 and TS6 have different characteristics on the basis of the structures of the touch sensors SP-1 and SP-TS4 or SP-TS5. For example, the mutual capacitance type structure can reduce the number of channels, and the self-capacitance type structure may have advantages of a hovering touch. Thus, as occasion demands, the touch sensing units TS5 and TS6 may have the advantages of the mutual capacitance method and the advantages of the self-capacitance method by changing the kinds of the touch sensors SP-1 and SP-TS4 or SP-TS5 included in the touch sensing unit TS5 and TS6.

In other exemplary embodiments, a portion of the touch sensing units TS5 and TS6 may be used to recognize a fingerprint. In this case, a portion of the touch sensors may have a size (e.g., a diameter or width) of about 50 micrometers to about 200 micrometers.

Figure 35:
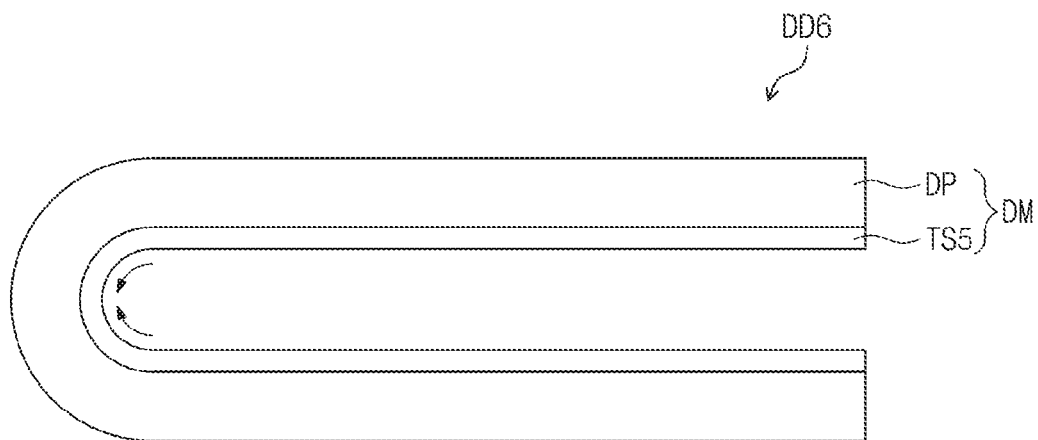
FIG. 35 is a cross-sectional view illustrating a display device in an in-folding state according to some exemplary embodiments.
Figure 35:
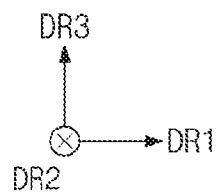
Figure 36:
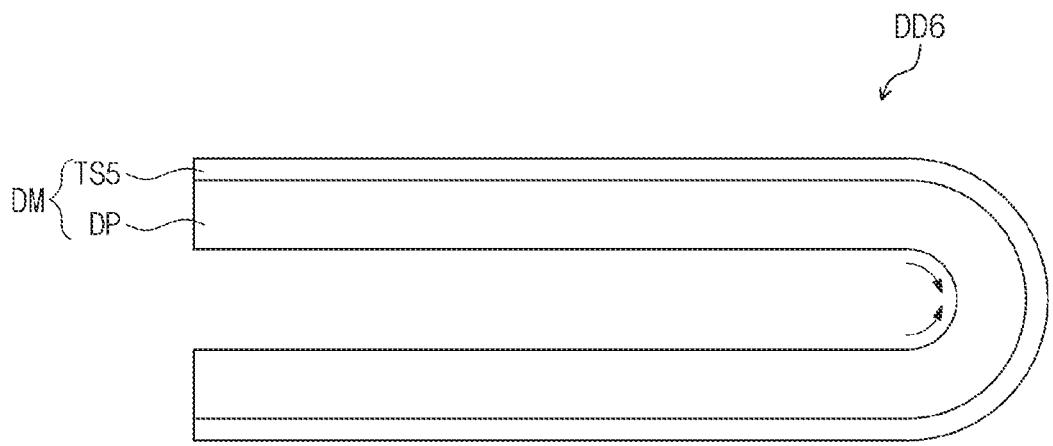
FIG. 36 is a cross-sectional view illustrating a display device in an out-folding state according to some exemplary embodiments.
Figure 36:
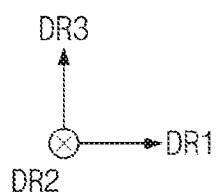

FIG. 35 is a cross-sectional view illustrating a display device DD6 in an in-folding state according to some exemplary embodiments. FIG. 36 is a cross-sectional view illustrating the display device DD6 in an out-folding state according to some exemplary embodiments.

Referring to FIG. 35, the display device DD6 including the touch sensing unit TS5 or TS6 of FIG. 34A or 34B may be in-folded. Referring to FIG. 36, the display device DD6 including the touch sensing unit TS5 or TS6 of FIG. 34A or 34B may be out-folded.

Figure 37:
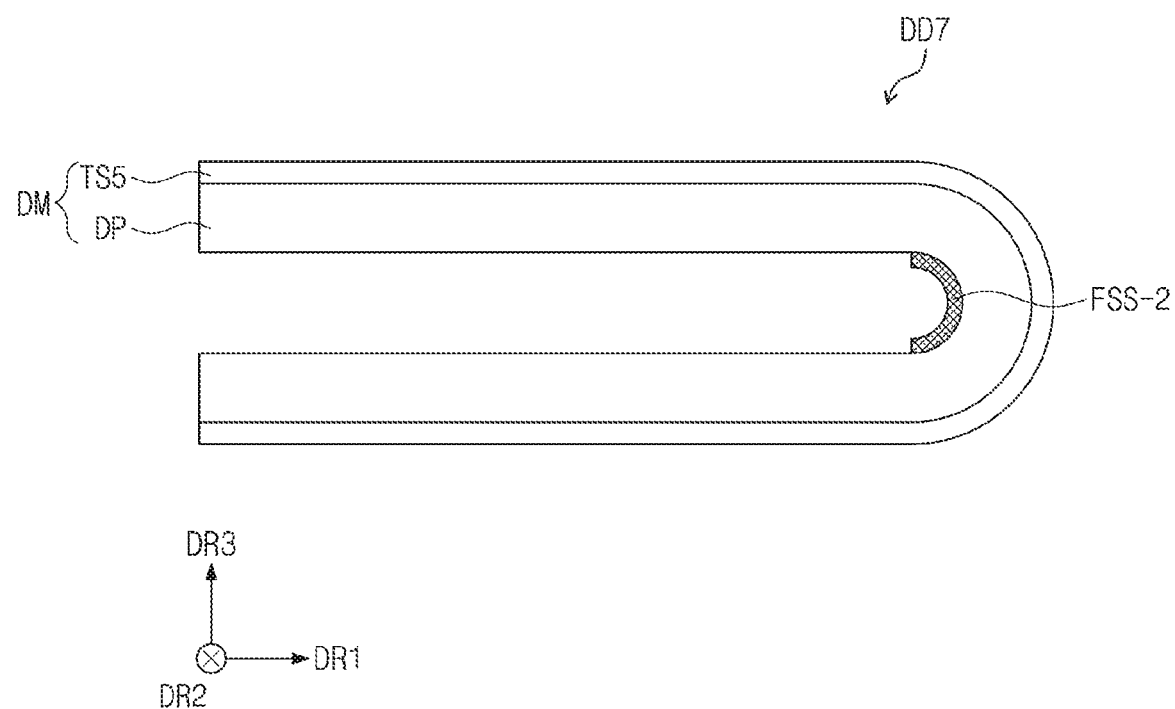
FIG. 37 is a cross-sectional view illustrating a display device in an out-folding state according to some exemplary embodiments.

FIG. 37 is a cross-sectional view illustrating a display device DD7 in an out-folding state according to some exemplary embodiments. The display device DD7 including the touch sensing unit TS5 or TS6 of FIG. 34A or 34B may include a force sensor FSS-2 that is disposed on a bending portion of the display device DD7. The force sensor FSS-2 may sense or detect whether the display device DD7 is bent or not. The force sensor FSS-2 may include the strain gauges SG1 and S G2 of FIG. 16C.

According to various exemplary embodiments, in an in-folding mode, a display device may sense applied pressure through a capacitance-type touch sensing unit for sensing a touch of a user. A display device, according to some exemplary embodiments, may sense applied pressure through a force sensor in an out-folding mode. In various exemplary embodiments, a display device may be a both surface display device providing images in both directions and may sense applied pressure through a force sensor.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
a flexible display module comprising a display surface, wherein the display device provides:
  a display area comprising a fingerprint recognition area; and
  a non-display area outside the display area,
wherein the flexible display module comprises:
  a display panel comprising a light-emitting element configured to display an image in the display area via the display surface;
  a touch sensing unit disposed on the display panel; and
  a fingerprint recognition unit overlapping the fingerprint recognition area, and
wherein the touch sensing unit is configured to sense a magnitude of pressure applied to the flexible display module in an in-folding mode in which the flexible display module is fully folded such that a portion of the display surface faces, in a direction normal to the display surface, another portion of the display surface, the magnitude of pressure being determined based on a change in distance in the direction normal to the display surface between a touch sensing electrode of the touch sensing unit disposed on the portion of the display surface and another touch sensing electrode of the touch sensing unit disposed on the another portion of the display surface.

2. The display device of claim 1, wherein the display panel is disposed between the touch sensing unit and the fingerprint recognition unit.

3. The display device of claim 1, wherein the fingerprint recognition unit overlaps, in the direction normal to the display surface, at least one touch sensing electrode of the touch sensing unit.

4. The display device of claim 2, wherein:
the fingerprint recognition unit comprises at least one of an optical sensing module and an ultrasonic sensing module; and
each of the optical sensing module and the ultrasonic sensing module comprises:
  a signal generator configured to transmit a first signal towards a fingerprint of a user; and
  a signal receiver configured to receive a second signal corresponding to a reflection of the first signal from the fingerprint of the user.

5. The display device of claim 1, wherein the touch sensing unit is disposed between the fingerprint recognition unit and the display panel.

6. The display device of claim 5, wherein the fingerprint recognition unit comprises a capacitance-type sensing module.

7. The display device of claim 1, wherein the fingerprint recognition area is exposed to an outside in the in-folding mode.

8. The display device of claim 1, wherein the touch sensing unit comprises:
first touch sensing electrodes configured to transmit electric fields, the first touch sensing electrodes comprising the touch sensing electrode; and
second touch sensing electrodes configured to receive the electric fields, the second touch sensing electrodes comprising the another touch sensing electrode.

9. The display device of claim 8, wherein at least one of the first touch sensing electrodes and the second touch sensing electrodes comprises a conductive polymer material.

10. The display device of claim 9, wherein the conductive polymer material comprises at least one of a polythiophene-based compound, a polypyrrole-based compound, a polyaniline-based compound, a polyacetylene-based compound, and a polyphenylene-based compound.

11. The display device of claim 8, wherein sensation of the magnitude of pressure comprises sensation of a change in capacitance between the touch sensing electrode and the another touch sensing electrode in the in-folding mode.

12. The display device of claim 1, wherein the touch sensing unit comprises:
first touch sensing electrodes comprising the touch sensing electrode and the another touch sensing electrode; and
second touch sensing electrodes capacitively coupled to the first touch sensing electrodes.

13. The display device of claim 12, wherein sensation of the magnitude of pressure comprises sensation of a change in capacitance between touch sensing electrode and the another touch sensing electrode in the in-folding mode.

14. The display device of claim 1, wherein the light-emitting element comprises a front surface light emitting area and a back surface light emitting area adjacent to the front surface light emitting area such that the display panel is a both surface light-emitting display panel.

15. A display device comprising:
a flexible display module comprising a display surface; and
a force sensor,
wherein the display device provides:
    a display area comprising a fingerprint recognition area; and
    a non-display area outside the display area,
wherein the flexible display module comprises:
    a display panel comprising a light-emitting element disposed between an uppermost surface of the display panel and a lowermost surface of the display panel;
    a touch sensing unit disposed on the display panel; and
    a fingerprint recognition unit overlapping with the fingerprint recognition area,
wherein, in an unfolded state of the flexible display module, each of the uppermost surface and the lowermost surface of the display panel is disposed between the touch sensing unit and the force sensor, and
wherein the force sensor is configured to sense pressure applied to the flexible display module in an out-folding mode in which the flexible display module is fully folded such that a portion of the display area faces an opposite direction from another portion of the display area.

16. The display device of claim 15, wherein the display panel is disposed between the touch sensing unit and the fingerprint recognition unit.

17. The display device of claim 16, wherein the fingerprint recognition unit comprises at least one of an optical sensing module and an ultrasonic sensing module.

18. The display device of claim 15, wherein:
the fingerprint recognition unit comprises a capacitance-type sensing module; and
the touch sensing unit is disposed between the fingerprint recognition unit and the display panel.

19. The display device of claim 15, wherein the force sensor is configured to sense a change in capacitance in the out-folding mode to sense the pressure.

20. A display device comprising:
a flexible display module,
wherein the display device provides:
    a display area via the flexible display module, the display area comprising a fingerprint recognition area; and
    a non-display area outside the display area,
wherein the flexible display module comprises:
    a display panel comprising a light-emitting element in the display area;
    a touch sensing unit disposed on the display panel; and
    a fingerprint recognition unit overlapping with the fingerprint recognition area, and
wherein the touch sensing unit is configured to sense a capacitance between a portion of the display area and another portion of the display area in an in-folding mode in which the flexible display module is fully folded such that the portion of the display area overlaps and faces the another portion of the display area with the portion of the display area being in a different plane than the another portion of the display area.

* * * * *